US012812912B2

(12) United States Patent
Hsu et al.

(10) Patent No.: US 12,812,912 B2
(45) Date of Patent: Nov. 24, 2026

(54) SEMICONDUCTOR DEVICE INCLUDING HIGH CONDUCTIVITY GATE STRUCTURE AND METHOD FOR MANUFACTURING THE SAME

(71) Applicant: Taiwan Semiconductor Manufacturing Company, Ltd., Hsinchu (TW)

(72) Inventors: Chung-Wei Hsu, Hsinchu (TW); Lung-Kun Chu, Hsinchu (TW); Jia-Ni Yu, Hsinchu (TW); Chun-Fu Lu, Hsinchu (TW); Shih-Hao Lai, Hsinchu (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 427 days.

(21) Appl. No.: 18/472,768

(22) Filed: Sep. 22, 2023

(65) Prior Publication Data

US 2025/0107152 A1 Mar. 27, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 64/017* (2025.01); *H10D 84/0167* (2025.01); *H10D 84/038* (2025.01); *H10D 84/85* (2025.01)

(58) Field of Classification Search
CPC ............. H10D 30/6735; H10D 62/822; H10D 64/017; H10D 84/83
See application file for complete search history.

(56) References Cited

U.S. PATENT DOCUMENTS

2022/0254781 A1 * 8/2022 Song .................. H10D 84/0177
2026/0013203 A1 * 1/2026 Matagne ................ H10D 30/43

* cited by examiner

*Primary Examiner* — Fazli Erdem
(74) *Attorney, Agent, or Firm* — Birch, Stewart, Kolasch & Birch, LLP

(57) ABSTRACT

A semiconductor device includes a channel portion disposed on and spaced apart from a substrate, a gate dielectric which includes an upper dielectric region disposed on the channel portion, a first inner gate structure disposed between the substrate and the upper dielectric region, and an outer gate structure including an outer work-function portion and a cap portion. The outer work-function portion covers the upper dielectric region and the first inner gate structure. The cap portion covers the outer work-function portion in a way that the cap portion is separated from the first inner gate structure. The first inner gate structure includes a first work-function material and a conductive material that is different from the first work-function material. The outer work-function portion includes a second work-function material that is different from the conductive material.

20 Claims, 45 Drawing Sheets

SEMICONDUCTOR DEVICE INCLUDING HIGH CONDUCTIVITY GATE STRUCTURE AND METHOD FOR MANUFACTURING THE SAME

BACKGROUND

Different threshold voltages between an n-type transistor and a p-type transistor may be achieved by using different gate electrode materials. A patterning process is often used for forming different gate electrode materials in the n-type transistor and the p-type transistor. With scaling down of the size of the transistors, there are many challenges in formation of different gate electrode materials in different types of transistors. Therefore, the structural design of the gate electrode is in continuous development so as to improve the performance of the transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
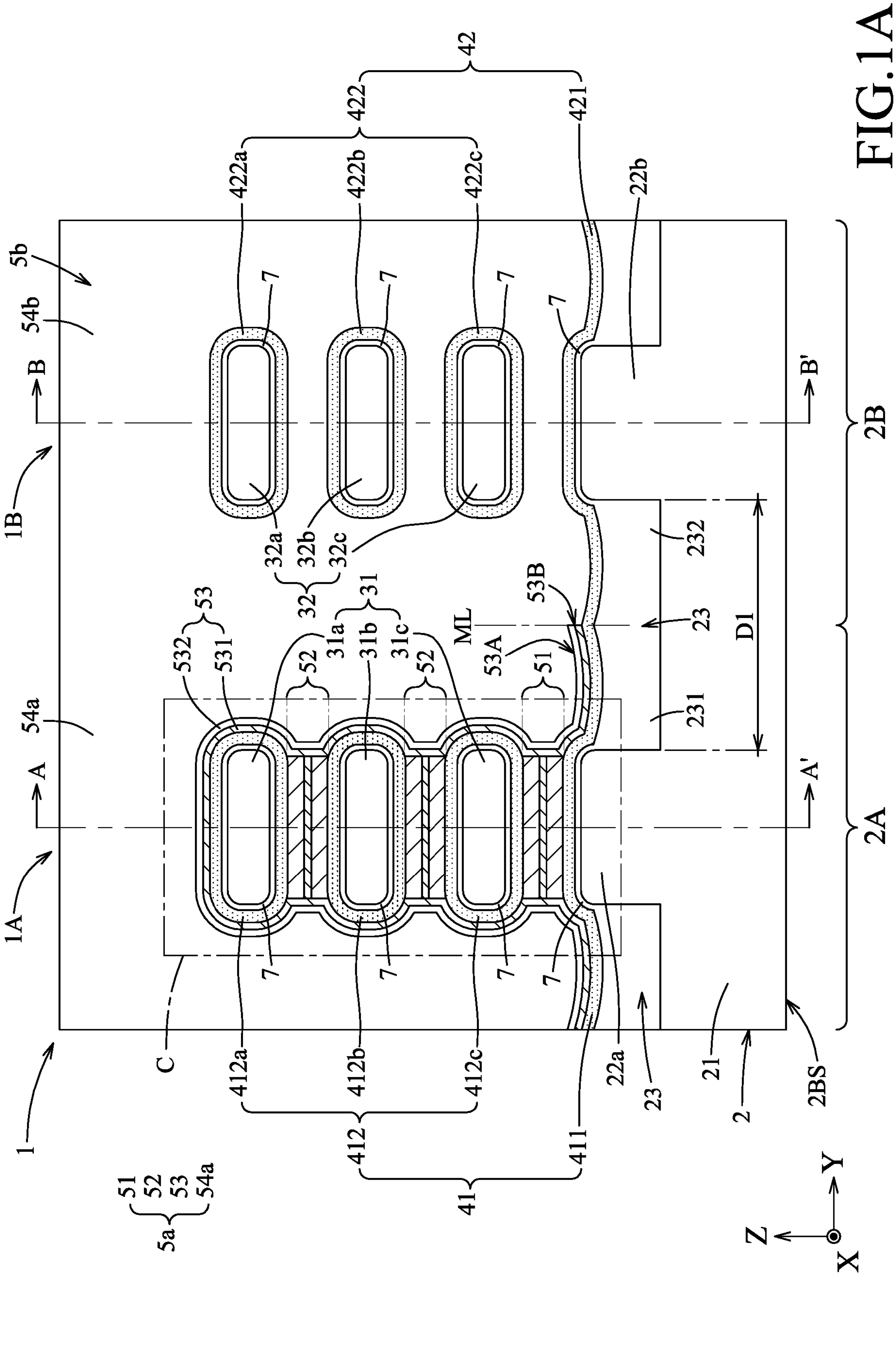
FIG. 1A is a schematic sectional view illustrating a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “on,” “above,” “top,” “bottom,” “upper,” “lower,” “over,” “beneath,” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term “about” even if the term “about” is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term “about,” when used with a value, can capture variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

The term “source/drain portion(s)” may refer to a source or a drain, individually or collectively dependent upon the context.

In order to achieve high integration density and performance, the size of transistors continuously shrinks in three dimensions, and a distance between two adjacent ones of the transistors are also getting smaller. Sometimes, an n-type transistor may include a gate electrode material different from that of a p-type transistor, and hence a patterning process will be involved in formation of gate electrodes of the n-type and p-type transistors. To be specific, an n-type work-functional material in the gate electrode of the n-type transistor and a silicon cap layer for preventing oxidation of the n-type work-function material may be firstly deposited on both n-type and p-type regions of a substrate (these regions are for forming the n-type and p-type transistors thereon, respectively), and then the patterning process is performed to remove the n-type work-function material and the silicon cap layer on the p-type region. With the shrinkage of the size of the transistors and the distance between the transistors, the presence of the silicon cap layer is unfavorable for the patterning process, and the n-type work function material on the n-type region may be over-etched during the patterning process, which may significantly affect the performance of the n-type transistor (e.g., threshold voltage of the n-type transistor may shift from a pre-determined value). Therefore, the present disclosure is directed to a semiconductor device including an n-type transistor and a p-type transistor, and a method for manufacturing the same. With a gate electrode of the n-type transistor having the structural arrangement as described below, although a cap portion is provided for protecting the n-type work-function material, the patterning process can be well performed without damaging the n-type work-function material, such that the gate electrode of the n-type transistor can have good gate control capability and high conductivity.

Figure 1C:
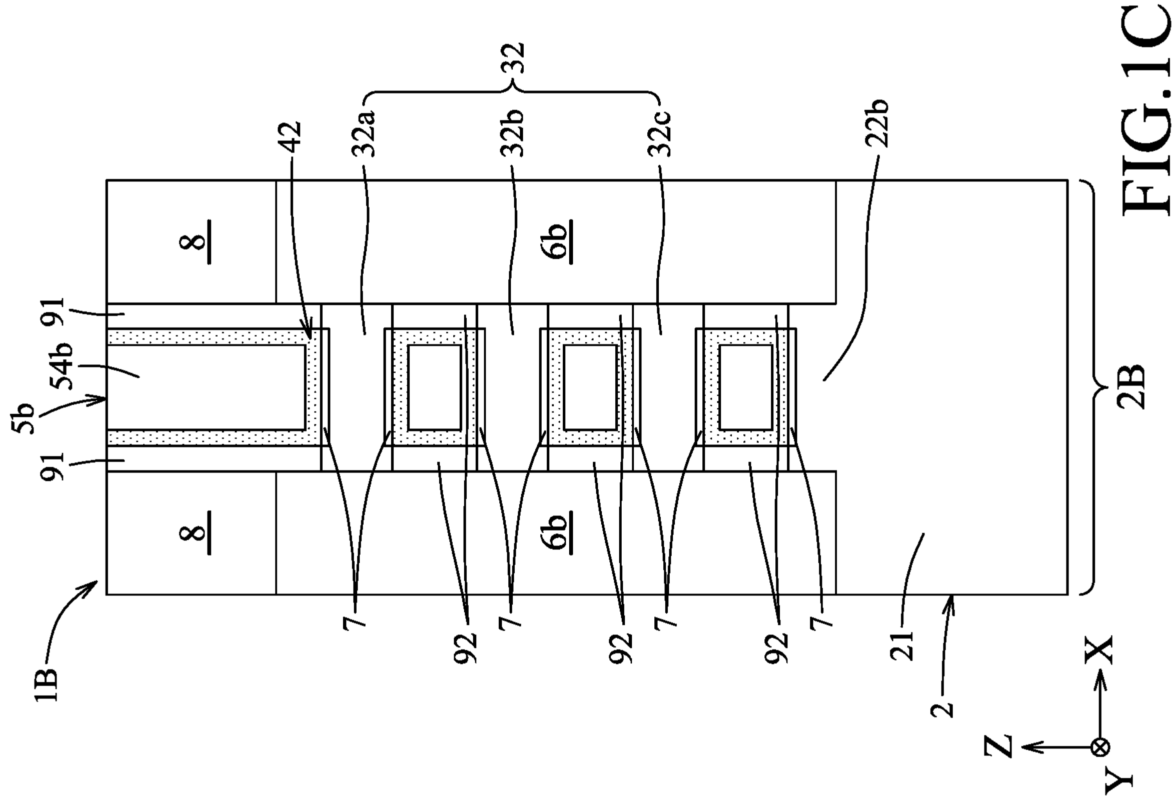
FIGS. 1B and 1C are schematic sectional views respectively taken along line A-A' and line B-B' of FIG. 1A in accordance with some embodiments.
Figure 1B:
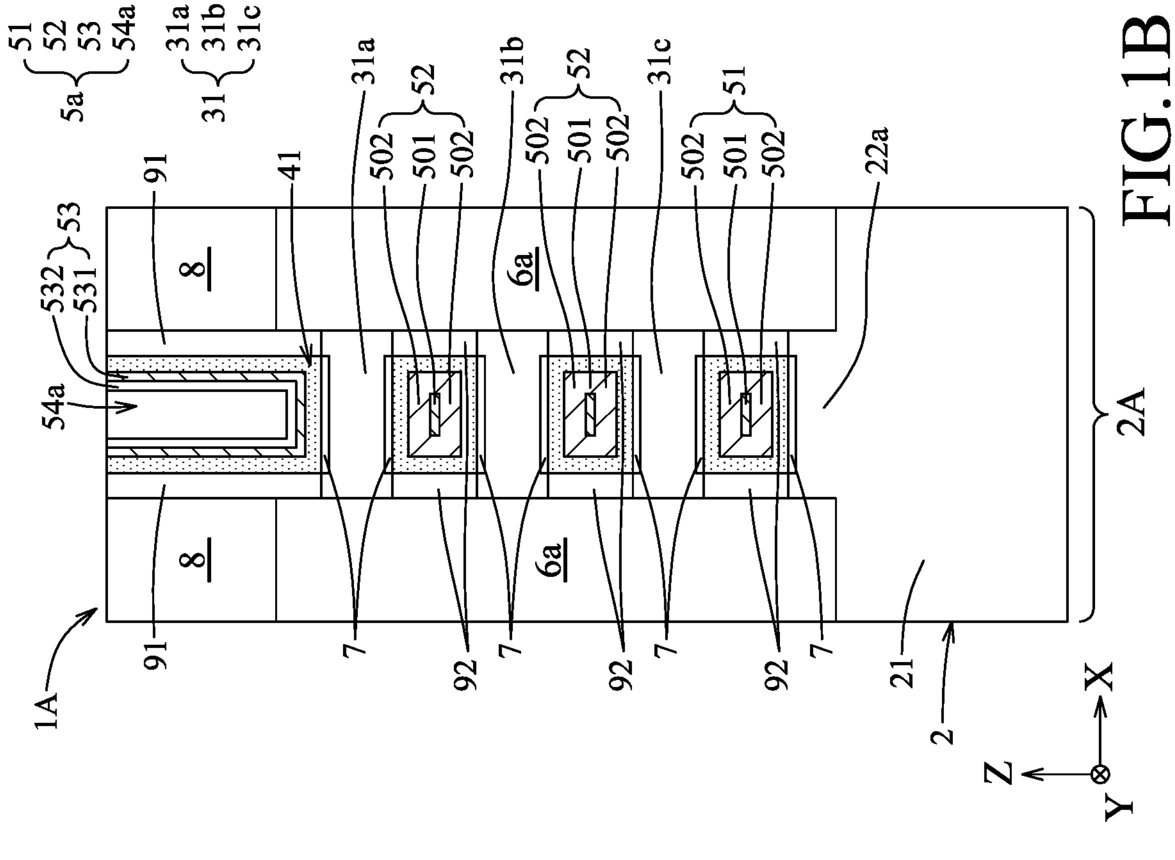

FIG. 1A is a schematic sectional view illustrating a semiconductor device 1 in accordance with some embodiments. FIGS. 1B and 1C are schematic sectional views respectively taken along line A-A' and line B-B' of FIG. 1A in accordance with some embodiments. Some repeating structures are omitted in FIGS. 1A to 1C for the sake of brevity.

The semiconductor device 1 includes a substrate 2, a first device portion 1A and a second device portion 1B disposed on the substrate 2. The substrate 2 includes a first region 2A and a second region 2B displaced from the first region 2A in a Y direction. The first and second device portions 1A, 1B are respectively formed on the first and second regions 2A, 2B. In some embodiments, the first and second device portions 1A, 1B respectively include an n-type transistor and a p-type transistor, and hence the first and second regions 2A, 2B are respectively referred to as an n-region 2A and a p-region 2B hereinafter.

In some embodiments, the substrate 2 may be made of elemental semiconductor materials, such as crystalline silicon, diamond, or germanium; compound semiconductor materials, such as silicon carbide, gallium arsenide, indium arsenide, or indium phosphide; or alloy semiconductor materials, such as silicon germanium, silicon germanium carbide, gallium arsenide phosphide, or gallium indium phosphide. In addition, the substrate 2 may be a bulk silicon substrate, a silicon-on-insulator (SOI) substrate, or a germanium-on-insulator (GOI) substrate. Other suitable materials for the substrate 2 are within the contemplated scope of the present disclosure. In some embodiments, the substrate 2 includes an underlying portion 21 and two protruding portions 22*a*, 22*b* protruding from the underlying portion 21 in positions corresponding to the n-region 2A and the p-region 2B, respectively. In some embodiments, the two protruding portions 22*a*, 22*b* are spaced apart from each other by a distance (D1) ranging from about 20 nm to about 60 nm. In some embodiments, the two protruding portions 22*a*, 22*b* are isolated through an isolation portion 23. In some embodiments, the isolation portion 23 may be a portion of a shallow trench isolation (STI), a deep trench isolation (DTI), or other suitable structures, and may be made of a dielectric material, such as an oxide material (for example, silicon oxide), a nitride material (for example, silicon nitride), or a combination thereof. Other materials and/or configurations suitable for the isolation portion 23 are within the contemplated scope of the present disclosure.

In some embodiments, as shown in FIGS. 1A and 1B, the first device portion 1A is configured as a gate-all-around (GAA) transistor. In some other embodiments not shown herein, the first device portion may include two GAA transistors stacked on one another in a Z direction transverse to the Y direction. In some embodiments, the structural design of such two GAA transistors may be referred to as a complementary field-effect transistors (CFET) structure. In some yet other embodiments not shown herein, the first device portion may include two GAA transistors which are arranged in a fork-sheet structure, wherein the two GAA transistors are spaced part from each other in the Y direction through a wall portion. Other configurations suitable for the first device portion 1A are within the contemplated scope of the present disclosure. In some embodiments, as shown 1A and 1C, the second device portion 1B is configured as a GAA transistor. In some other embodiments not shown herein, the second device portion may be configured as a fin-type field-effect transistor (FinFET). In some yet other embodiments not shown herein, the second device portion may include two GAA transistors arranged in CFET structure or a fork-sheet structure. Other configurations suitable for the second device portion 1B are within the contemplated scope of the present disclosure.

Figure 2:
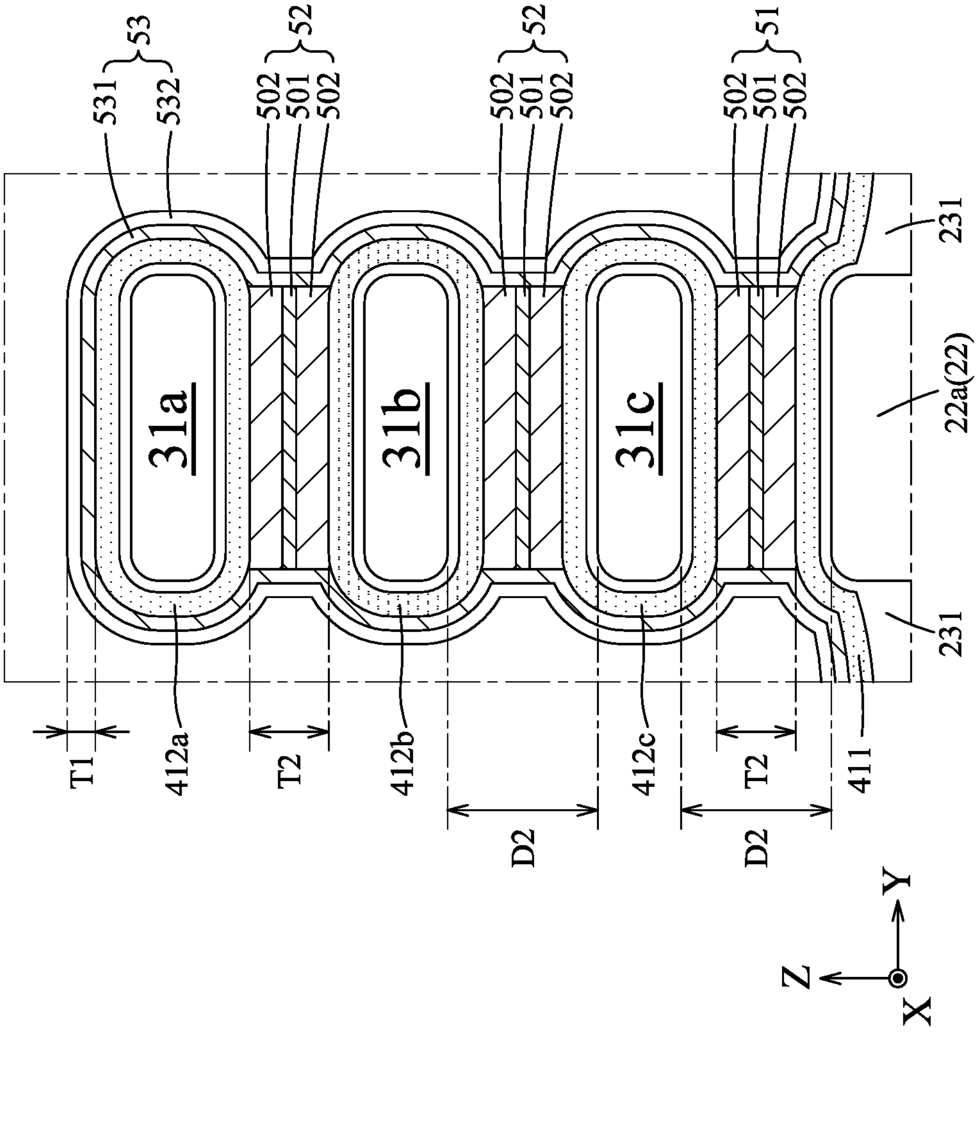
FIG. 2 is a fragmentary enlarged view of area C in FIG. 1A in accordance with some embodiments.

In some embodiments, as shown in FIG. 1A, the first device portion 1A includes a first channel portion 31, a first gate dielectric 41, a first gate electrode 5*a* which is separated from the first channel portion 31 through the first gate dielectric 41, and two first source/drain portions 6*a* (see FIG. 1B) disposed at two opposite sides of the first channel portion 31 in an X direction transverse to both the Y and Z direction. In some embodiments, the X, Y and Z directions are perpendicular to one another. FIG. 2 is a fragmentary enlarged view of area C in FIG. 1A to more clearly illustrate the structural details in the first device portion 1A.

In some embodiments, the first channel portion 31 is disposed on and spaced apart from the protruding portion 22*a* of the substrate 2 in the Z direction. In some embodiments, possible materials suitable for the first channel portion 31 are similar to those for the substrate 2 as described above, and thus the details thereof are omitted for the sake of brevity. In some embodiments, the first channel portion 31 is made of silicon. Other materials suitable for the first channel portion 31 are within the contemplated scope of the present disclosure. In some embodiments, the first channel portion 31 includes at least one channel part. The number of the channel part(s) in the first channel portion 31 may range from one to five, and may vary according to practical applications. As shown in FIGS. 1A, 1B and 2, the number of the channel part(s) 31*a*, 31*b*, 31*c* is exemplified as three, and the three channel parts 31*a*, 31*b*, 31*c* are spaced apart from each other in the Z direction. In some embodiments, each of the channel parts 31*a*, 31*b*, 31*c* has a thickness in the Z direction ranging from about 3 nm to about 8 nm. In some embodiments, as shown in FIG. 2, a distance (D2) between two adjacent ones of the channel parts 31*a*, 31*b*, 31*c* may range from about 5.5 nm to about 15 nm. In some embodiments, the lowermost channel part 31*c* is spaced apart from the protruding portion 22*a* of the substrate 2 by the distance (D2).

In some embodiments, as shown in FIG. 1A, the first gate dielectric 41, includes a lower dielectric region 411 which covers the protruding portion 22*a* and a first portion 231 of the isolation portion 23, and an upper dielectric region 412 which has three upper dielectric parts 412*a*, 412*b*, 412*c* respectively surrounding the channel parts 31*a*, 31*b*, 31*c*. In some embodiments not shown herein, the lower dielectric region 411 may be absent. In some embodiments, the first gate dielectric 41 includes silicon oxide, silicon nitride, silicon oxynitride, a suitable high-k material (such as hafnium oxide, zirconium oxide, zirconium aluminum oxide, hafnium aluminum oxide, hafnium silicon oxide, aluminum oxide, and so on), other suitable materials, or combinations thereof. Other suitable materials for the first gate dielectric 41 are within the contemplated scope of the present disclosure. In some embodiments, the first gate dielectric 41 has a thickness ranging from about 1 nm to about 2.5 nm.

In some embodiments, as shown in FIGS. 1A, 1B and 2, the first gate electrode 5*a* includes a first inner gate structure 51, two second inner gate structures 52 and an outer gate structure 53.

In some embodiments, as shown in FIG. 1A, the first inner gate structure 51 is disposed between the bottommost upper dielectric part 412*c* and the lower dielectric region 411. In some embodiments not shown herein, in the case that the lower dielectric region 411 is absent, the first inner gate structure 51 may be disposed between the bottommost upper dielectric part 412*c* and the substrate 2. In some embodiments, as shown in FIG. 1A, each of the two second inner gate structures 52 is disposed between two corresponding adjacent ones of the upper dielectric parts 412*a*, 412*b*, 412*c*.

Each of the inner gate structures 51, 52 includes a first work-function material and a conductive material that is different from the first work-function material.

In some embodiments, as shown in FIG. 2, which is the fragmentary enlarged view of area C in FIG. 1A, each of the inner gate structures 51, 52 includes a conductive portion 501 and two inner work-function (WF) portions 502 disposed at two opposite sides of the conductive portion 501 in the Z direction. That is, the two inner WF portions 502 are respectively disposed proximate to and distal from the substrate 2. The conductive portion 501 includes the conductive material, and each of the inner WF portions 502 includes the first work-function material. In some embodiments, a ratio of a volume of the conductive portion 501 to a total volume of the two inner WF portions 502 ranges from 5:100 to 100:100. The terms “distal” and “proximate” are used to describe relative positions with respective to a reference.

The first work-function material is used to adjust threshold voltage of the first device portion 1A. In some embodiments, the first work-function material is an aluminum-based n-type work-function material. In some embodiments, the first work-function material is an n-type work-function material and includes titanium aluminum (TiAl), titanium aluminum carbide (TiAlC), titanium carbide (TIC), titanium silicon nitride (TiSiN), aluminum (Al), tantalum aluminum carbide (TaAlC), tantalum aluminum silicide (TaSiAl), tantalum silicon carbide (TaSiC), tantalum silicide (TaSi), hafnium carbide (HfC), or combinations thereof. Other materials suitable for the first work-function material are within the contemplated scope of the present disclosure. The conductive material is used to reduce gate resistance of each of the inner gate structures 51, 52. In some embodiments, the conductive material has a sheet resistance less than that of the first work-function material. In some embodiments, the sheet resistance of the conductive material is less than about 200 ohm/sq. In some embodiments, the conductive material includes titanium nitride (TiN), tungsten (W), ruthenium (Ru), molybdenum (Mo), tungsten carbon nitride (WCN), tantalum nitride (TaN), tungsten nitride (WN), tantalum silicon nitride (TaSiN), or combinations thereof. Other materials suitable for the conductive material are within the contemplated scope of the present disclosure.

In some embodiments, as shown in FIG. 2, the outer gate structure 53 includes an outer work-function (WF) portion 531 and a cap portion 532. The outer WF portion 531 includes a second work-function material that is different from the conductive material, and covers the three upper dielectric parts 412*a*, 412*b*, 412*c*, the first inner gate structure 51, and the two second inner gate structures 52. In some embodiments, the outer gate structure 53 is further disposed to cover the lower dielectric region 411. Similar to the function of the first work-function material, the second work-function material is also used to adjust threshold voltage of the first device portion 1A. In some embodiments, the second work-function material is an n-type work-function material. Possible materials suitable for the second work-function material are similar to those for the first work-function material, and thus the details thereof are omitted for the sake of brevity. Other materials suitable for the second work-function material are within the contemplated scope of the present disclosure. In some embodiments, the first and second work-function materials may be the same as or different from each other, and are n-type work-function materials. The threshold voltage of the first device portion 1A can be determined through material selection and thickness of the first and second work-function materials. The cap portion 532 covers the outer WF portion 531 in a way that the cap portion 532 is separated from the first and second inner gate structures 51, 52. The cap portion 532 is provided to prevent the outer WF portion 531 and the inner gate structures 51, 52 which are disposed beneath the outer WF portion 531 from being oxidized. In some embodiments, the cap portion 532 includes silicon, silicon oxide, silicon nitride, silicon carbide, silicon oxynitride, silicon oxycarbide, silicon carbon nitride, silicon oxycarbon nitride, titanium nitride, tantalum nitride, or combinations thereof. Other materials suitable for the cap portion 532 are within the contemplated scope of the present disclosure. In some embodiments, the cap portion 532 may be configured as a single layer structure or a multi-layered structure. For example, the cap portion 532 is configured as a bi-layered structure which includes a titanium nitride layer (not shown) proximate to the inner gate structures 51, 52 and a silicon layer (not shown) distal from the inner gate structures 51, 52. The silicon layer may effectively prevent the inner gate structures 51, 52 from being oxidized, and the titanium nitride layer not only protects the inner gate structures 51, 52 against oxidation, but also provides high conductivity (in comparison with the silicon layer). It is noted that the outer gate structure 53 has a thickness (T1) less than a thickness (T2) of each of the inner gate structures 51, 52. In some embodiments, as shown in FIG. 2, the thickness (T1) of the outer gate structure 53 is even less than half of the thickness (T2) of each of the first and second inner gate structures 51, 52. In some embodiments, the thickness (T2) of each of the inner gate structures 51, 52 ranges from about 2.5 nm to about 12 nm. In some embodiments, the thickness (T1) of the outer gate structure 53 ranges from about 1 nm to about 5 nm. In some embodiments, the outer WF portion 531 of the outer gate structure 53 has a thickness ranging from about 0.5 nm to about 3 nm. The isolation region 23 has a midline (ML) that is equidistant from the protruding portion 22*a* at the n-region 2A and the protruding portion 22*b* at the p-region 2B. With such arrangement in the first gate electrode 5*a* (i.e., T1 is much less than T2), the outer gate structure 53 at a boundary between the first gate electrode 5*a* and a second gate electrode 5*b* (described hereafter) is less likely to be unduly damaged during a patterning process, which results in better gate control over the channel portion 3*a*. Therefore, in some embodiments, a minimum distance between the outer WF portion 531 and the midline (ML) can be controlled to range from substantially 0 nm to about 5 nm.

In some embodiments, as shown in FIG. 1A, the first gate electrode 5*a* further includes a covering portion 54*a* disposed on the cap portion 53. Possible materials suitable for the covering portion 54*a* are similar to the conductive material described above or a third work-function material described below. The material of the covering portion 54*a* is different from that of the inner WF portions 502 or that of the outer WF portion 531. The material of the covering portion 54*a* may be the same or different from the material of the conductive portion 501.

In some embodiments, as shown in FIG. 1B, the source/drain portions 6*a* are disposed at two opposite sides of each of the channel parts 31*a*, 31*b*, 31*c* in the X direction such that each of the channel parts 31*a*, 31*b*, 31*c* extends between the source/drain portions 6*a*. In some embodiments, each of the source/drain portions 6*a* may include single crystalline silicon, polycrystalline silicon or other suitable materials doped with n-type impurities so as to function as a source/drain of an n-FET. The n-type impurities may be, for example, but not limited to, nitrogen (N), phosphorous (P), arsenic (As), antimony (Sb), other suitable materials, or combinations thereof. In some embodiments, each of the source/drain portions 6*a* may be formed as a single layer structure or a multi-layered structure having several sub-layers with different doping concentration.

In some embodiments, as shown in FIG. 1A, in the case that the second device portion 1B is configured as a GAA transistor, the second device portion 1B includes a second channel portion 32, a second gate dielectric 42, a second gate electrode 5*b* which is separated from the second channel portion 32 through the second gate dielectric 42, and two second source/drain portions 6*b* (see FIG. 1C) disposed at two opposite sides of the second channel portion 32 in the X direction.

The second channel portion 32 is disposed on and spaced apart from the protruding portion 22*b* of the substrate 2 in the Z direction. In some embodiments, possible materials suitable for the second channel portion 32 are similar to those for the substrate 2 as described above, and thus the details thereof are omitted for the sake of brevity. In some embodiments, the second channel portion 32 is made of silicon. Other materials suitable for the second channel portion 32 are within the contemplated scope of the present disclosure. In some embodiments, the second channel portion 32 includes at least one channel part. The number of the channel part(s) in the second channel portion 32 may range from one to five, and may vary according to practical applications. As shown in FIGS. 1A and 1C, the number of the channel part(s) 32*a*, 32*b*, 32*c* is exemplified as three, and the three channel parts 32*a*, 32*b*, 32*c* are spaced apart from each other in the Z direction.

In some embodiments, as shown in FIG. 1A, the second gate dielectric 42, includes a lower dielectric region 421 which covers the protruding portion 22*b* and a second portion 232 of the isolation portion 23, and an upper dielectric region 422 which has three upper dielectric parts 422*a*, 422*b*, 422*c* respectively surrounding the channel parts 32*a*, 32*b*, 32*c*. In some embodiments not shown herein, the lower dielectric region 421 may be absent. In some embodiments, possible material suitable for the second gate dielectric 42 are similar to those for the first gate dielectric 41, and thus the details thereof are omitted for the sake of brevity. Other suitable materials for the second gate dielectric 42 are within the contemplated scope of the present disclosure. In some embodiments, the second gate dielectric 42 has a thickness ranging from about 1 nm to about 2.5 nm. In some embodiments, the lower dielectric region 421 of the second gate dielectric 42 is connected to the lower dielectric region 411 of the first gate dielectric 41.

The second gate electrode 5*b* includes a covering portion 54*b* which surrounds the upper dielectric parts 422*a*, 422*b*, 422*c* and covers the lower dielectric region 421. In some embodiments, the covering portion 54*b* includes a third work-function material that is different from the first work-function material and the second work-function material. In some embodiments, the third work-function material is used to adjust threshold voltage of the second device portion 1B. In some embodiments, the third work-function material is a p-type work-function material, and includes titanium nitride (TiN), tungsten (W), tungsten carbon nitride (WCN), ruthenium (Ru), molybdenum (Mo), tantalum nitride (TaN), tungsten nitride (WN), tantalum silicon nitride (TaSiN), or combinations thereof. In some embodiments, the third work-function material has a sheet resistance less than about 200 ohm/sq. Other materials suitable for the third work-function material are within the contemplated scope of the present disclosure. In some embodiments, the covering portion 54*a* of the first gate electrode 5*a* is made of the same material as that of the covering portion 54*b* of the second gate electrode 5*b*. That is, the covering portion 54*a* includes the third work-function material. The outer gate portion 53 may have a first interface 53A with the covering portion 54*a*, and a second interface 53B with the covering portion 54*b*. A distance between the second interface 53B and the midline (ML) can be controlled to range from substantially 0 nm to about 5 nm.

In some embodiments, the source/drain portions 6*b* are disposed at two opposite sides of each of the channel parts 32*a*. 32*b*, 32*c* in the X direction such that each of the channel parts 32*a*, 32*b*, 32*c* extends between the source/drain portions 6*b*. In some embodiments, each of the source/drain portions 6*b* may include single crystalline or polycrystalline silicon, single crystalline or polycrystalline silicon germanium, or other suitable materials doped with p-type impurities so as to function as a source/drain of a p-FET. The p-type impurities may be, for example, but not limited to, boron (B), aluminum (Al), gallium (Ga), indium (In), other suitable materials, or combinations thereof. In some embodiments, each of the source/drain portions 6*b* may be formed as a single layer structure or a multi-layered structure having several sub-layers with different doping concentration.

In some embodiments, the semiconductor device 1 further includes a plurality of interfacial layers 7, multiple pairs of inner spacers 92, two pairs of gate spacers 91, and an inter-layer dielectric portion 8, and the details thereof will be described hereinafter.

In some alternative embodiments, the semiconductor device 1 may further include additional features, and/or some features present in the semiconductor structure 80 may be modified, replaced, or eliminated without departure from the spirit and scope of the present disclosure.

Figure 3:
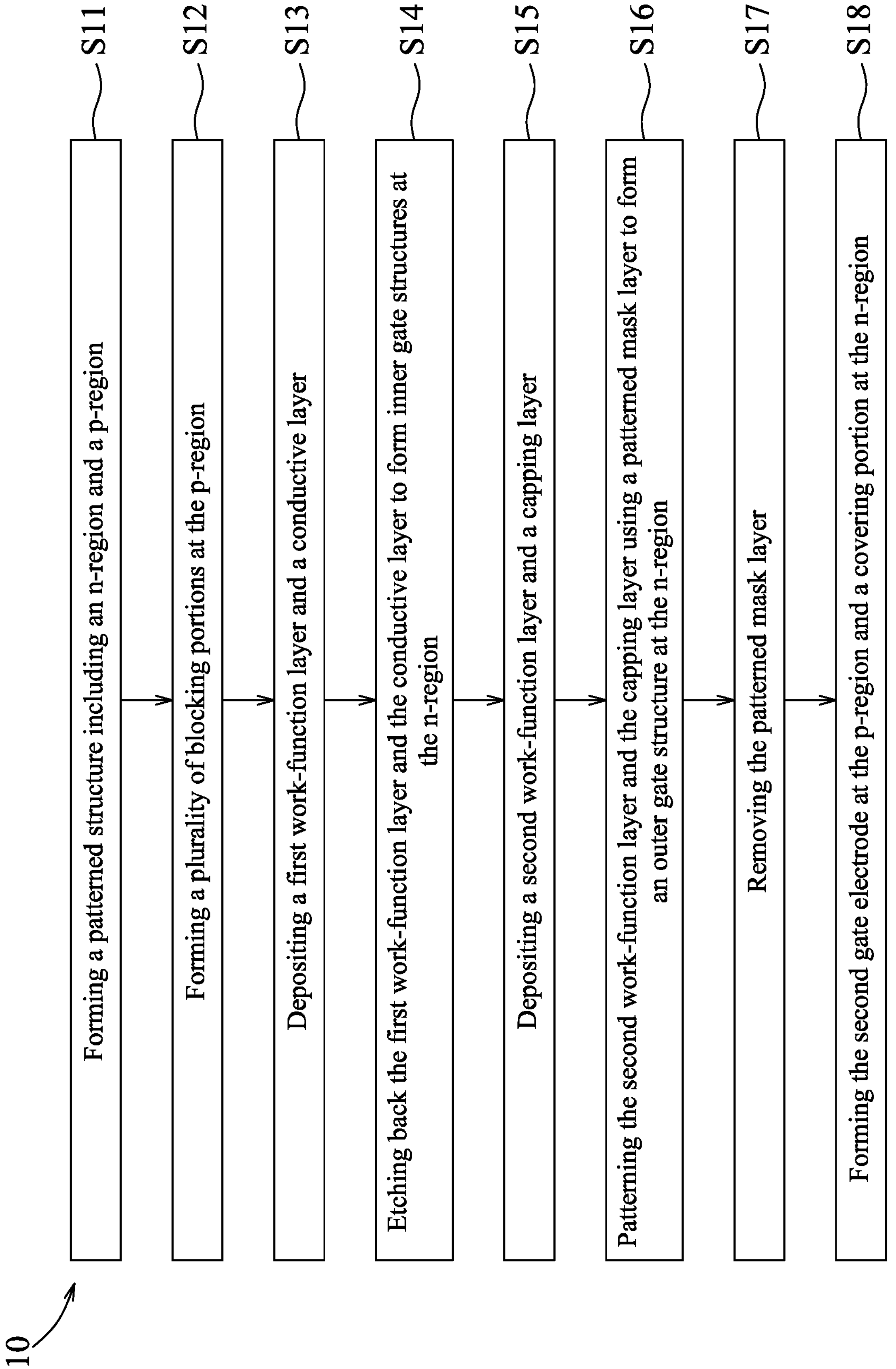
FIG. 3 is a flow diagram illustrating a method for manufacturing a semiconductor device in accordance with some embodiments.

FIG. 3 is a flow diagram illustrating a method 10 for manufacturing the semiconductor device (for example, the semiconductor structure 1 shown in FIG. 1A) in accordance with some embodiments. FIGS. 4A to 23C illustrate schematic views of intermediate stages of the method 10 in accordance with some embodiments. Some repeating structures are omitted in FIGS. 4A to 23C for the sake of brevity. It is noted that similar numerals from the above-mentioned embodiments are used where appropriate, with some construction differences being indicated with different numerals.

Figure 14A:
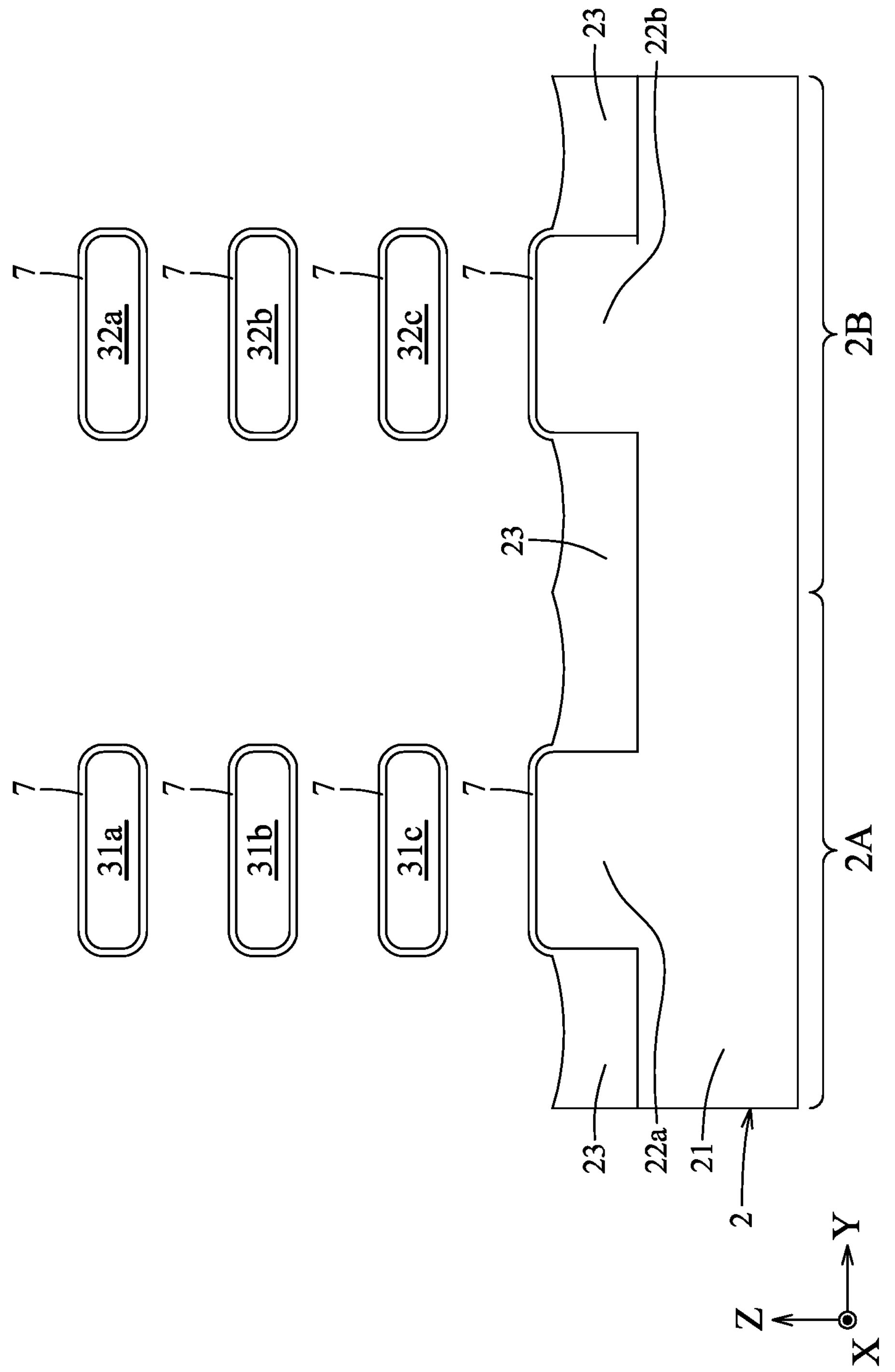
Figure 14C:
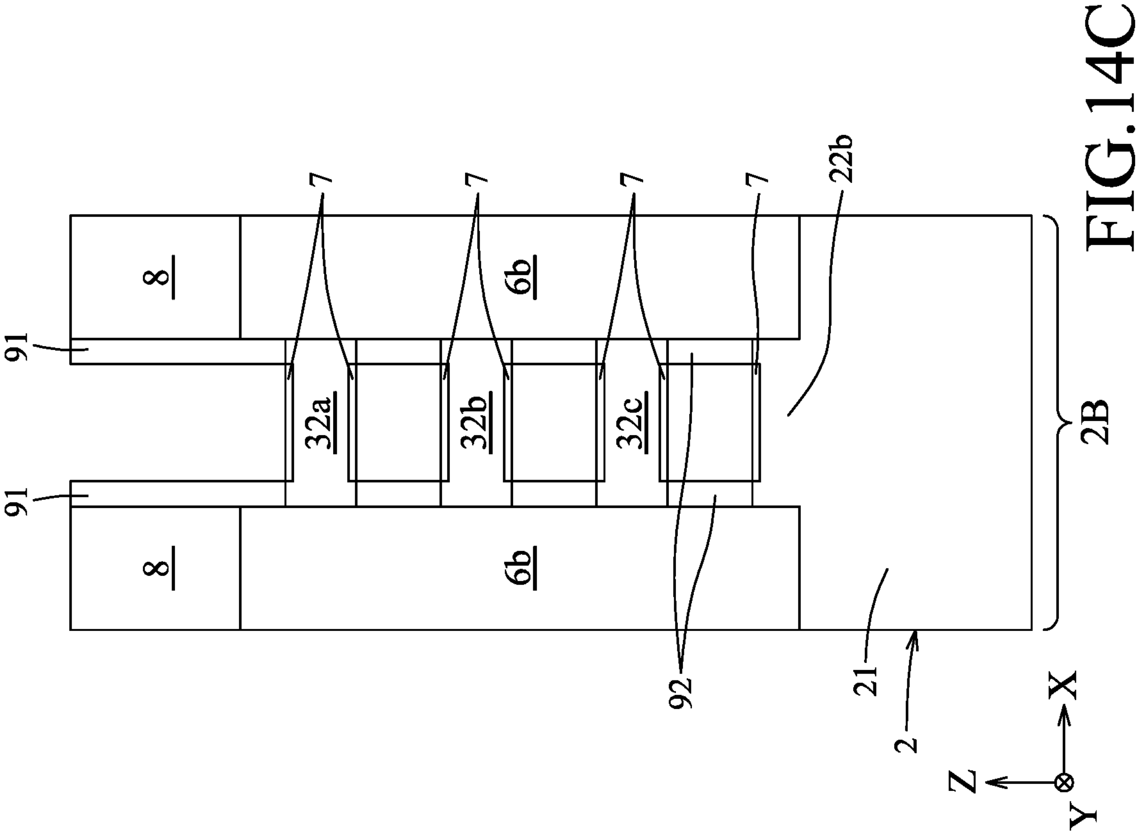
Figure 14B:
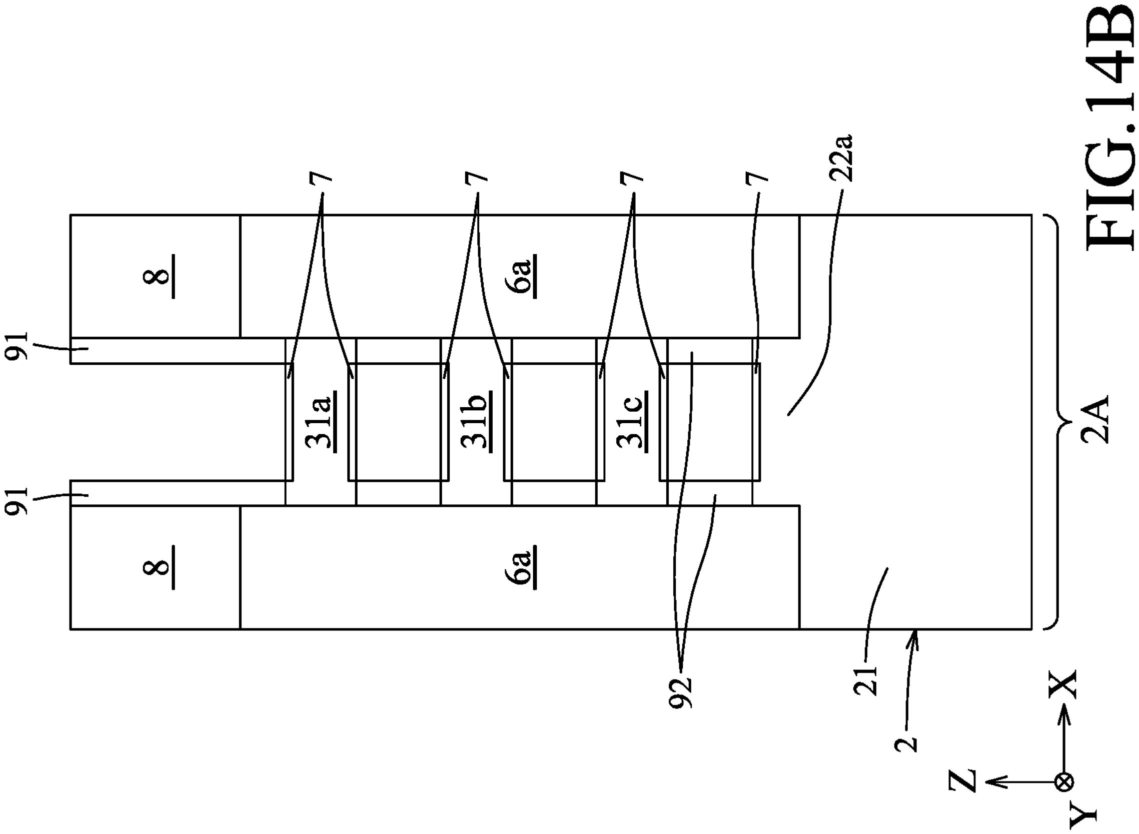
Figure 15A:
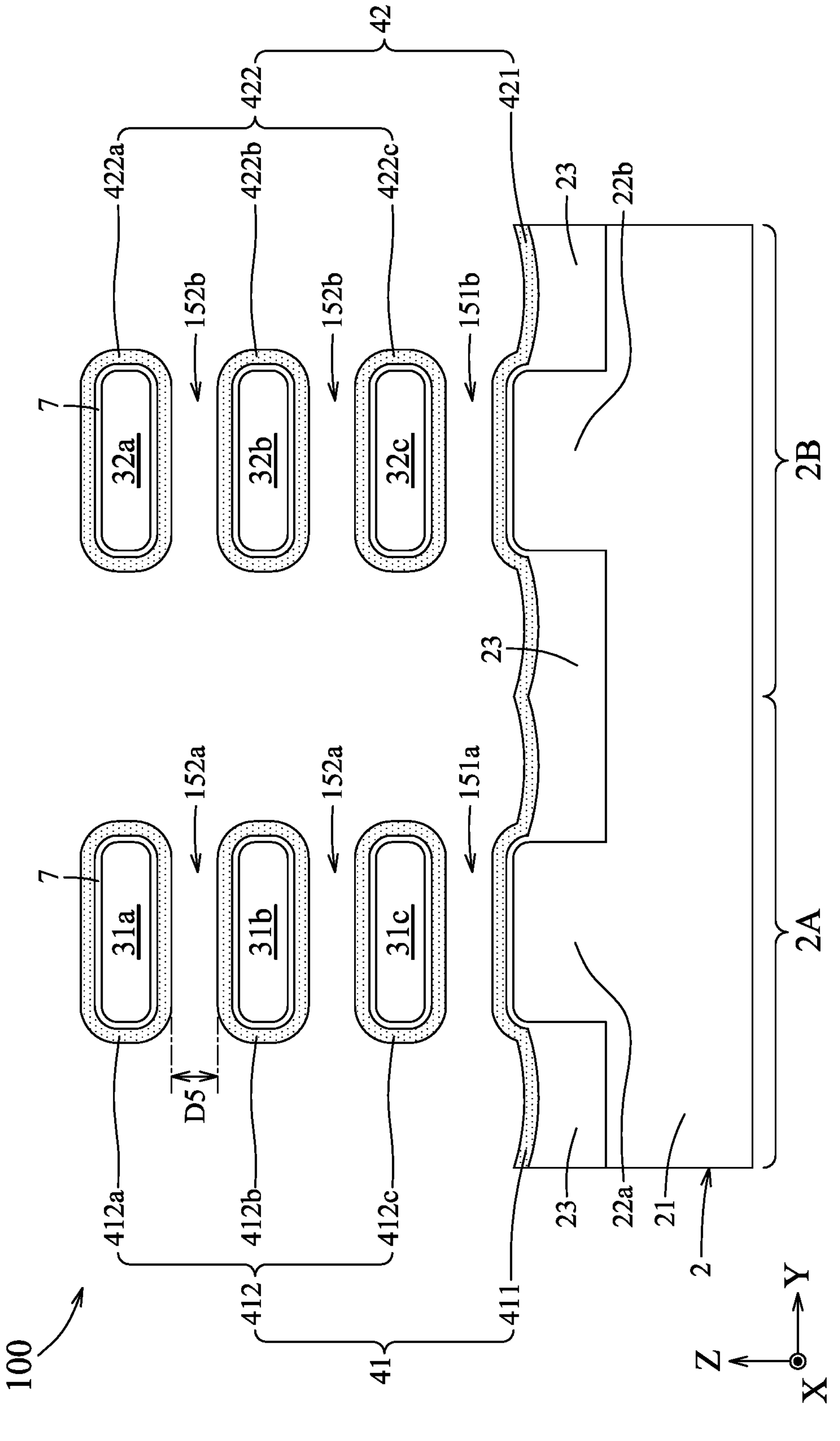
Figure 15C:
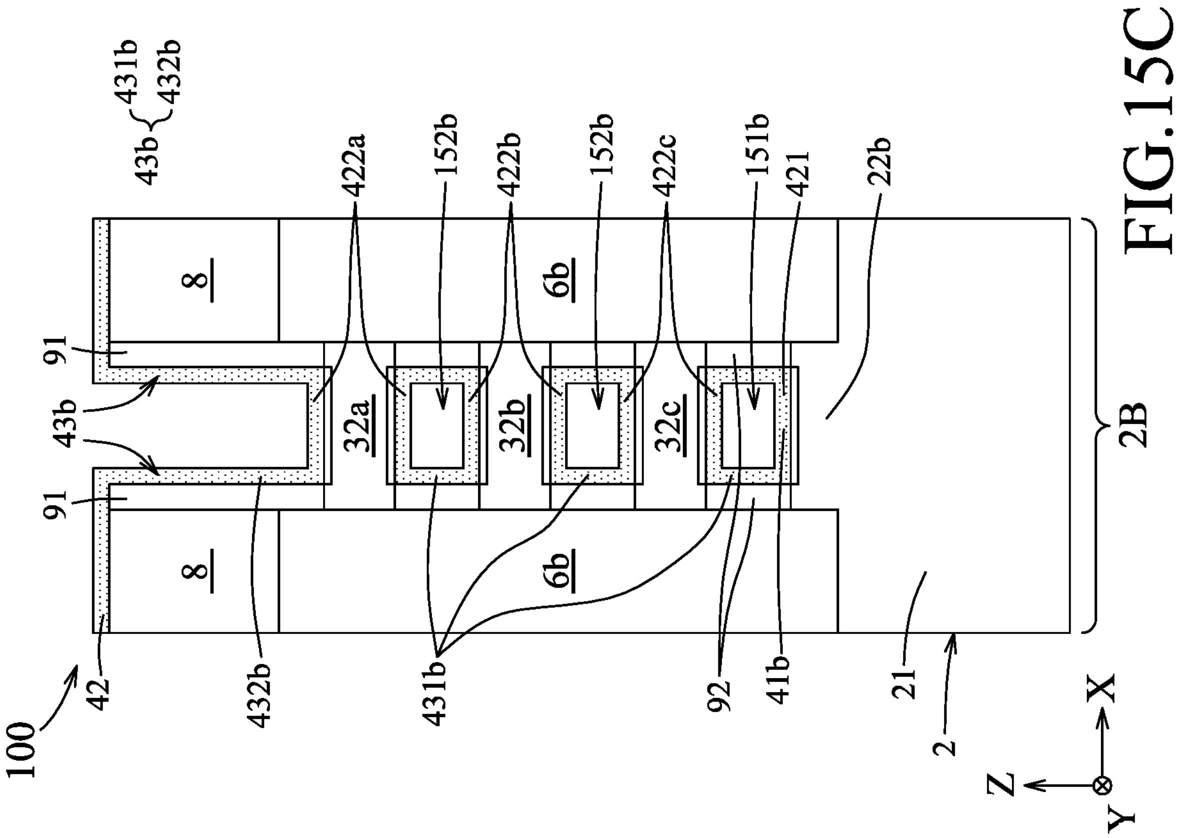
Figure 15B:
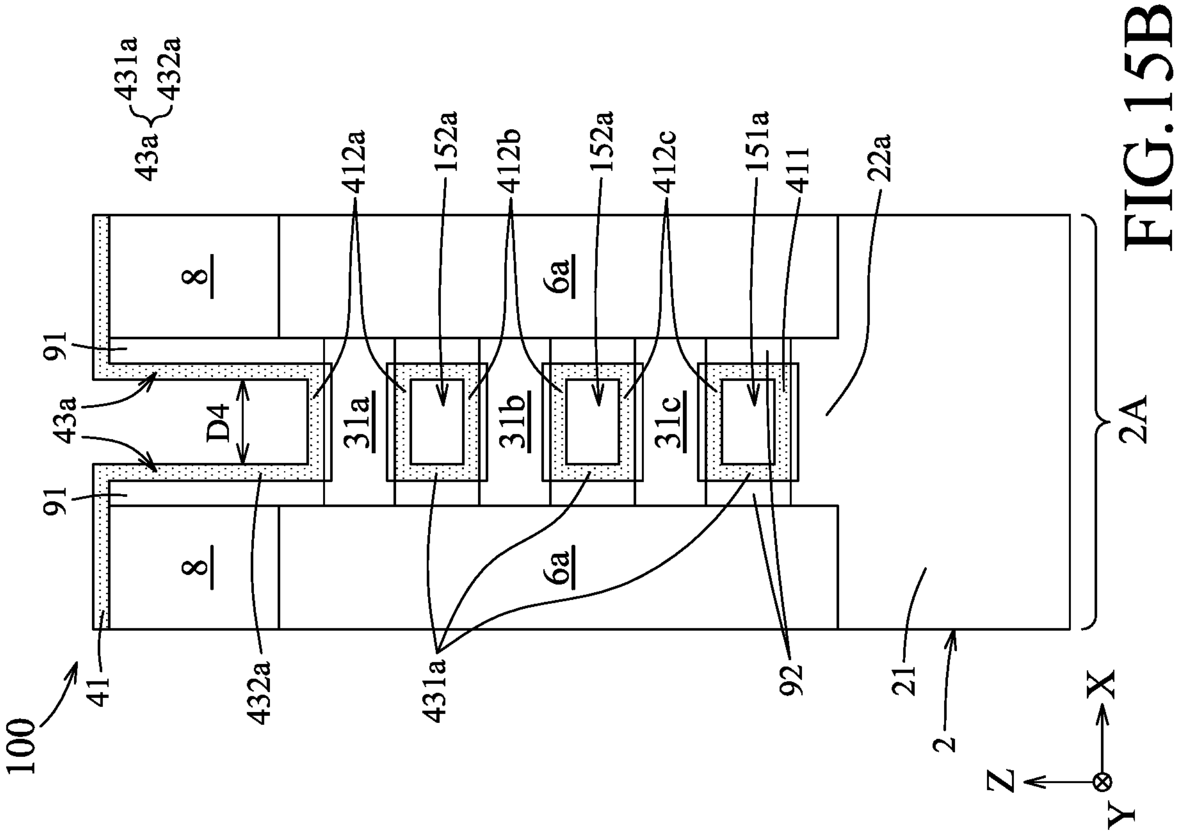

Referring to FIG. 3 and the examples illustrated in FIG. 15A to 15C, the method 10 begins at step S11, where a patterned structure 100 is formed. In some embodiments, formation of the patterned structure 100 may include multiple sub-steps, as shown in FIGS. 4A to 15C.

Figure 4A:
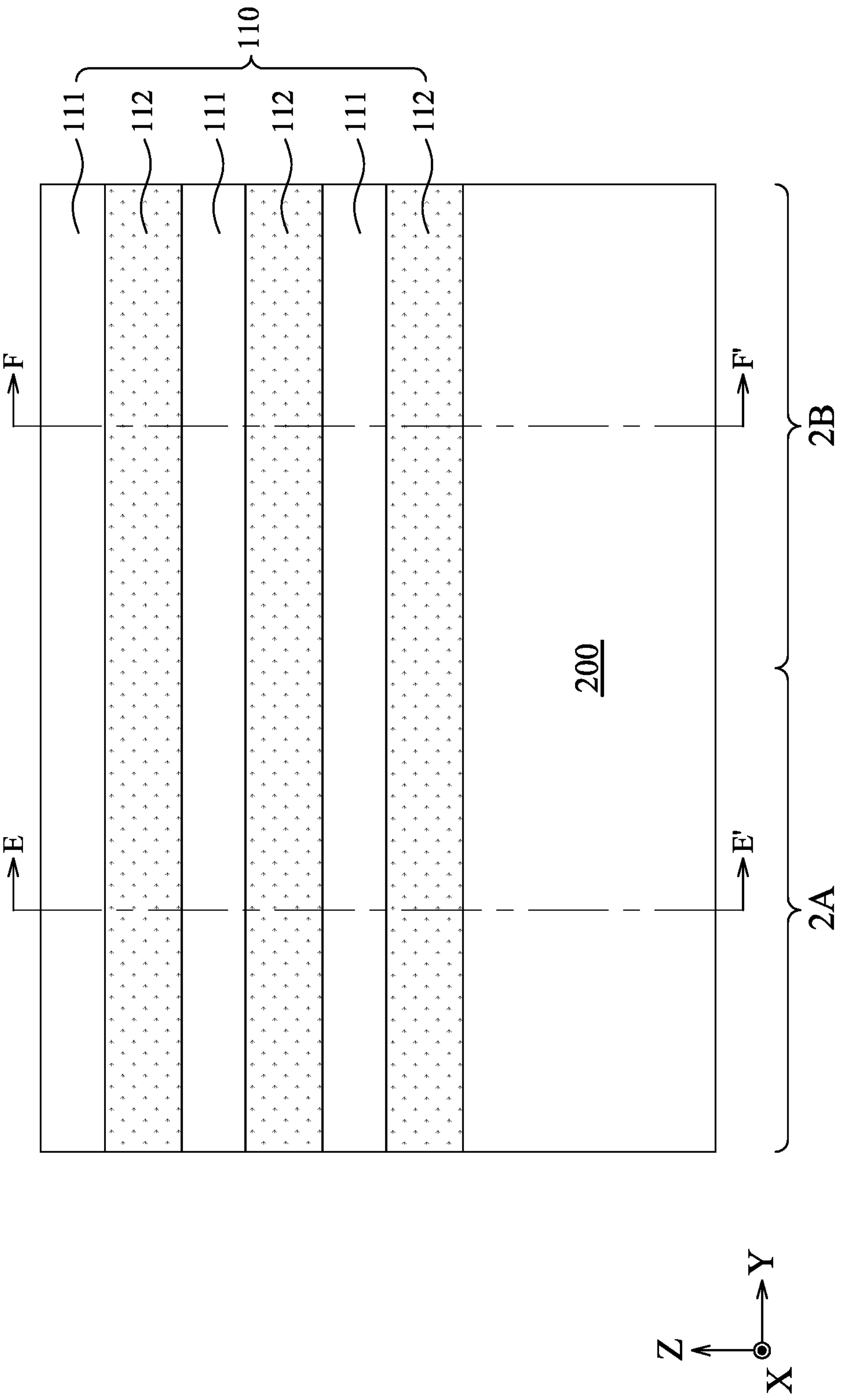
FIGS. 4A to 24C illustrate schematic views of intermediate stages of the method depicted in FIG. 3 in accordance with some embodiments.
Figure 4C:
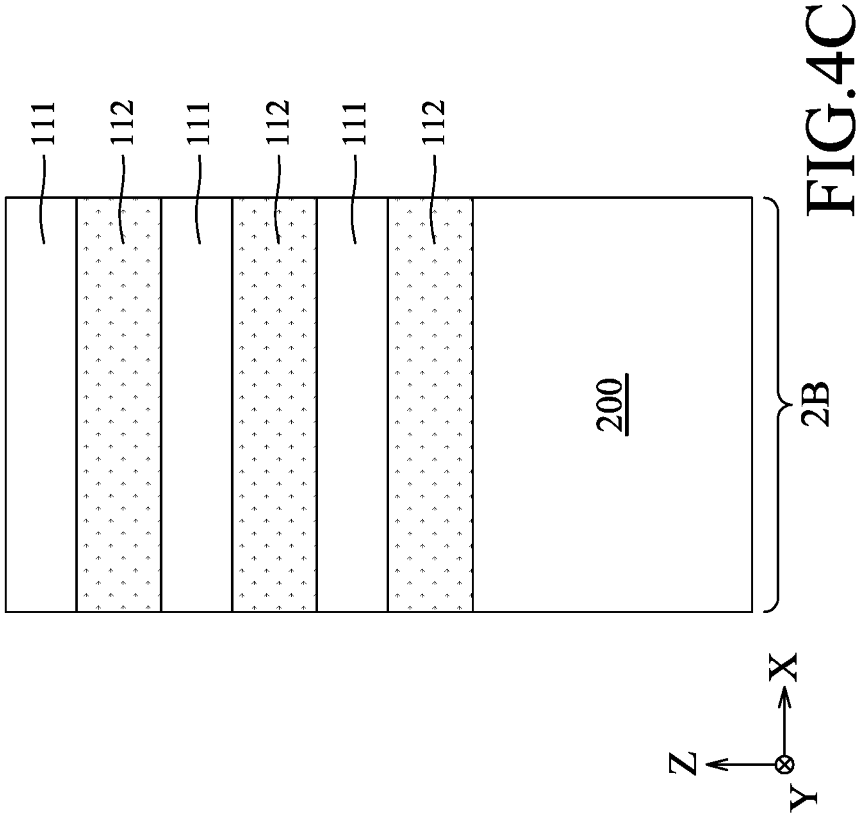
Figure 4B:
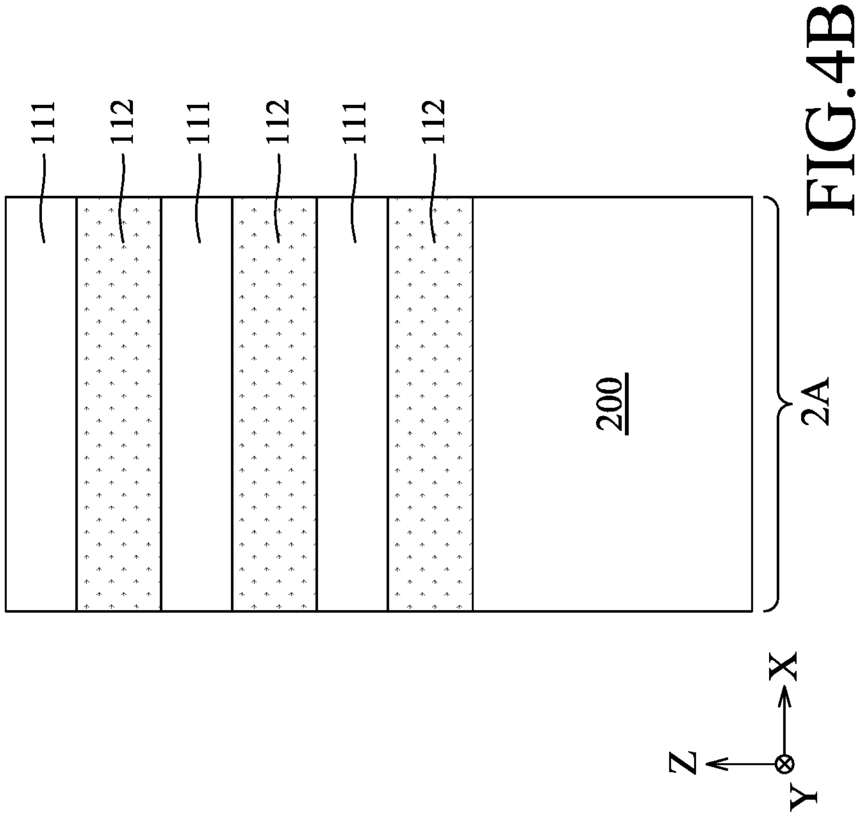

Referring to FIGS. 4A to 4C, a stack 110 is formed on a starting substrate 200 by chemical vapor deposition (CVD), atomic layer deposition (ALD), an epitaxial growth process (such as molecular-beam epitaxy (MBE), selective area epitaxy (SEG), etc.), or other suitable deposition techniques.

The starting substrate 200 is used for forming the substrate 2 (see FIG. 1A). Thus, the starting substrate 200 is made of the material for forming the substrate 2, and also has the n-region 2A and the p-region 2B. The stack 110 covers the n-region 2A and the n-region 2B, and includes three channel layers 111 and three sacrificial layers 112 disposed to alternate with the channel layers 111 in the Z direction. The channel layers 111 are used for forming the channel parts 31*a*, 31*b*, and thus each of the channel layers 111 includes the material for forming the channel parts 31*a*, 31*b*. Each of the sacrificial layers 112 is made of a material different from that of the channel layers 111, such that each of the sacrificial layers 112 may be selectively removed with the channel layers 111 being substantially intact due to different etching selectivities. In some embodiments, each of the channel layers 111 is made of silicon, and each of the sacrificial layers 112 is made of silicon germanium. In some embodiments, each of the channel layers 111 has a thickness ranging from about 3 nm to about 8 nm. In some embodiments, each of the sacrificial layers 112 has a thickness ranging from about 5 nm to about 12 nm. The thickness of the sacrificial layers 112 is positively correlated to the distance (D2) as described above. FIGS. 4B and 4C are schematic sectional views respectively taken along line E-E' and line F-F' of FIG. 4A to illustrate X-cut views of the structures at the n-region 2A and the p-region 2B in accordance with some embodiments.

Figure 5A:
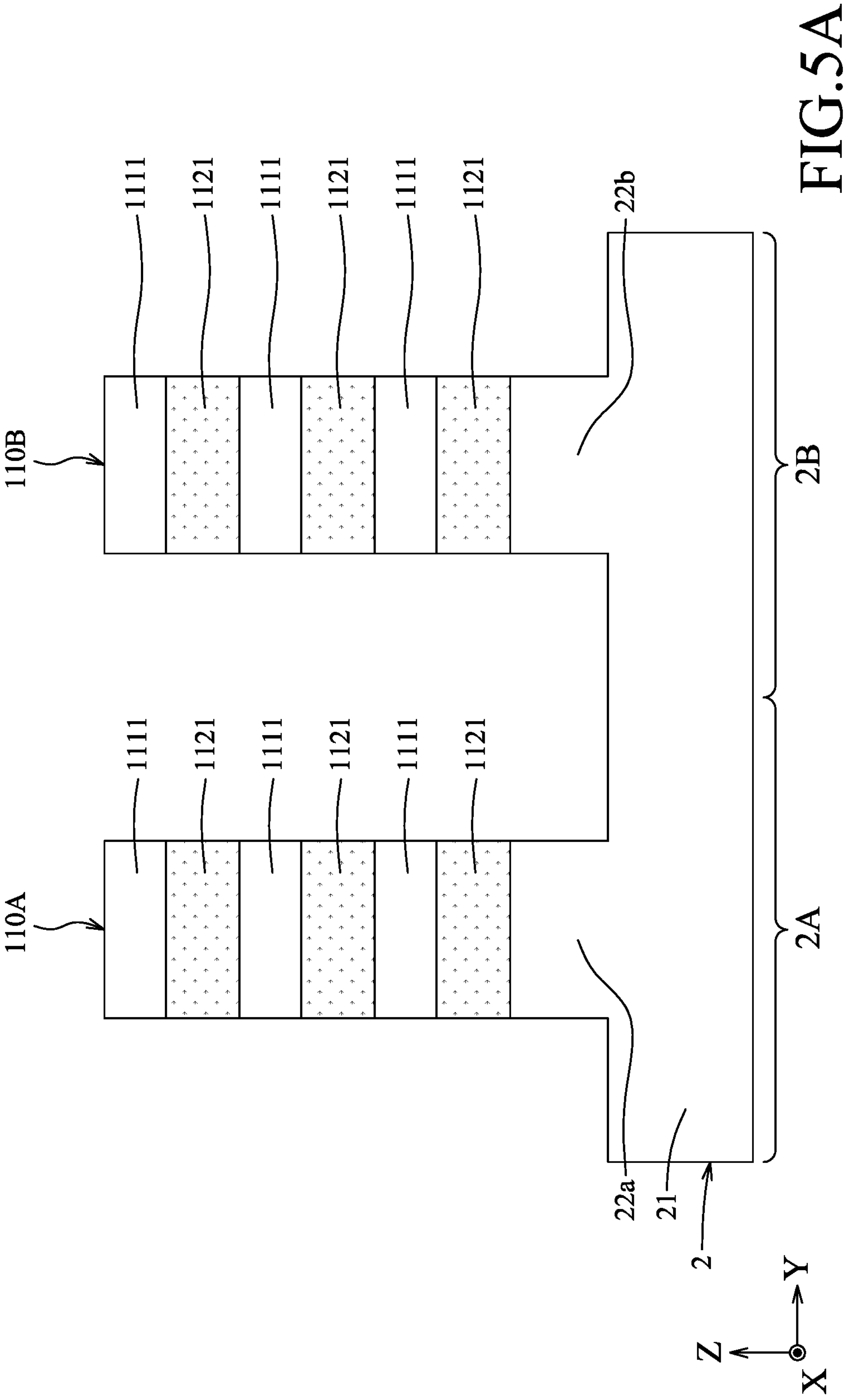
Figure 5C:
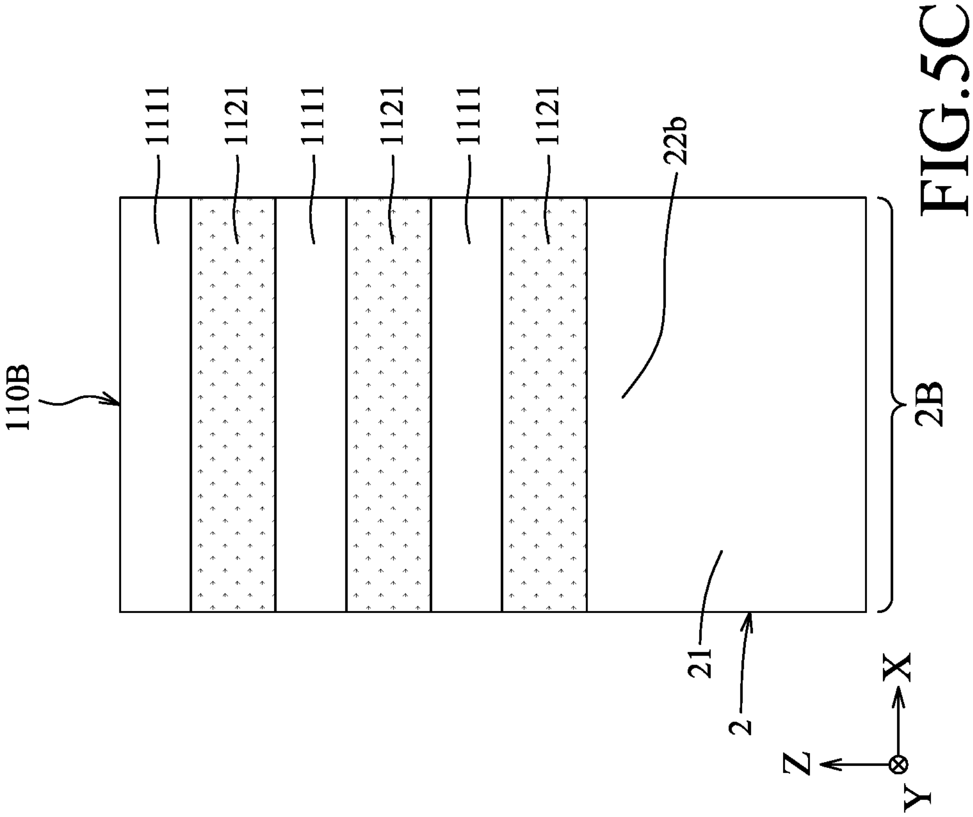
Figure 5B:
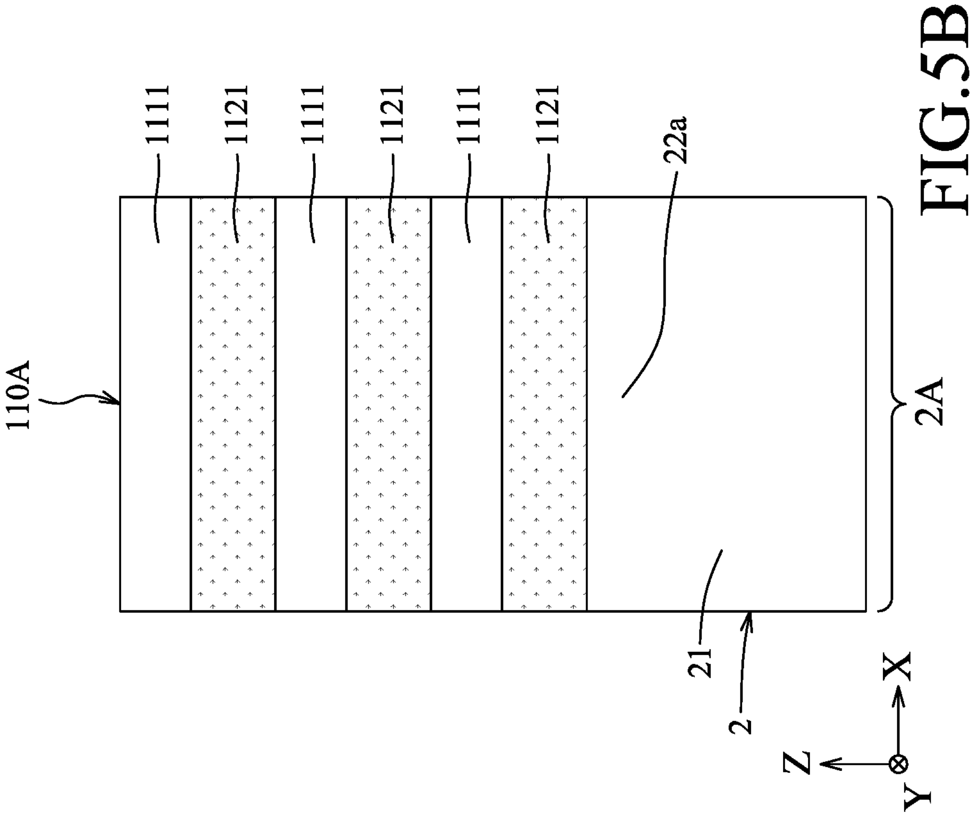

Referring to FIGS. 5A to 5C which are views respectively subsequent to FIGS. 4A to 4C, the stack 110 and the starting substrate 200 (see FIGS. 4A to 4C) are patterned. The stack 110 is patterned into a first fin portion 110A at the n-region 2A and a second fin portion 110B at the p-region 2B, and the starting substrate 200 is patterned into the substrate 2 by suitable processes including lithography and etching steps. Each of the first and second fin portions 110A, 110B includes three channel films 1111 that are obtained from the channel layers 111 and three sacrificial films 1121 that are obtained from the sacrificial layers 112.

Figure 6A:
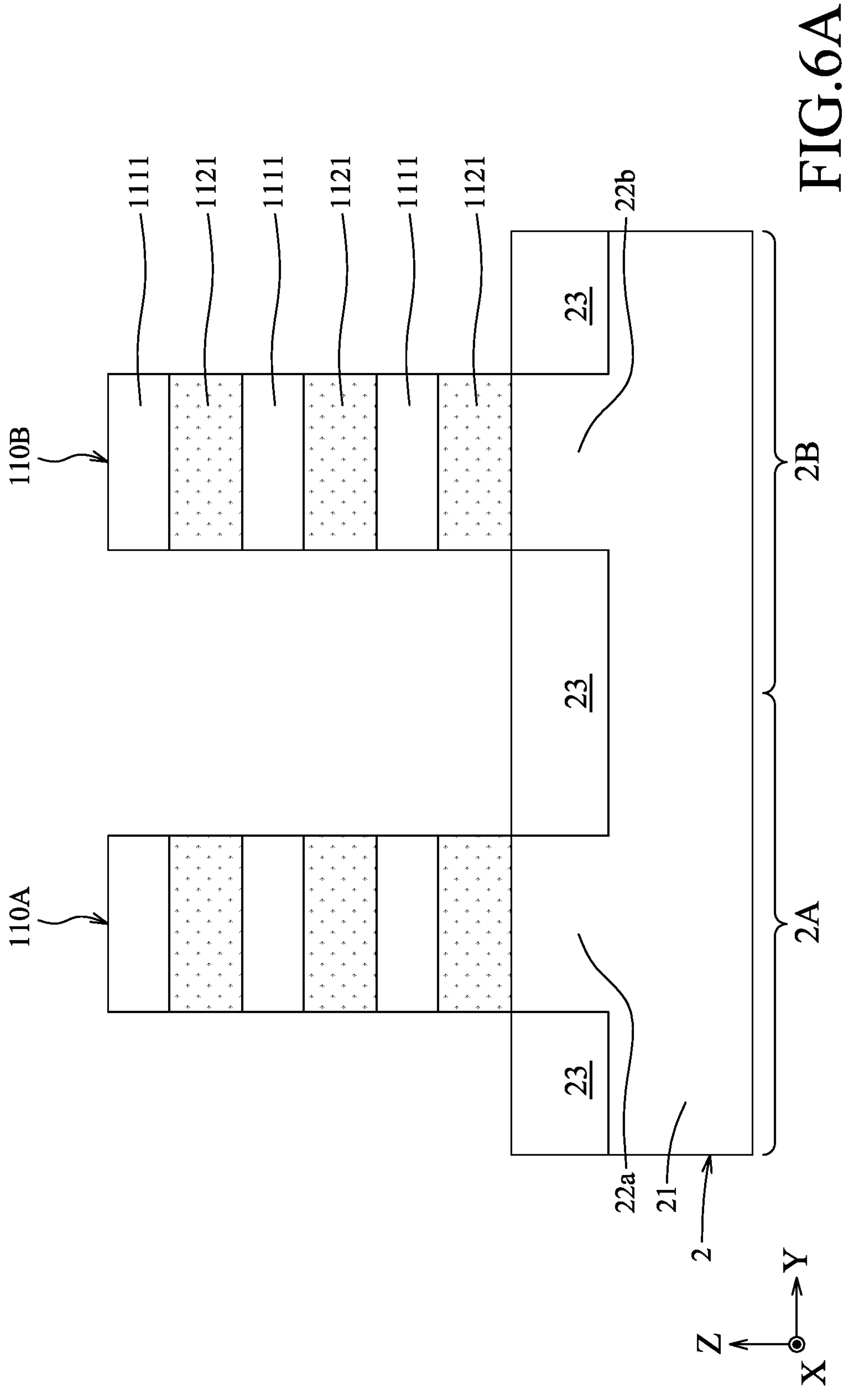
Figure 6C:
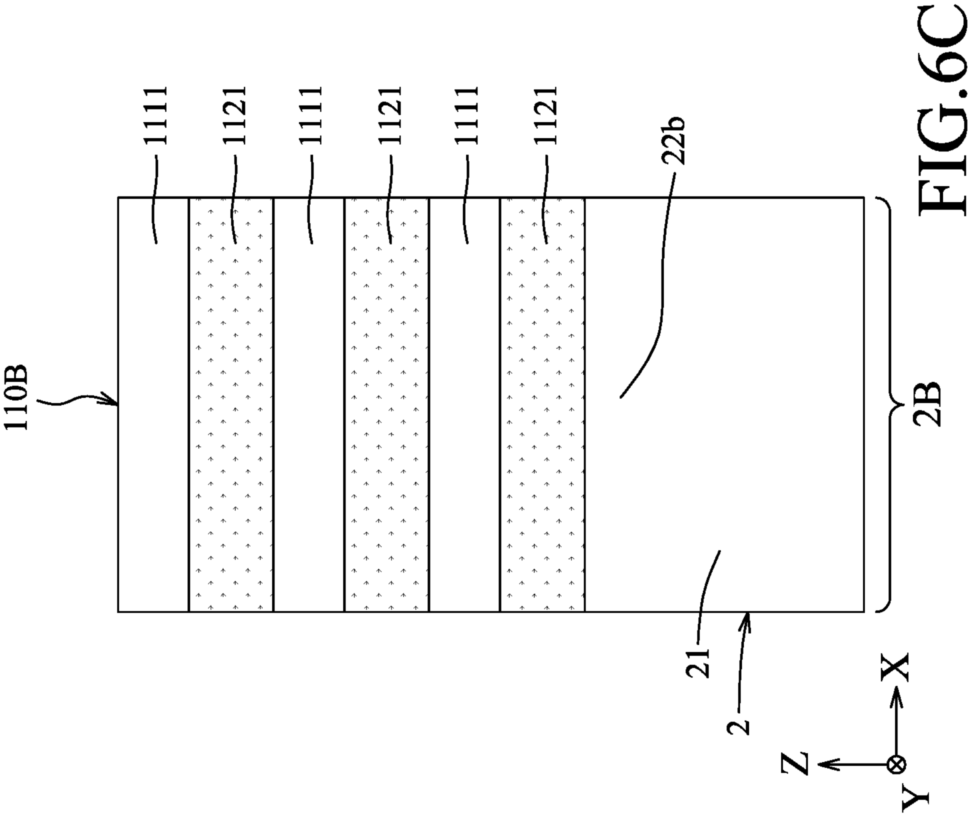
Figure 6B:
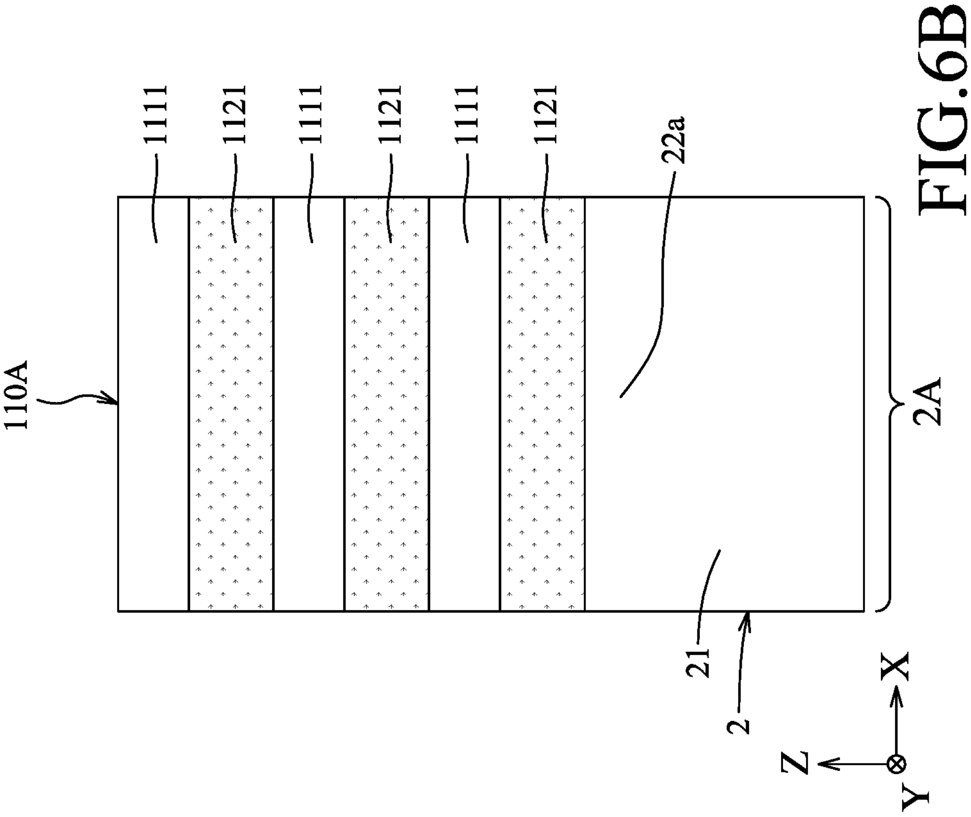

Referring to FIGS. 6A to 6C which are views respectively subsequent to FIGS. 5A to 5C, the isolation region 23 is formed around the protruding portions 22*a*, 22*b* using suitable processes including a deposition technique (for example, but not limited to, CVD or ALD) and an etching technique (for example, but not limited to, dry etching, wet etching, or a combination thereof). Since the configuration and material of the isolation region 23 have been described above with reference to FIG. 1A, and thus the details thereof are not repeated for the sake of brevity.

Figure 7A:
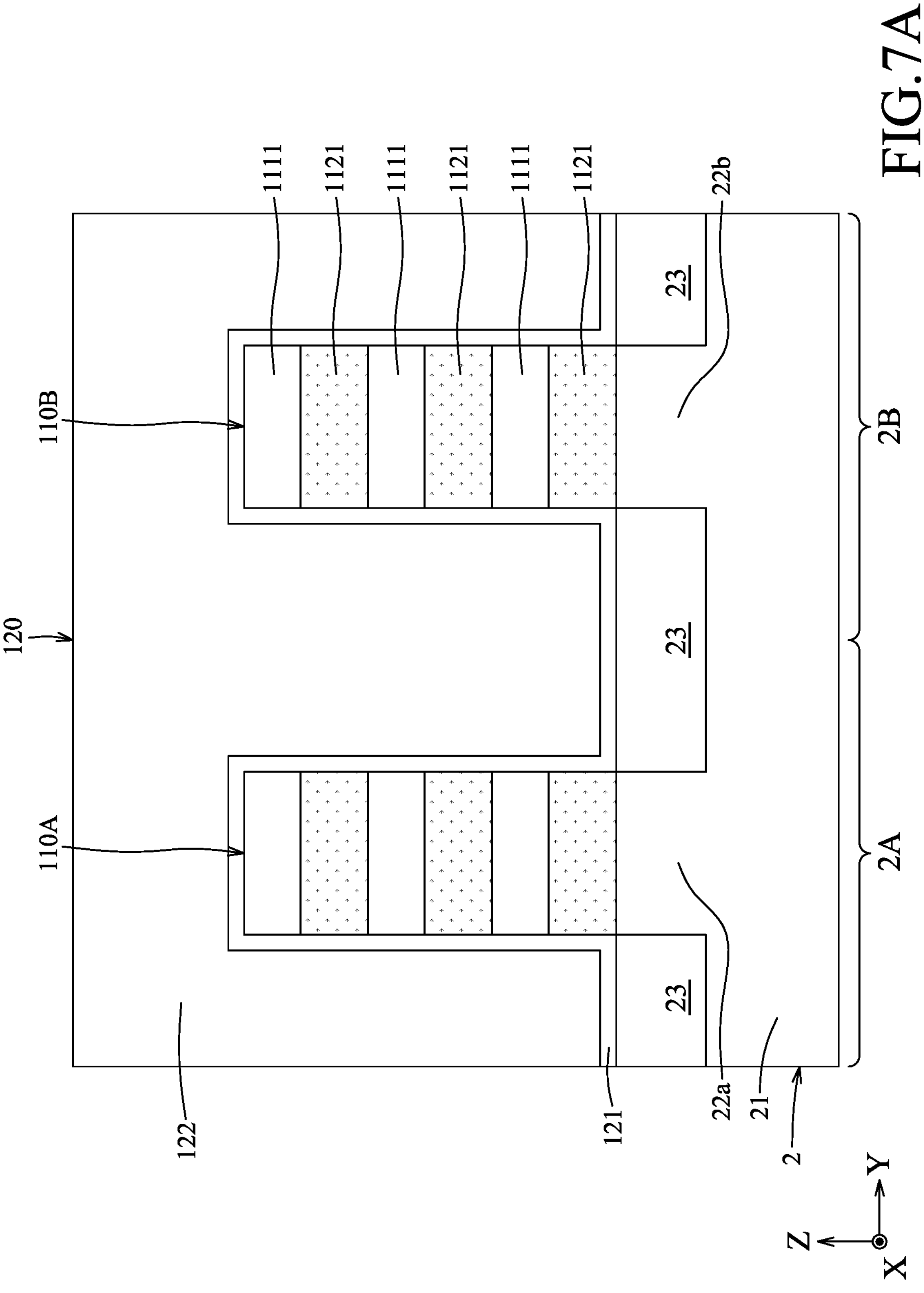
Figure 7C:
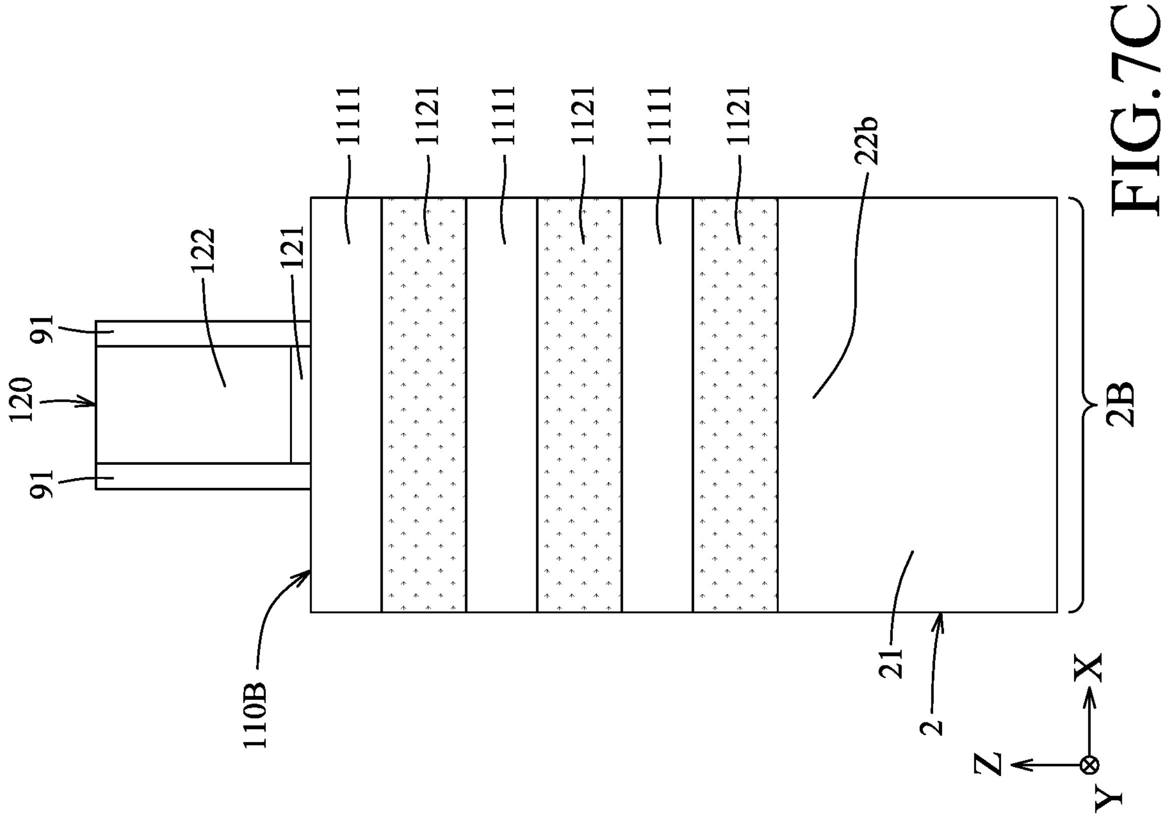
Figure 7B:
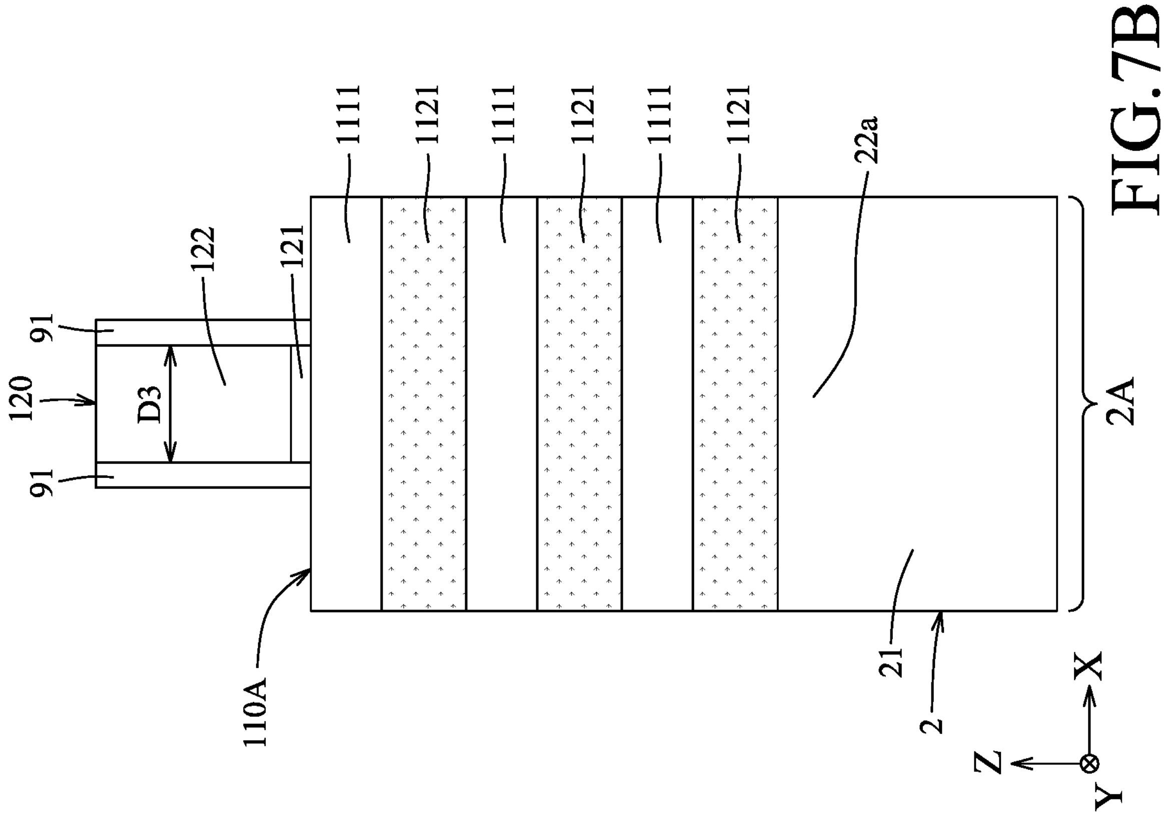

Referring to FIGS. 7A to 7C which are views respectively subsequent to FIGS. 6A to 6C, a dummy gate structure 120 is formed over the first and second fin portions 110A, 110B, and two gate spacers 91 are formed at two opposite sides of the dummy gate structure 120 in the X direction The dummy gate structure 120 includes a dummy dielectric portion 121 and a dummy gate portion 122 that is disposed on the dummy dielectric portion 121 and that is separated from the first and second fin portions 110A, 110B through the dummy dielectric portion 121. In some embodiments, the dummy dielectric portion 121 may include silicon oxide, silicon nitride, silicon oxynitride, high dielectric constant (k) materials, other suitable dielectric materials, or combinations thereof. In some embodiments, the dummy gate portion 122 may include polycrystalline silicon, single crystalline silicon, amorphous silicon, or combinations thereof. Other materials suitable for the dummy gate structure 120 are within the contemplated scope of the present disclosure. In some embodiments, the gate spacers 91 may be made of a dielectric material. The dielectric material for forming the gate spacers 91 may include a nitride-based material, such as silicon nitride, silicon oxynitride, silicon carbon nitride, silicon oxycarbonnitride, but is not limited thereto. Other materials suitable for forming the gate spacers 91 are within the contemplated scope of the present disclosure. The dummy gate structure 120 and the gate spacers 91 may be formed using suitable processes including a deposition technique (for example, but not limited to, CVD or ALD) and an etching technique (for example, but not limited to, dry etching, wet etching, or a combination thereof). In some embodiments, the gate spacers 91 are formed after the dummy gate structure 120 is formed. In some embodiments, the two gate spacers 91 are spaced apart from each other in a distance (D3) ranging from about 8 nm to about 15 nm in the X direction.

Figure 8A:
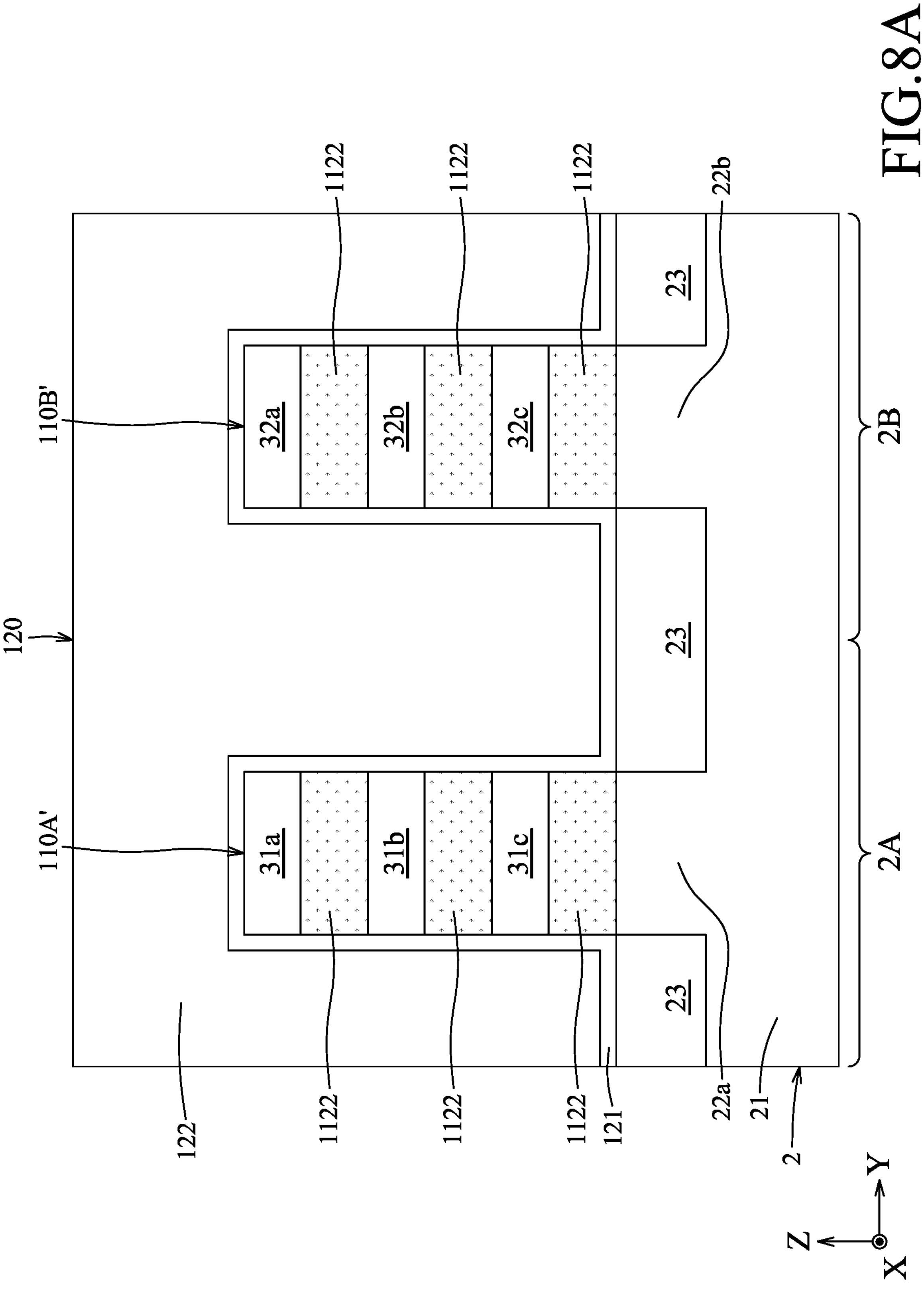
Figure 8C:
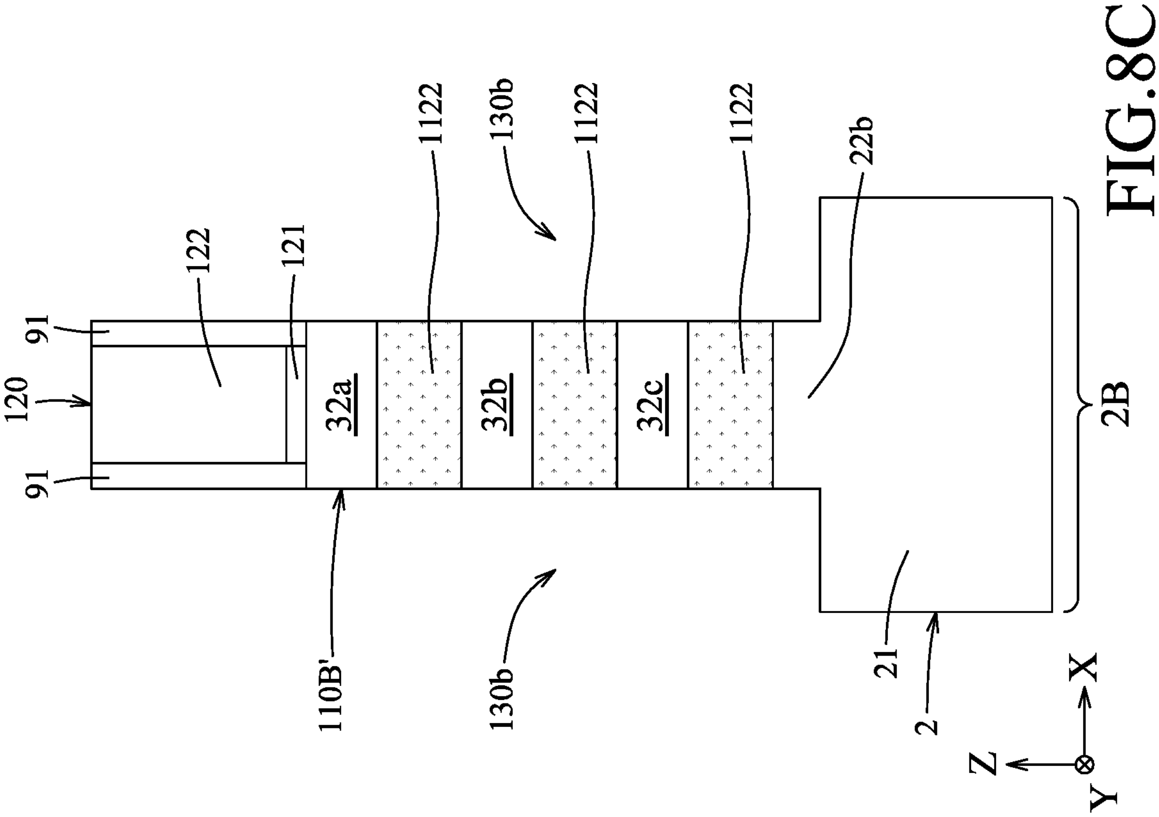
Figure 8B:
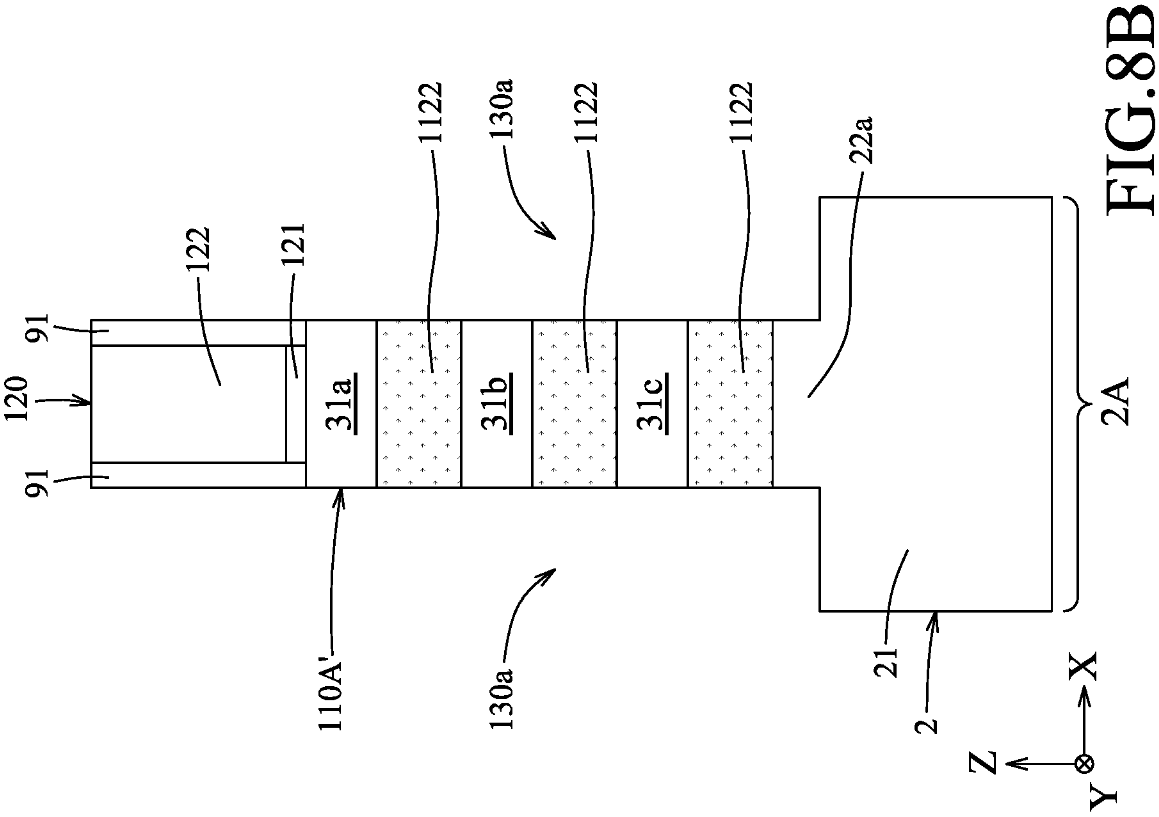

Referring to FIGS. 8A to 8C which are views respectively subsequent to FIGS. 7A to 7C, the first and second fin portions 110A, 110B (see FIGS. 7B and 7C) are patterned to form two pairs of recesses 130*a*, 130*b* using an etching process through the dummy gate structure 120 as a hard mask. The patterned first and second portions are thus respectively denoted by the numeral 110A' and 110B'. In the patterned first fin portion 110A, the patterned channel films serve as the channel parts 31*a*, 31*b*, 31*c*, and the patterned sacrificial films are denoted by the numeral 1122. In the patterned second fin portion 110B', the patterned channel films serve as the channel parts 32*a*, 32*b*, 32*c*, and the patterned sacrificial films are denoted by the numeral 1122. In some embodiments, the recesses 130*a*, 130*b* further extend into the first and second protruding portions 22*a*, 22*b*.

Figure 9A:
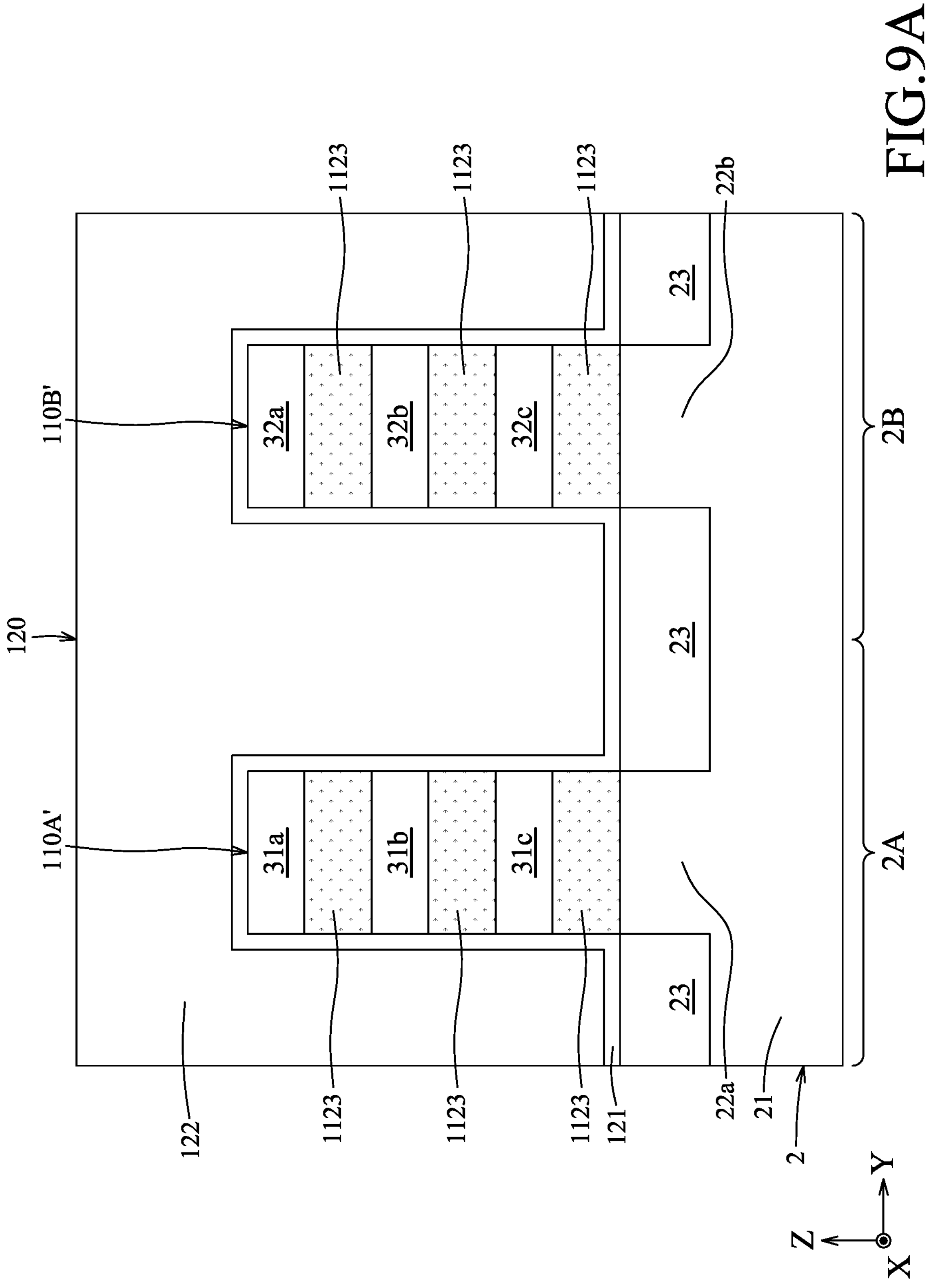
Figure 9C:
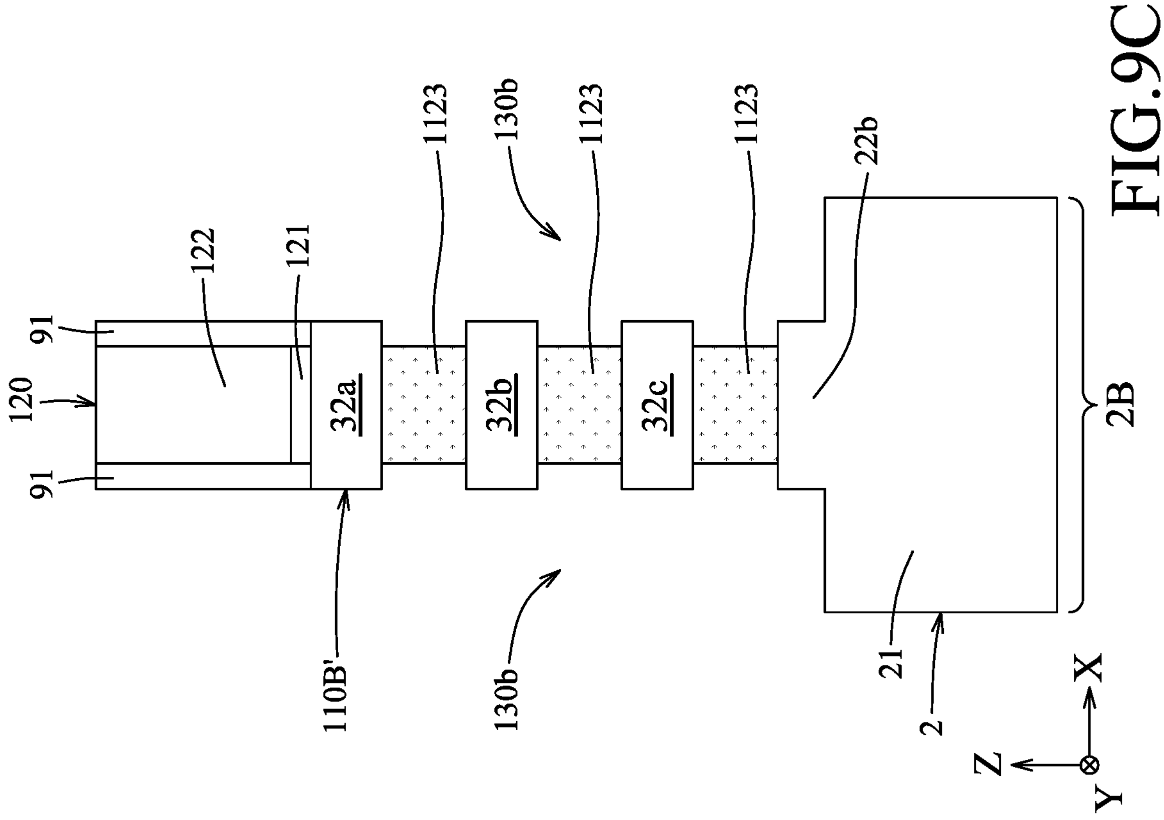
Figure 9B:
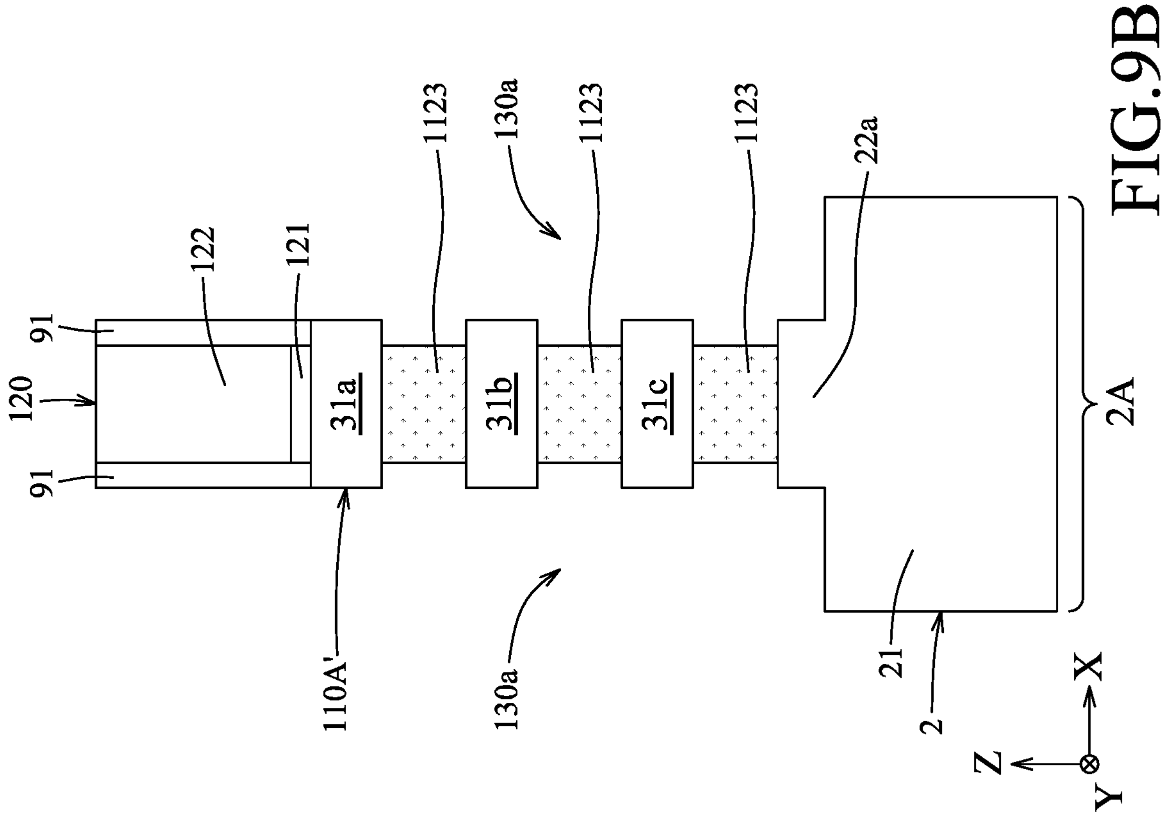

Referring to FIGS. 9A to 9C which are views respectively subsequent to FIGS. 8A to 8C, in each of the first and second fin portions 110A', 110B', the sacrificial films 1122 (see FIGS. 8B and 8C) are laterally trimmed using an etching process. The trimmed sacrificial films are denoted by the numeral 1123.

Figure 10A:
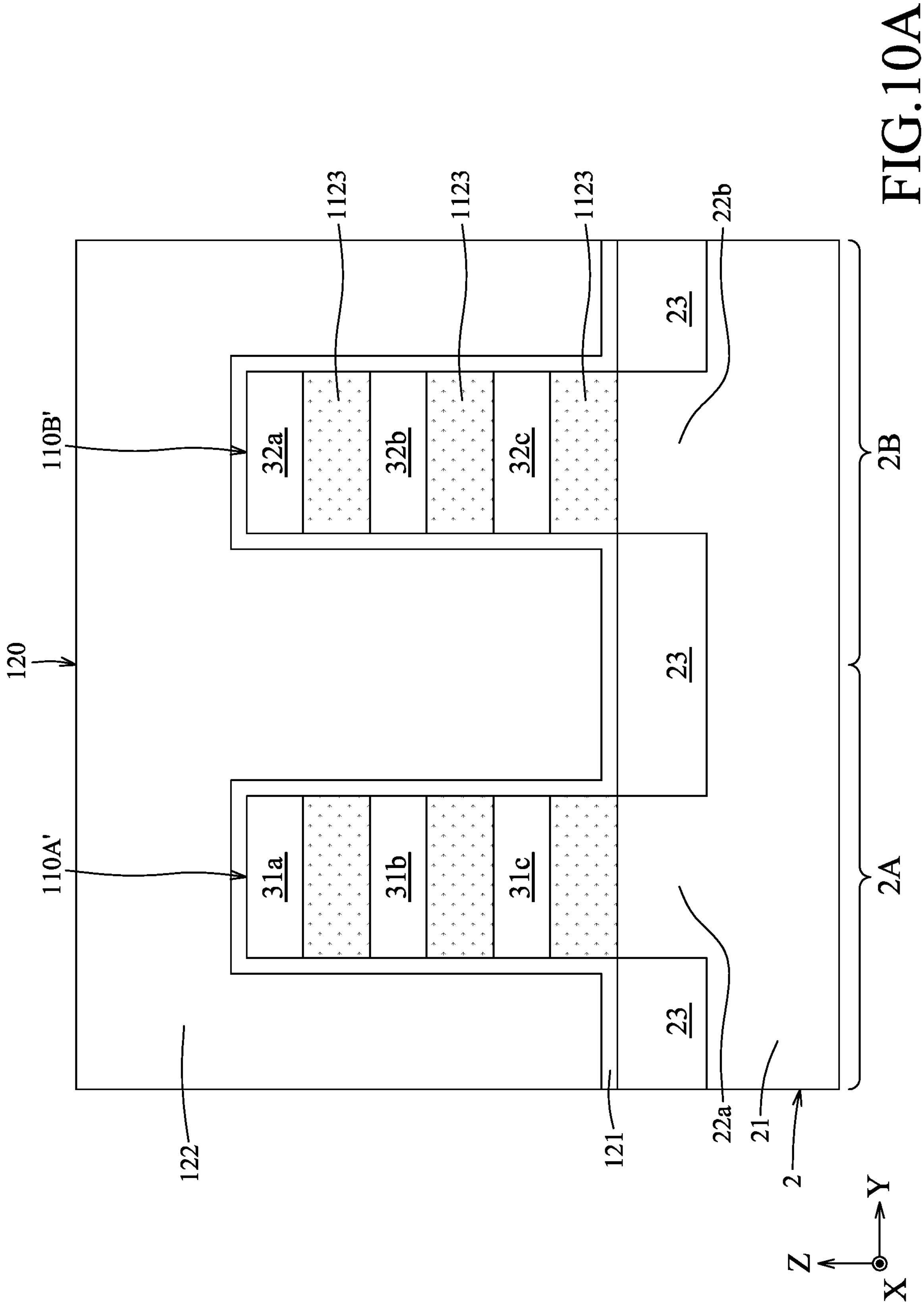
Figure 10C:
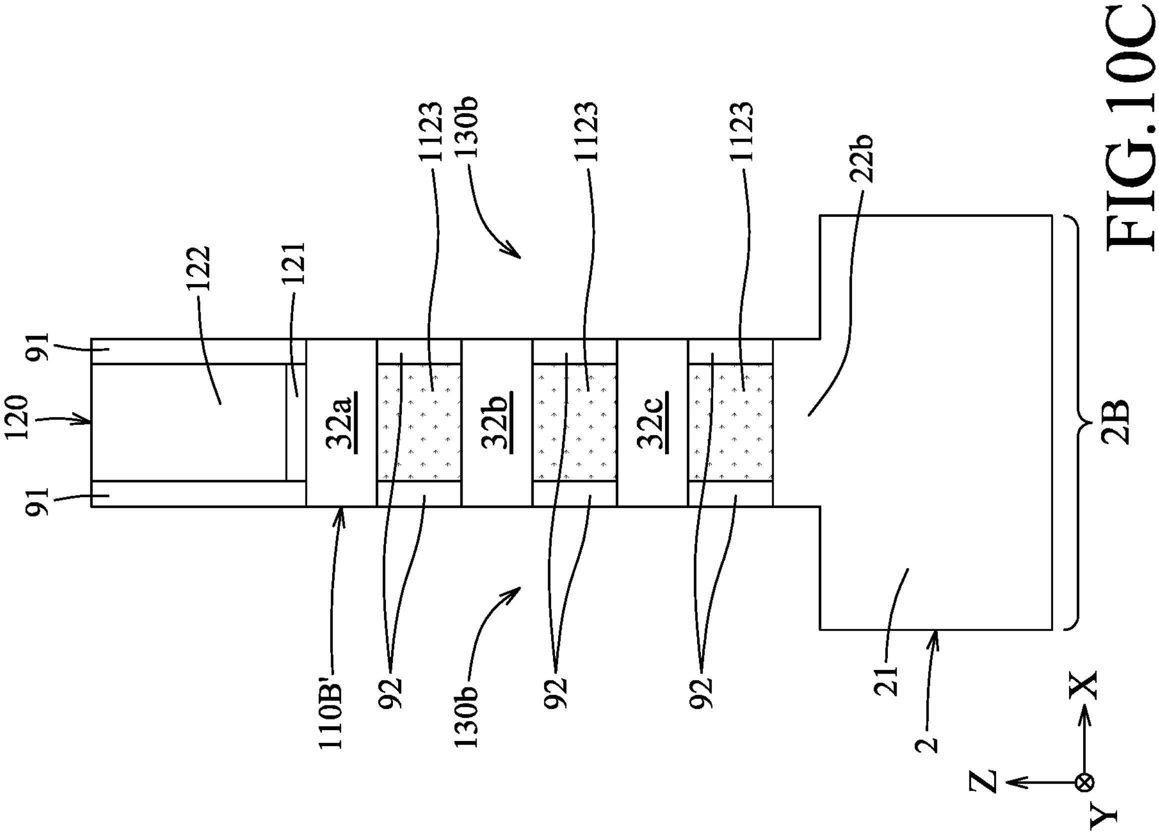
Figure 10B:
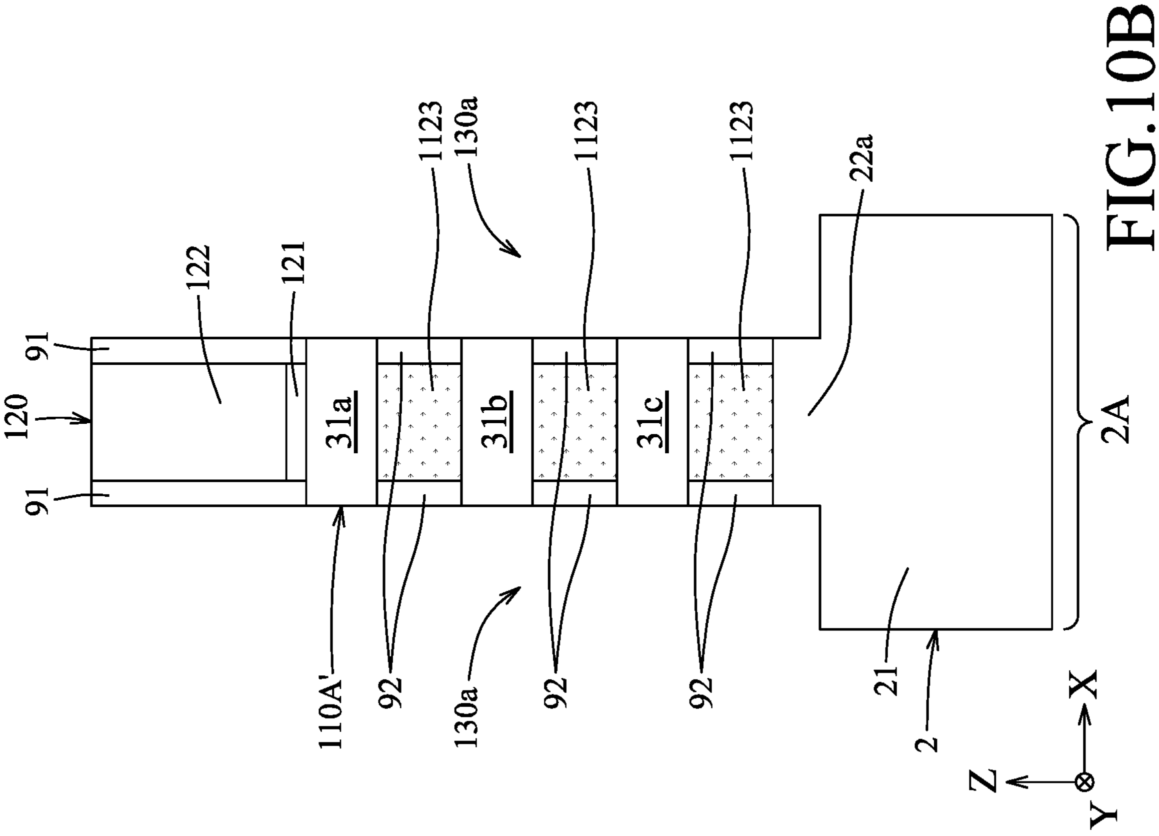

Referring to FIGS. 10A to 10C, which are views respectively subsequent to FIGS. 9A to 9C, multiple pairs of inner spacers 92 are formed. Each pair of the inner spacers 92 are formed at two opposite sides of a corresponding one of the trimmed sacrificial films 1123 in the X direction. In some embodiments, the inner spacers 92 may include a low-k dielectric material, such as silicon oxide, silicon nitride, silicon oxynitride, silicon carbonitride, silicon oxycarbide, silicon oxycarbonitride, silicon carbide, and so on. Other low-k dielectric materials suitable for the inner spacers 92 are within the contemplated scope of the present disclosure.

Figure 11A:
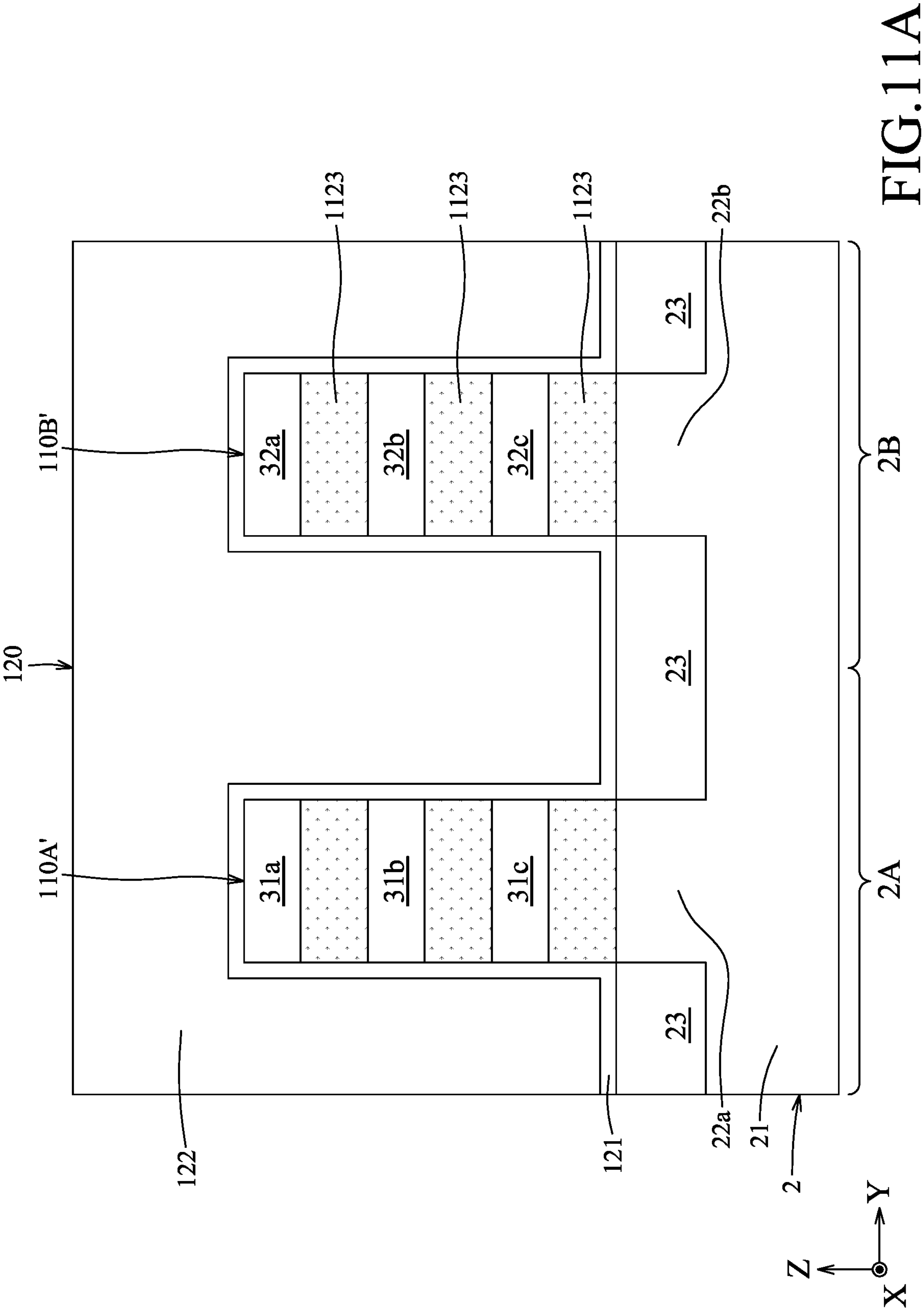
Figure 11C:
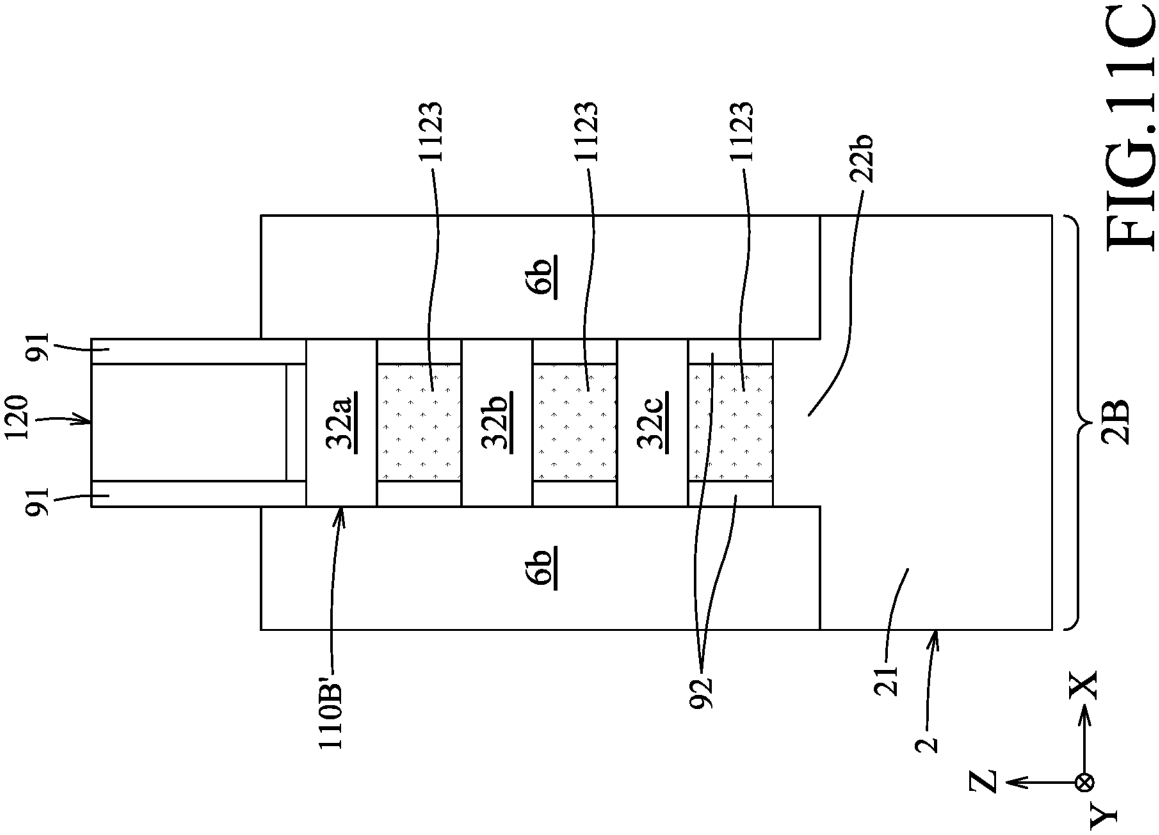
Figure 11B:
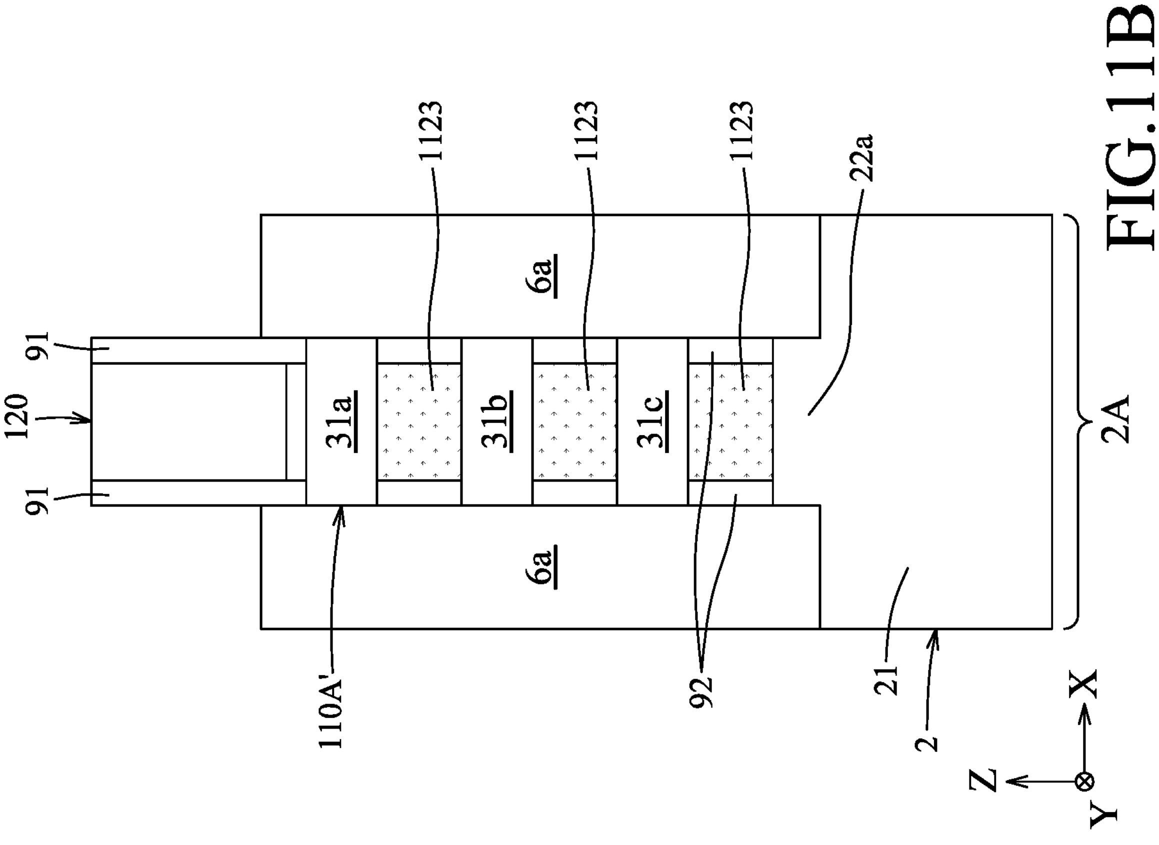

Referring to FIGS. 11A to 11C, which are views respectively subsequent to FIGS. 10A to 10C, the first source/drain portions 6*a* are respectively formed in the recesses 130*a* (see FIG. 10B), and the second source/drain portions 6*b* are respectively formed in the recesses 130*b* (see FIG. 10B) using an epitaxial growth process including molecular-beam epitaxy (MBE), an epitaxial deposition/partial etch process, such as a cyclic deposition-etch (CDE) process and/or a selective epitaxial growth (SEG) process, but the disclosure is not limited to such. The first source/drain portions 6*a* may be formed before or after the second source/drain portions 6*b* are formed.

Figure 12A:
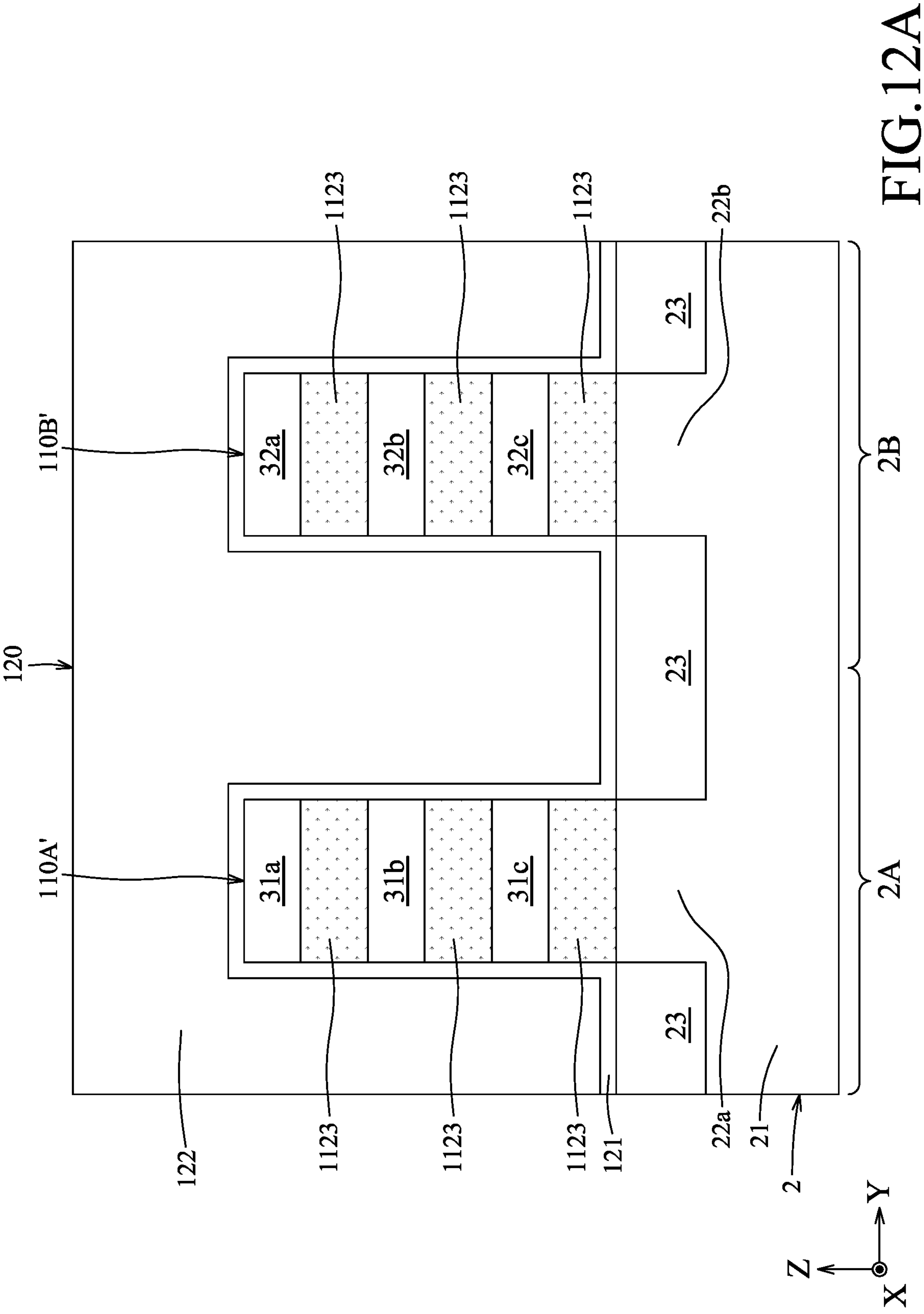
Figure 12C:
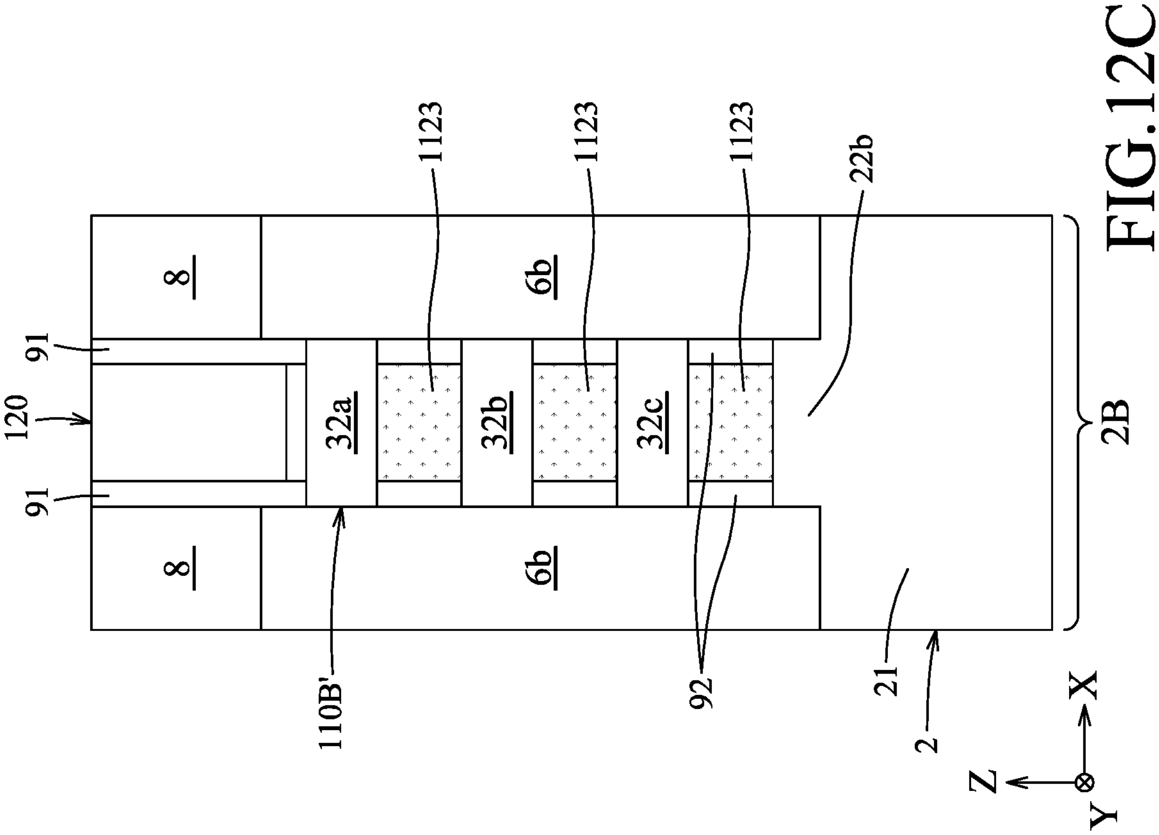
Figure 12B:
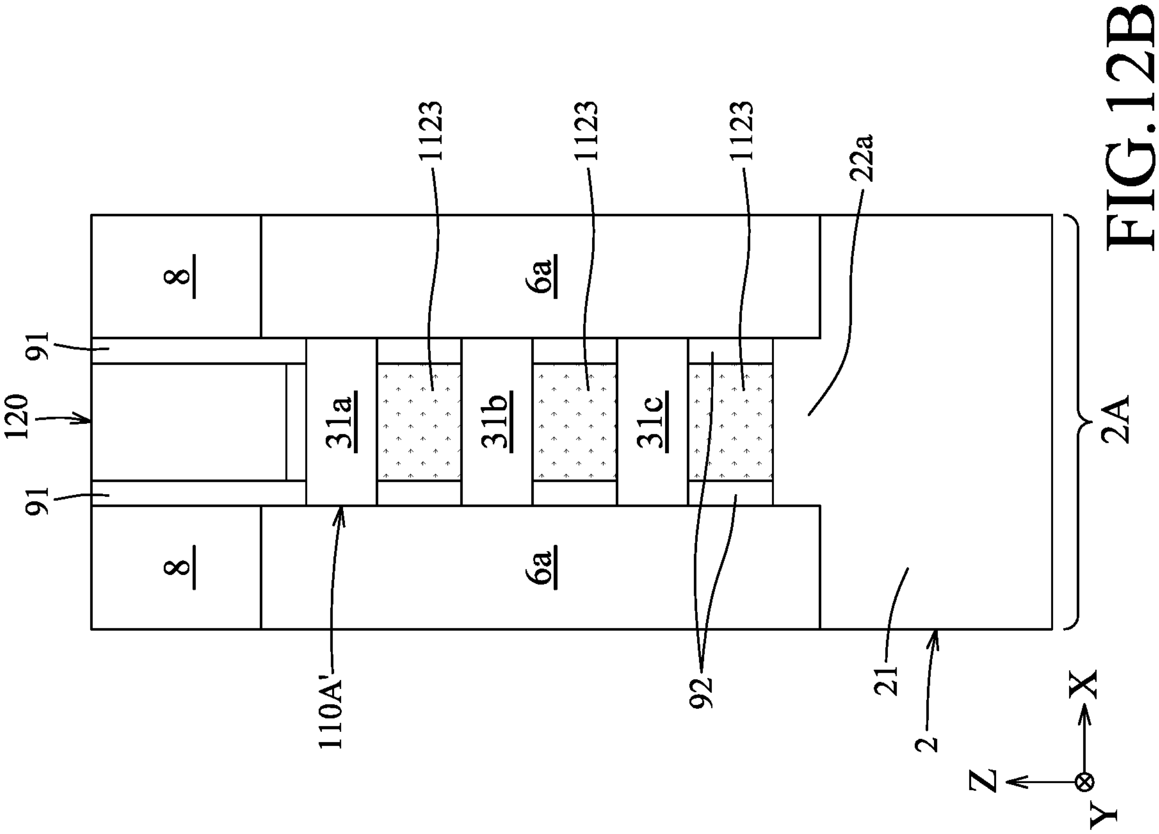

Referring to FIGS. 12A to 12C, which are views respectively subsequent to FIGS. 11A to 11C, the inter-layer dielectric portion 8 is formed to cover the first source/drain portions 6*a* and the second source/drain portions 6*b* using a deposition process followed by a planarization process to expose the dummy gate structure 120. In some embodiments, the inter-layer dielectric portion 8 may include dielectric material(s) and may be formed as a single-layer structure, a bi-layered structure or a multi-layered structure. In some embodiments, the inter-layer dielectric portion 8 may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), spin-on-glass (SOG), or combinations thereof. Other dielectric materials suitable for the inter-layer dielectric portion 8 are within the contemplated scope of the present disclosure.

Figure 13A:
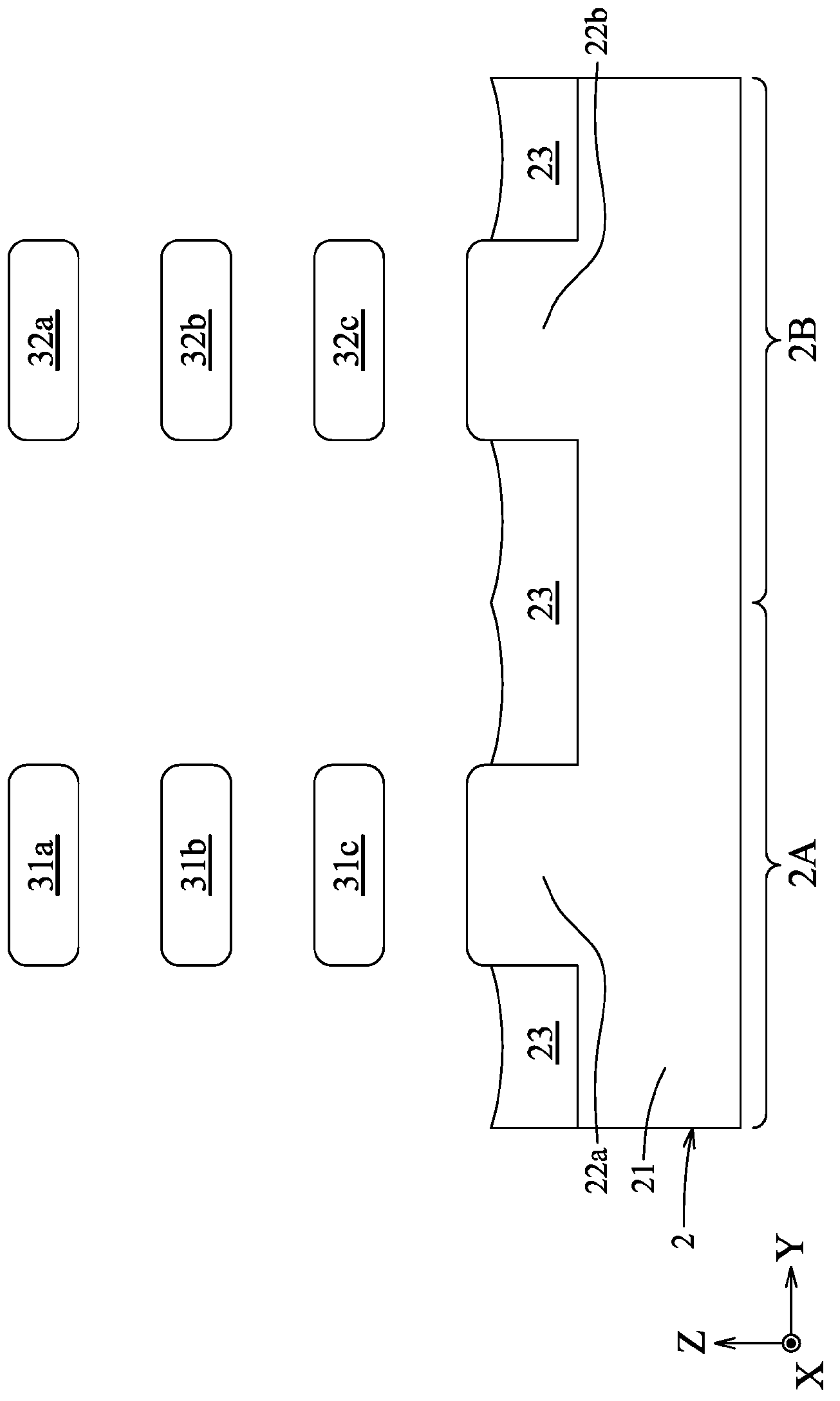
Figure 13B:
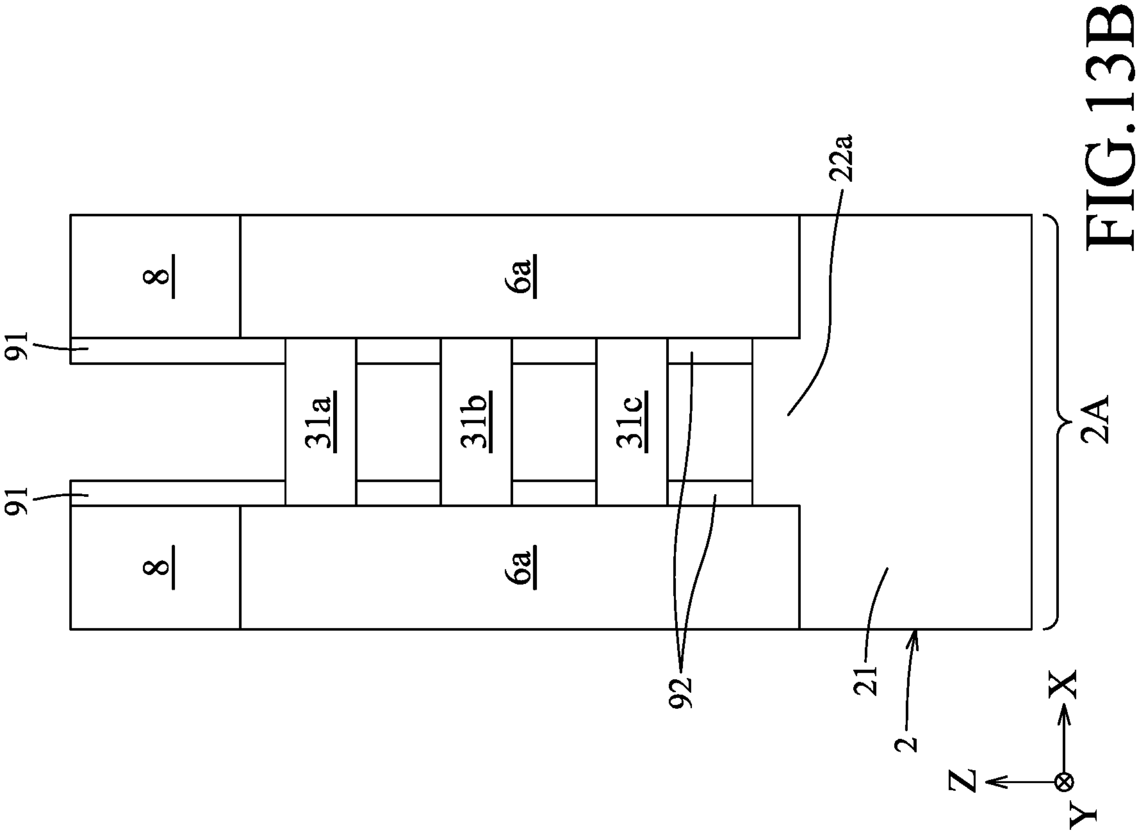
Figure 13C:
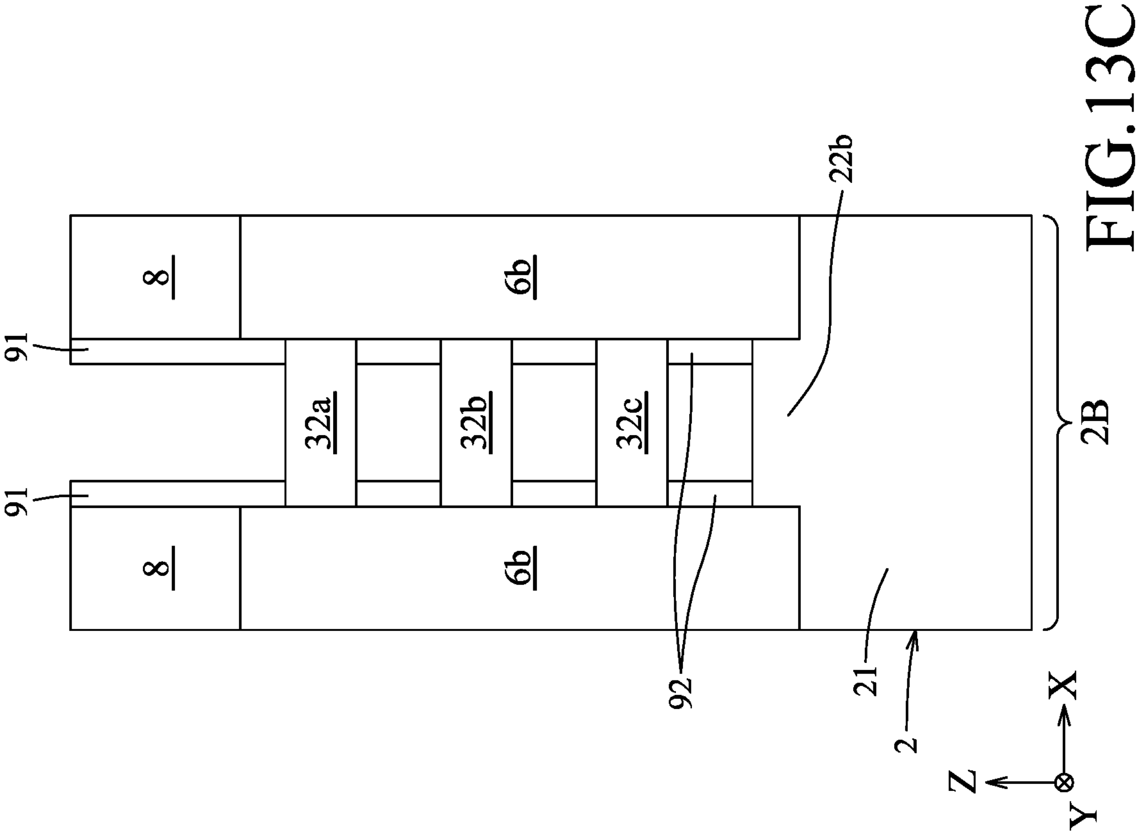

Referring to FIGS. 13A to 13C, which are views respectively subsequent to FIGS. 12A to 12C, the dummy gate structure 120 (see FIGS. 12A to 12C) and the sacrificial films 1123 are sequentially removed using a selective etching process (e.g., a wet etching process) without damaging the channel parts 31*a*. 31*b*, 31*c*, 32*a*, 32*b*, 32*c*.

Referring to FIGS. 14A to 14C, which are views respectively subsequent to FIGS. 15A to 15C, the interfacial layers 7 are respectively formed on the channel parts 31*a*. 31*b*, 31*c*, 32*a*, 32*b*, 32*c* and the protruding portions 22*a*, 22*b*. In some embodiments, the interfacial layers 7 are provided for improving the film quality of the gate dielectrics 41, 42 that will be subsequently formed on the channel parts 31*a*, 31*b*, 31*c*, 32*a*, 32*b*, 32*c* and the protruding portions 22*a*, 22*b*. In some embodiments, the interfacial layers 7 may be formed by a wet chemical oxidation. In this case, surface portions of the channel parts 31*a*, 31*b*, 31*c*, 32*a*, 32*b*, 32*c* and the protruding portions 22*a*, 22*b* are oxidized to form the interfacial layers 7. In some embodiments not shown herein, portions of the channel parts 31*a*, 31*b*, 31*c*, 32*a*, 32*b*, 32*c* and the protruding portions 22*a*, 22*b* that are covered by corresponding ones of the inner spacers 92 (see FIGS. 14B and 14C) may be also oxidized along with the surface portions during the wet chemical oxidation for forming the interfacial layers 7. In some embodiments, each of the interfacial layers 7 has a thickness ranging from about 0.5 nm to about 1.5 nm.

Referring to FIGS. 15A to 15C, which are views respectively subsequent to FIGS. 14A to 14C, the gate dielectrics 41, 42 are conformally formed on the structure shown in FIGS. 14A to 14C using CVD, ALD, or other suitable deposition techniques, thereby obtaining the patterned structure 100. It is noted that, as shown in FIGS. 15B and 15C, each of the gate dielectrics 41, 42 further includes two vertical dielectric regions 43*a* (or 43*b*) spaced apart from each other in the X direction. Each of the vertical dielectric regions 43*a* (or 43*b*) includes first parts 431*a* (or 431*b*) disposed to cover corresponding ones of the inner spacers 92, and a second part 432*a* (or 432*b*) disposed to cover a corresponding one of the gate spacers 91. Each of the vertical dielectric regions 43*a* (or 43*b*) interconnects the lower dielectric region 411 (or 421) and the upper dielectric parts 412*a*, 412*b*, 412*c* (or 422*a*, 422*b*, 422*c*). In some embodiments, for each of the gate dielectrics 41, 42, the second parts 432*a* (or 432*b*) of the two vertical dielectric regions 43*a* (or 43*b*) are spaced apart from each other by a distance (D4) ranging from about 6 nm to about 13 nm.

Figure 17A:
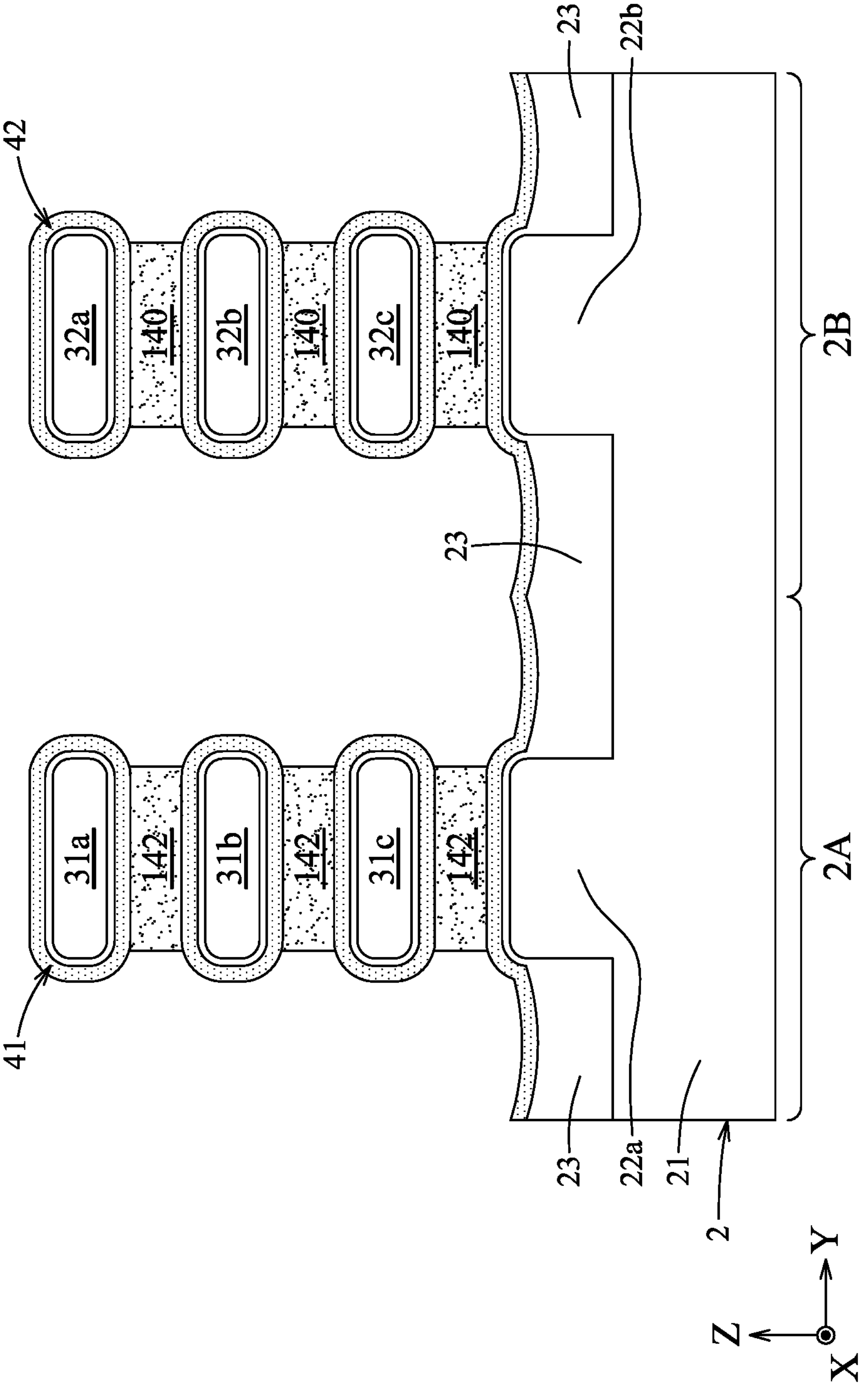
Figure 17C:
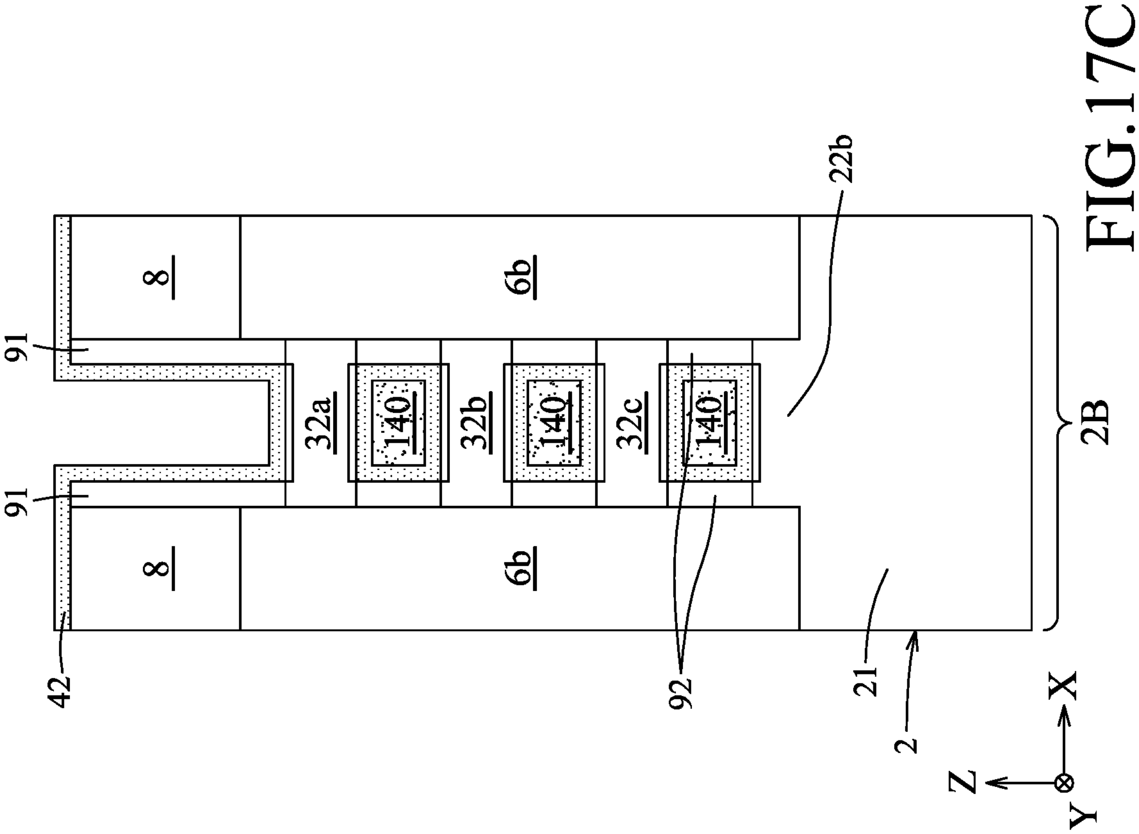
Figure 17B:
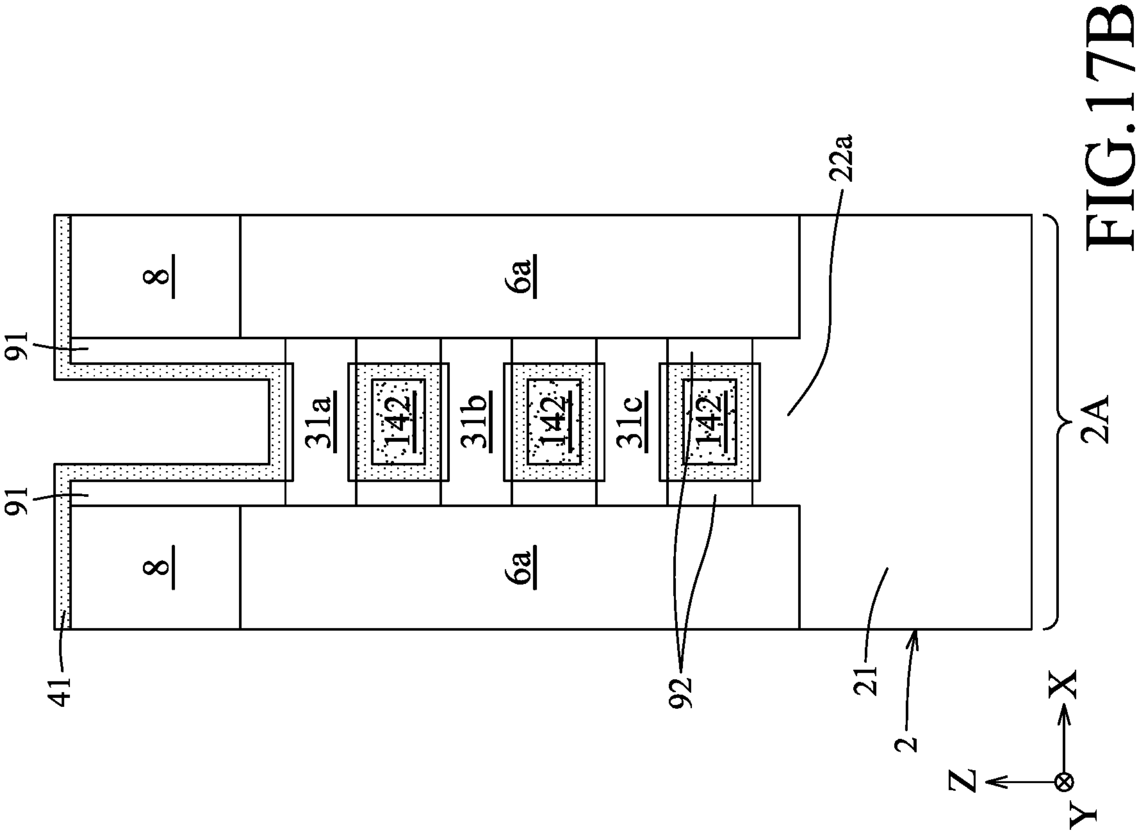
Figure 18A:
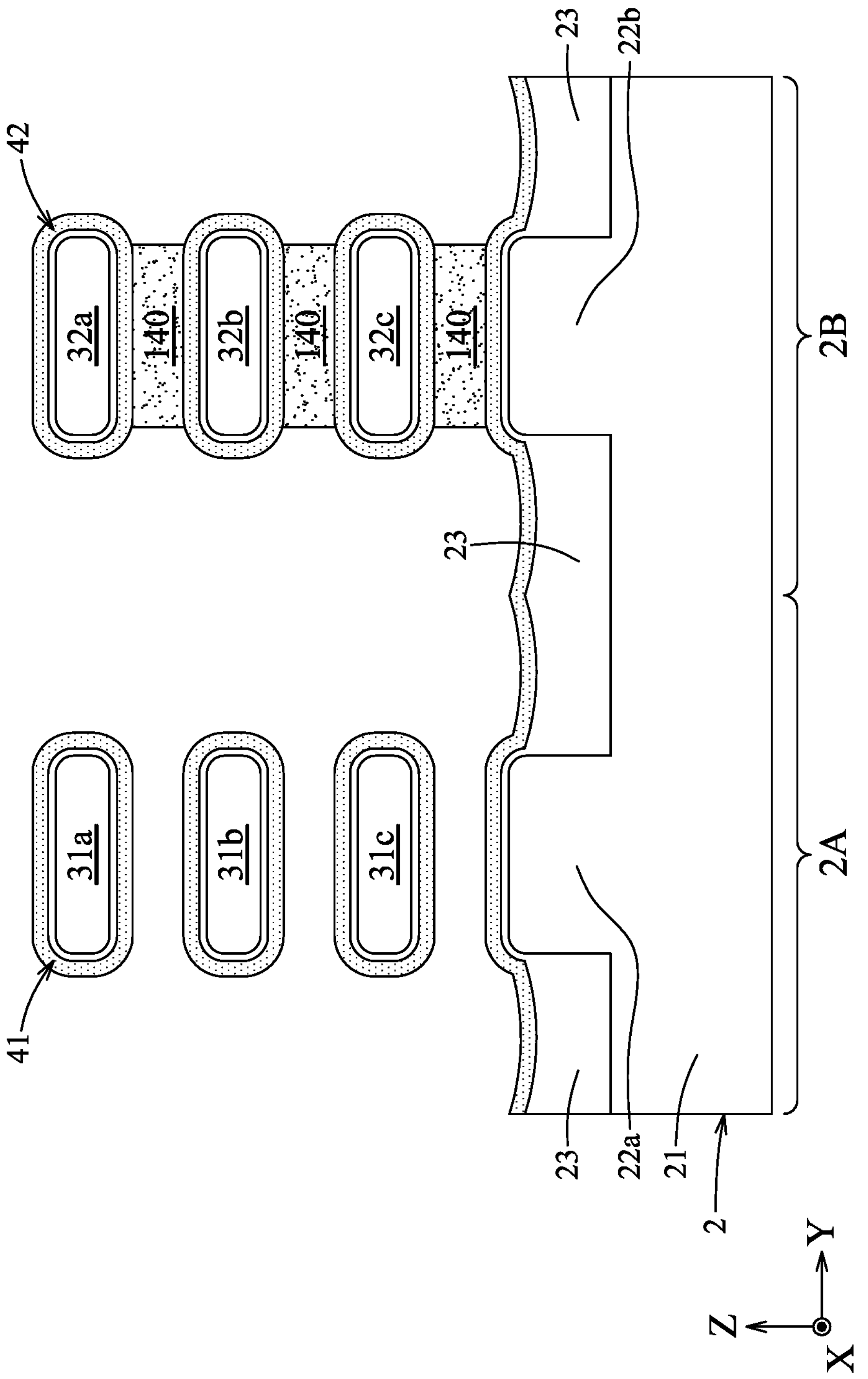
Figure 18C:
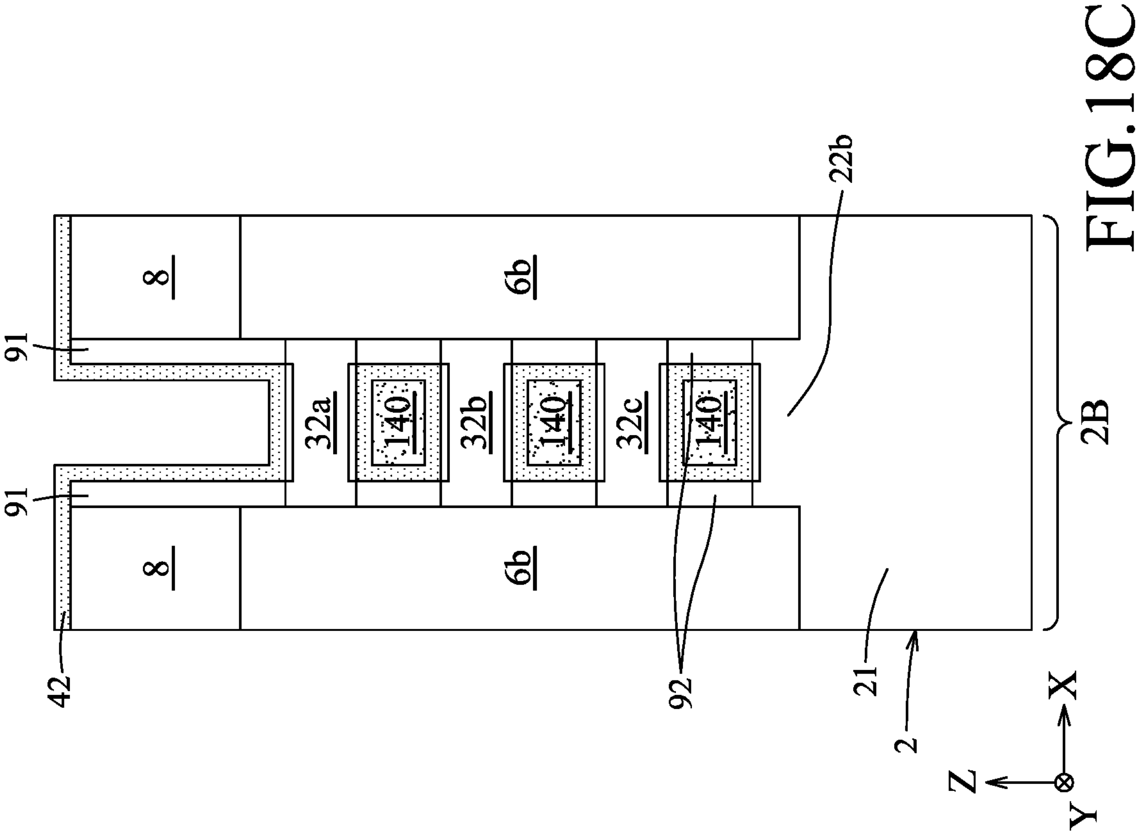
Figure 18B:
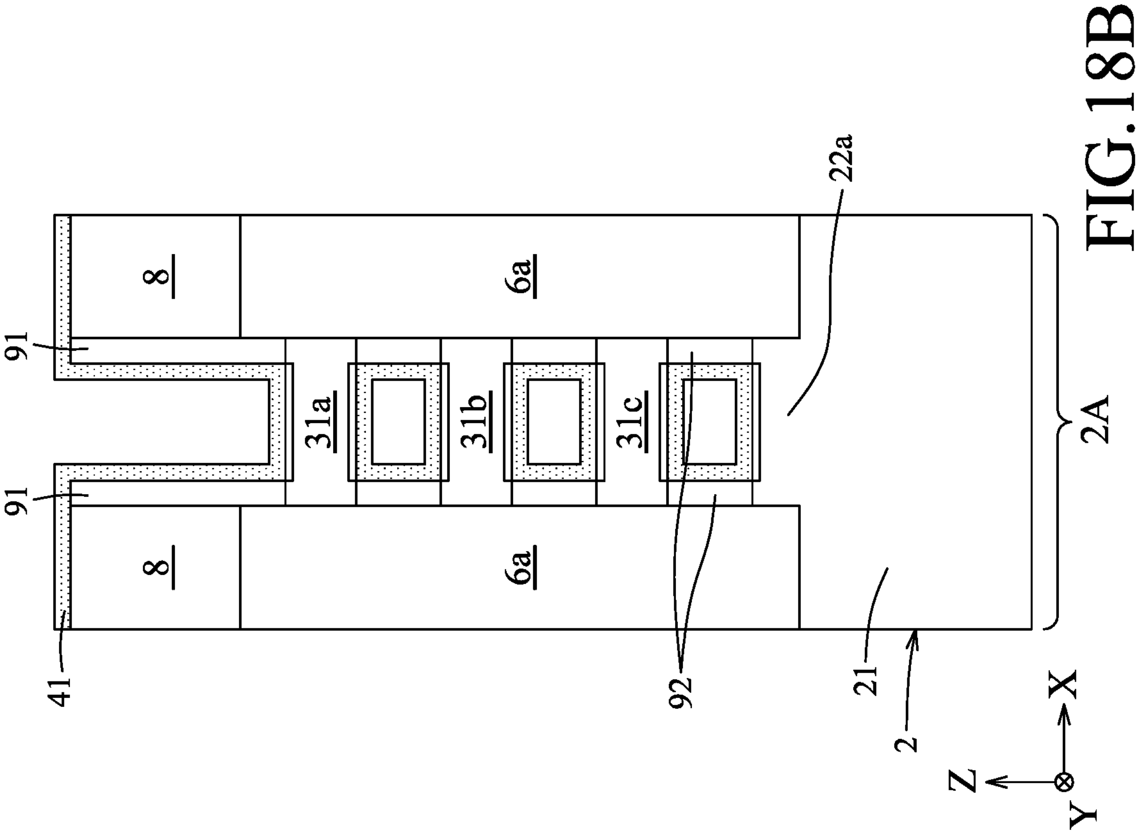

Referring to FIG. 3 and the examples illustrated in FIG. 18A to 18C, the method 10 proceeds to step S12, where a plurality of blocking portions 140 are formed at the p-region 2B. FIGS. 18A to 18C are views respectively similar to FIGS. 15A to 15C, but illustrating the structure after step S12. In some embodiments, formation of the blocking portions 140 may include multiple sub-steps, as shown in FIGS. 16A to 18C.

In some embodiments, the blocking portions 140 will serve as a hard mask in subsequent steps. As shown in FIGS. 15A to 15C, a plurality of spaces 151*a*, 152*a*, 151*b*, 152*b* are present in the patterned structure 100. The space 151*a* (or 151*b*) is located between the lower dielectric region 411 (or 421) and the bottommost upper dielectric part 412*c* (or 422*c*). Each of the spaces 152*a* (or 152*b*) is located between two adjacent ones of the upper dielectric parts 412*a*, 412*b*, 412*c* (or 422*a*, 422*b*, 422*c*). In some embodiments, each of the spaces 151*a*, 152*a*, 151*b*, 152*b* has a dimension (D5, see FIG. 15A) ranging from about 2.5 nm to about 12 nm. In some embodiments, the dimension (D5, see FIG. 15A) is smaller than the distance (D4, see FIG. 15B). The blocking portions 140 are respectively disposed in the spaces 151*b*, 152*b* at the p-region 2B. In some embodiments, the blocking portions 140 are made of a material different from that of the outer gate structure 53 in the first gate electrode 5*a*, such that the blocking portions 140 may be selectively removed whilst the outer gate structure 53 substantially remains intact in subsequent steps. In some embodiments, the blocking portions 140 include an oxide (such as silicon oxide, aluminum oxide, hafnium oxide, or zirconium oxide), a nitride (such as silicon nitride, aluminum nitride, or titanium nitride), or a combination thereof. Other materials suitable for the blocking portions 140 are within the contemplated scope of the present disclosure.

In some embodiments, formation of the blocking portions 140 may include multiple sub-steps as described in the following.

Figure 16A:
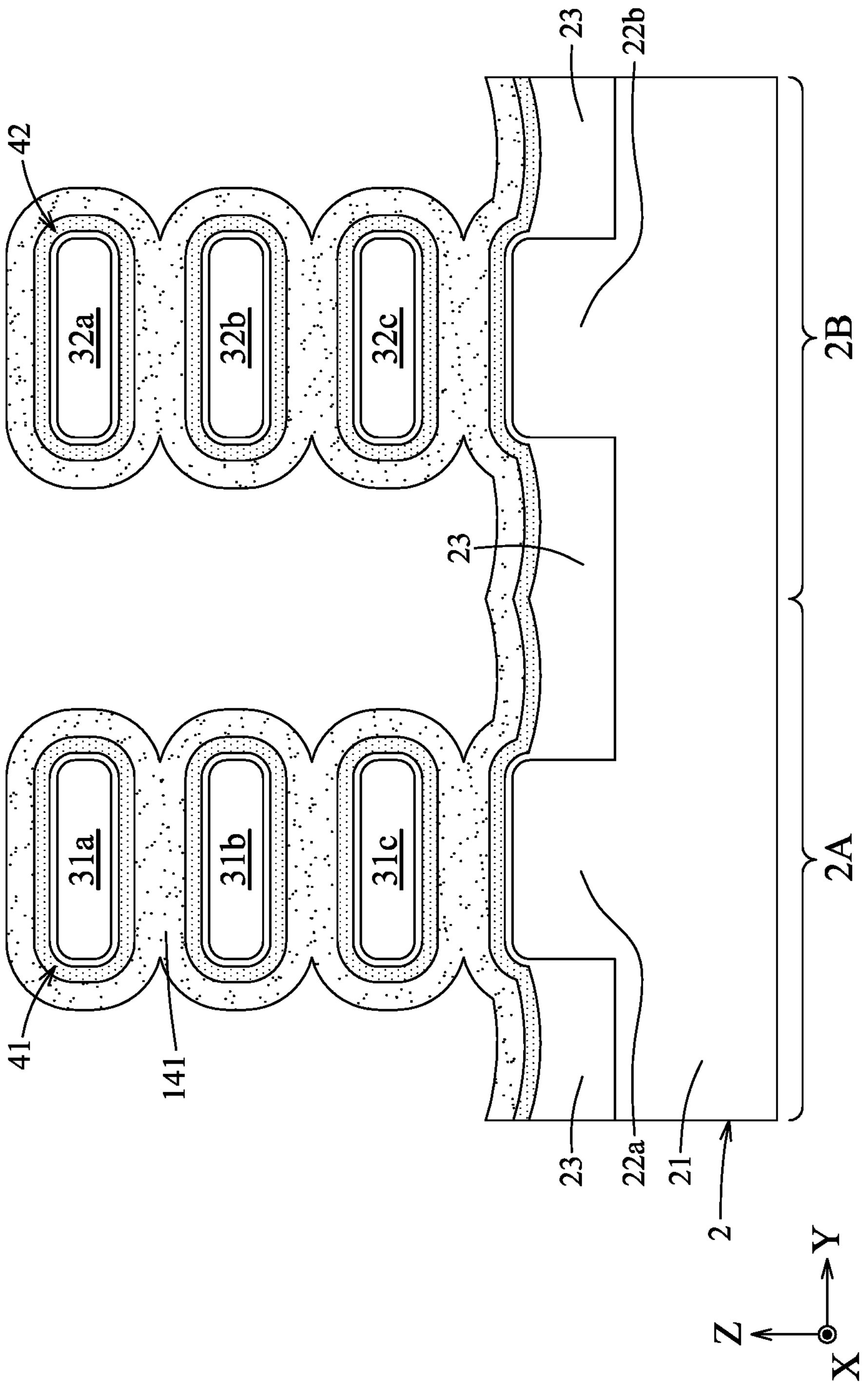
Figure 16C:
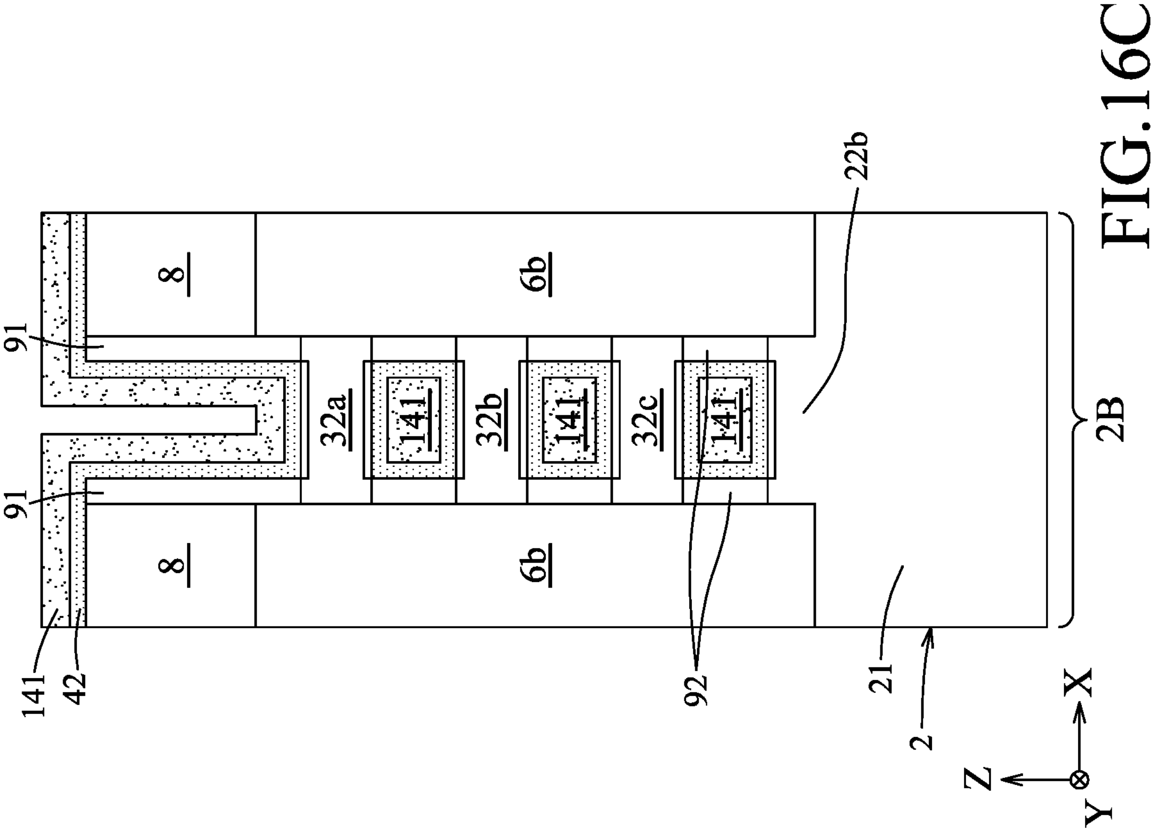
Figure 16B:
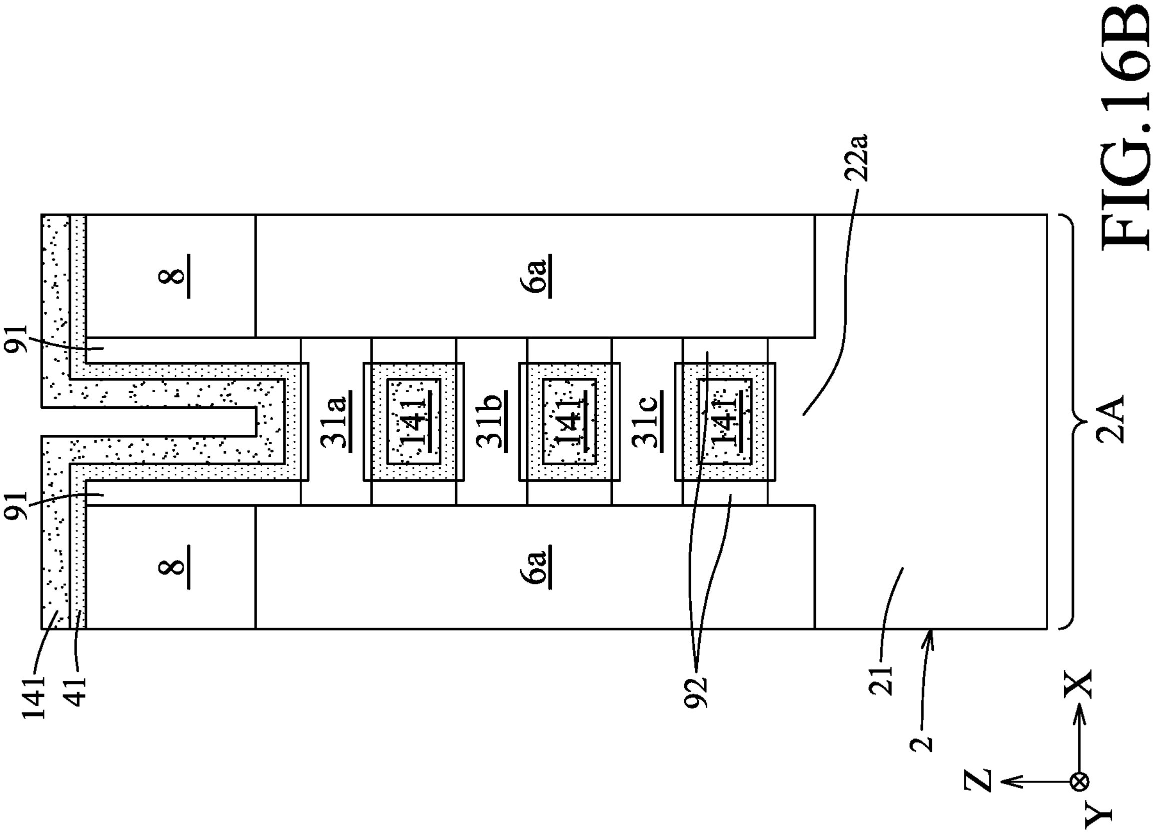

Referring to FIGS. 16A to 16C, which are views respectively subsequent to FIGS. 15A to 15C, a material layer 141 for forming the blocking portions 140 is conformally formed on the structure shown in FIGS. 15A to 15C to fill the spaces 151*a*, 152*a*, 151*b*, 152*b* (see FIGS. 15A to 15C) using CVD, ALD, or other suitable deposition techniques.

Referring to FIGS. 17A to 17C, which are views respectively subsequent to FIGS. 16A to 16C, the material layer 141 (see FIGS. 16A to 16C) is partially removed (e.g., etched back) such that the material layer 141 is formed into the blocking portions 140 respectively disposed in the spaces 151*b*, 152*b* (see FIGS. 15A to 15C) at the p-region 2B and a plurality of remaining portions 142 remaining in the spaces 151*a*, 152*a* (see FIGS. 15A to 15C) at the n-region 2A. In some embodiments, the partial removal of the material layer 141 may be performed using an etching process including dry etching, wet etching, or a combination thereof.

Referring to FIGS. 18A to 18C, which are views respectively subsequent to FIGS. 17A to 17C, the remaining portions 142 (see FIGS. 17A and 17B) are selectively removed using a wet etching process without damaging the first gate dielectric 41. During the removal of the remaining portions 142, the structure at the p-region 2B (especially the blocking portions 140) may be protected by a patterned mask layer (not shown), and the patterned mask layer will be removed after the remaining portions 142 are removed.

Figure 19A:
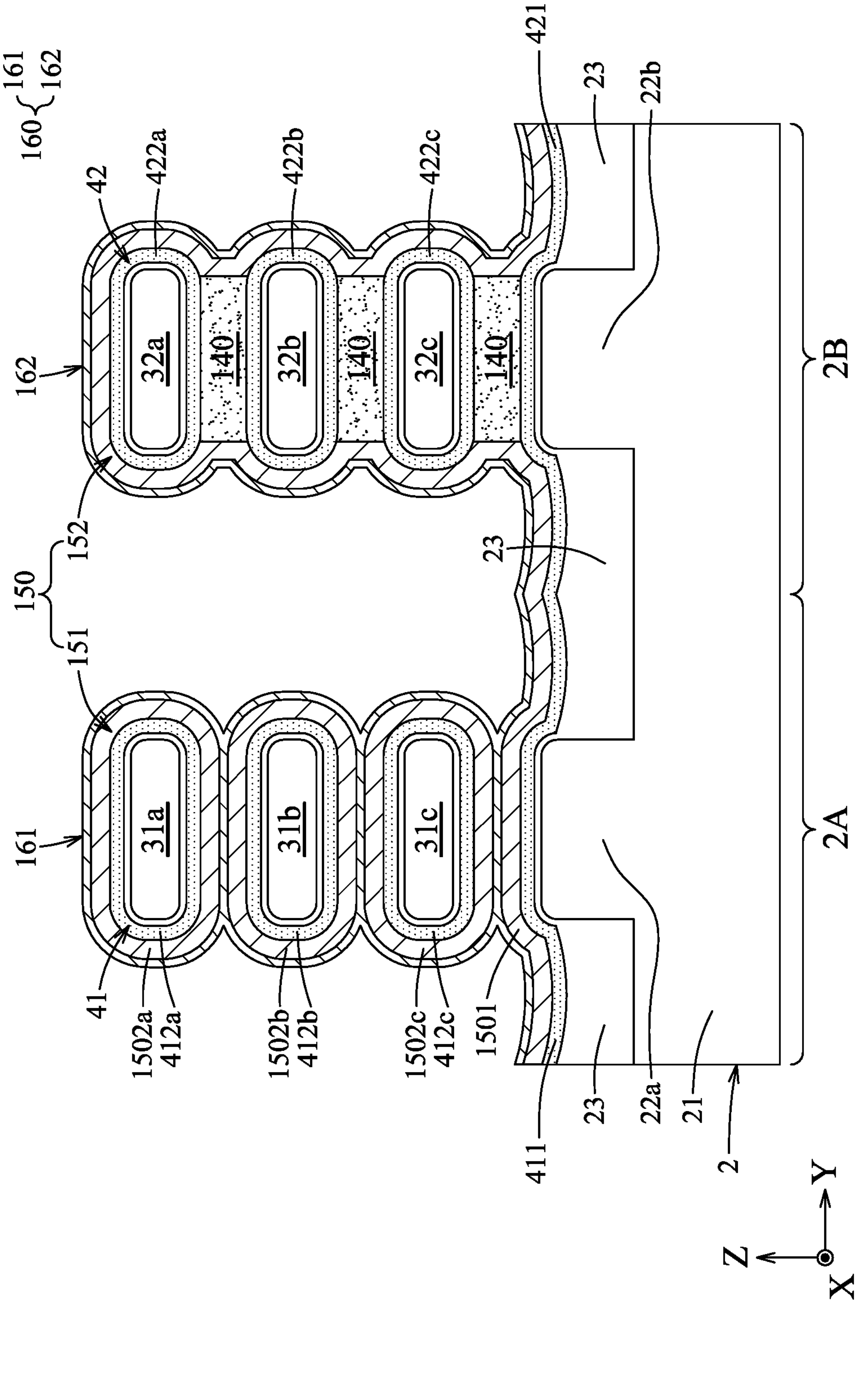
Figure 19C:
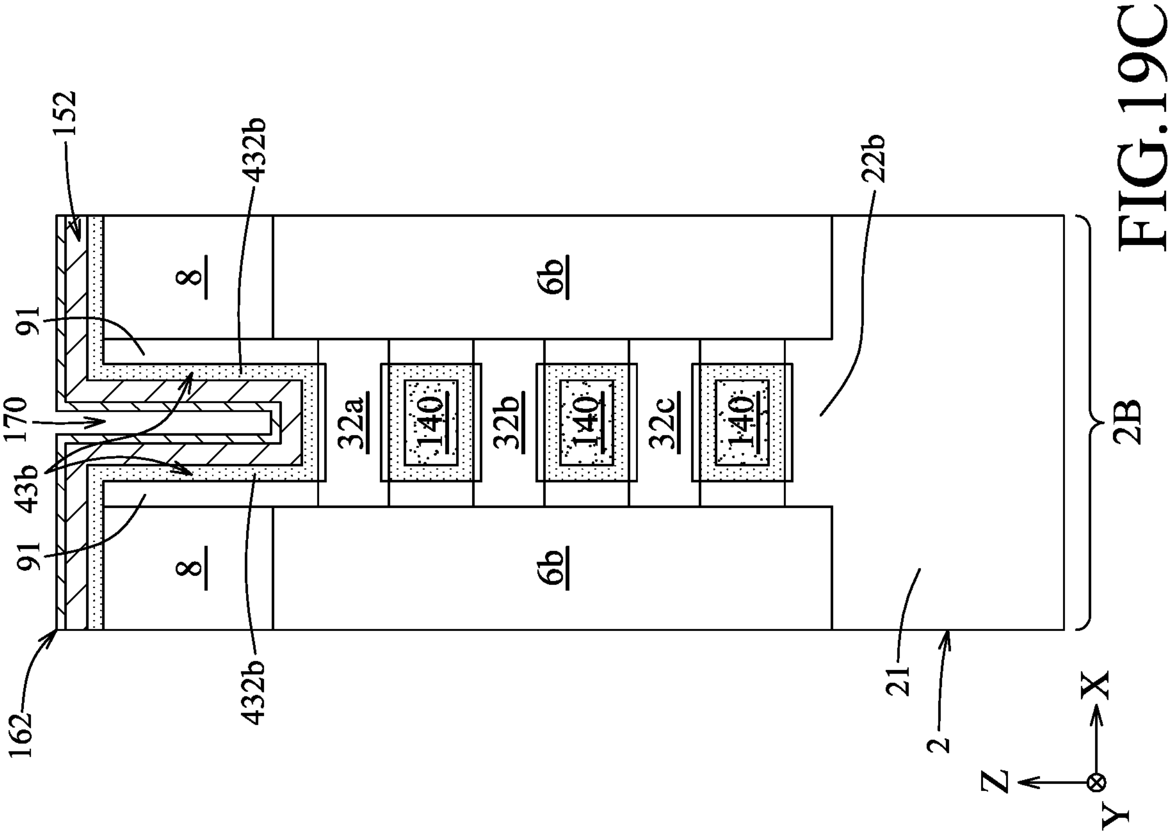
Figure 19B:
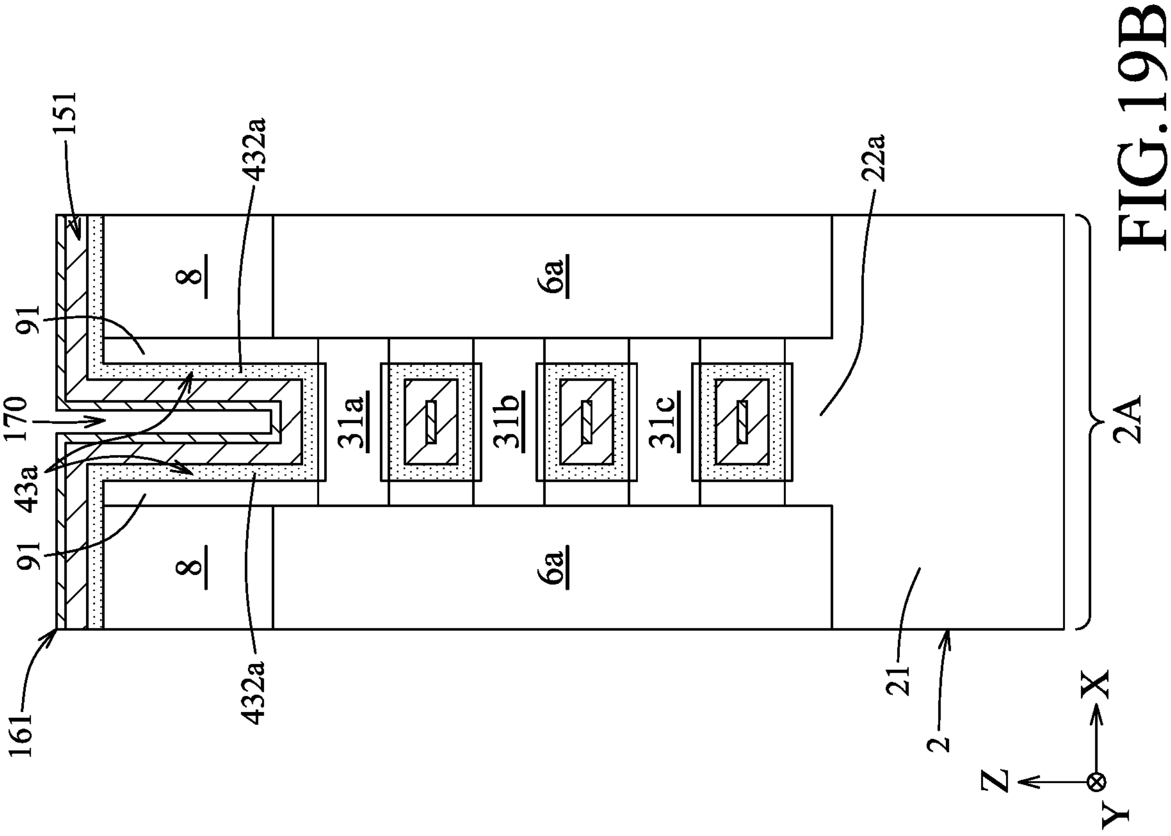

Referring to FIG. 3 and the examples illustrated in FIG. 19A to 19C, which are views respectively subsequent to FIGS. 18A to 18C, the method 10 proceeds to step S13, where a first work-function layer 150 and a conductive layer 160 are sequentially and conformally formed on the structure shown in FIGS. 18A to 18C using CVD, ALD, or other suitable deposition techniques. The work-function layer 150 is used for forming the inner WF portions 502 of the inner gate structures 51, 52 (see FIG. 2). The conductive layer 160 is used for forming the conductive portions 501 of the inner gate structures 51, 52 (see FIG. 2). The ratio of a volume of the conduction portion 501 and a total volume of the two inner WF portions 502 in each of the inner gate structures 51, 52 as described above with reference to FIGS. 1A to 1C can be controlled by the thicknesses of the work-function layer 150 and the conductive layer 160.

Each of the work-function layer 150 and the conductive layer 160 includes a first portion 151, 161 at the n-region 2A and a second portion 152, 162 at the p-region 2B. In some embodiments, the first portion 151 of the work-function layer 150 includes four inner work-function (WF) regions 1501, 1502*a*, 1502*b*, 1502*c*, as shown in FIG. 19A. The bottommost inner WF region 1501 covers the lower dielectric region 411, and the other three inner WF regions 1502*a*, 1502*b*, 1502*c* respectively surrounding the three upper dielectric parts 412*a*, 412*b*, 412*c*. The first portion 161 of the conductive layer 160 is formed on the first portion 151 of the work-function layer 150 so as to fill a space between two adjacent ones of the inner WF regions 1501, 1502*a*, 1502*b*, 1502*c*. Due to the presence of the blocking portions 140, the second portion 152 of the work-function layer 150 merely covers the second gate dielectric 42 and the blocking portions 140 without extending into the spaces among the upper dielectric parts 422*a*, 422*b*, 422*c* and the lower dielectric region 421 of the second gate dielectric 42.

Referring to FIGS. 19B and 19C, the second parts 432*a*, 432*b* of the vertical dielectric regions 43*a*. 43*b* are also covered by the work-function layer 150 and the conductive layer 160 in such order. It is noted that after formation of the work-function layer 150 and the conductive layer 160, a space 170 is still present between the second parts 432*a* (or 432*b*) of the vertical dielectric regions 43*a* (or 43*b*), which may facilitate etching back of the conductive layer 160 and the work-function layer 150 to be performed in the next step.

Figure 20A:
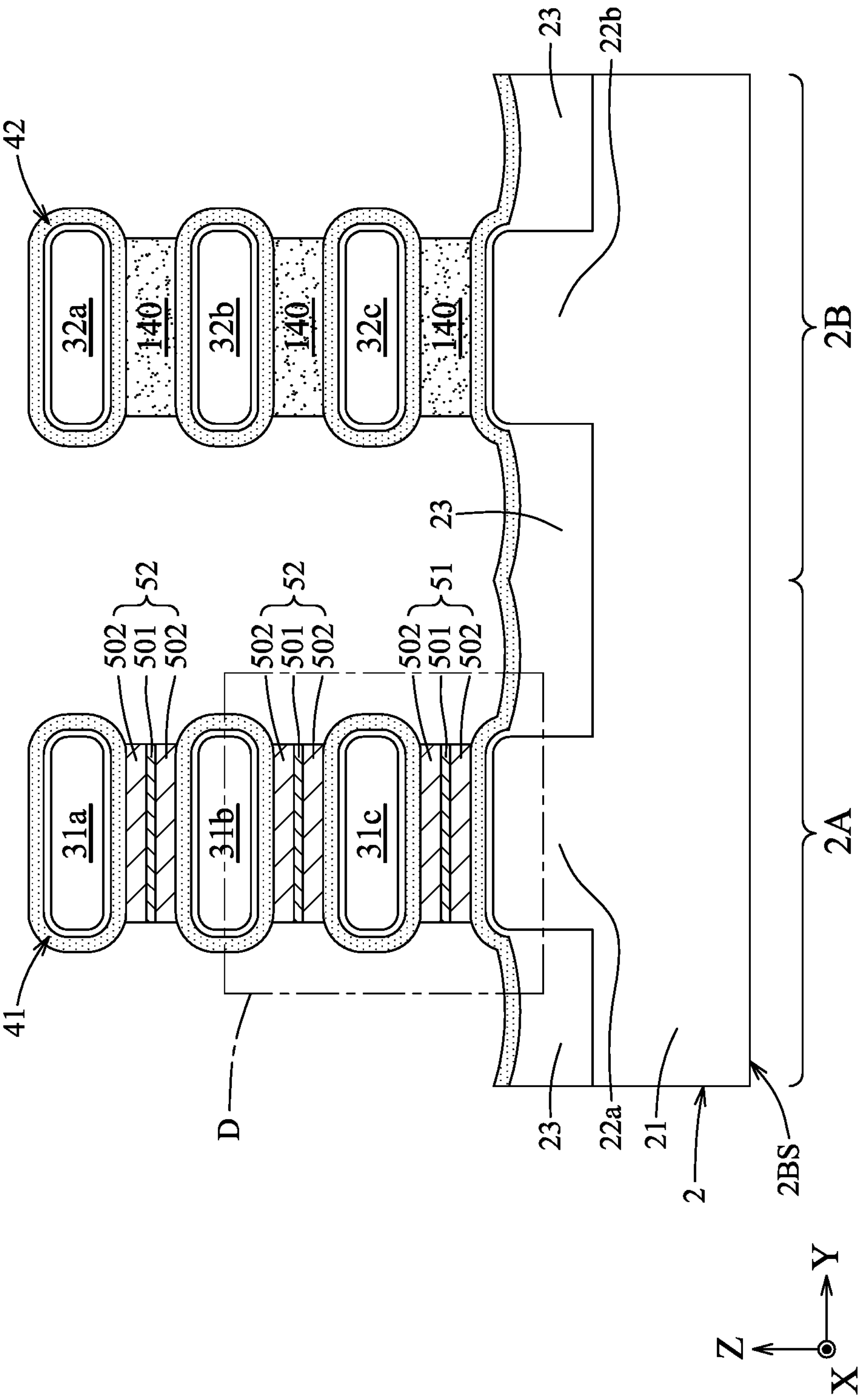
Figure 20C:
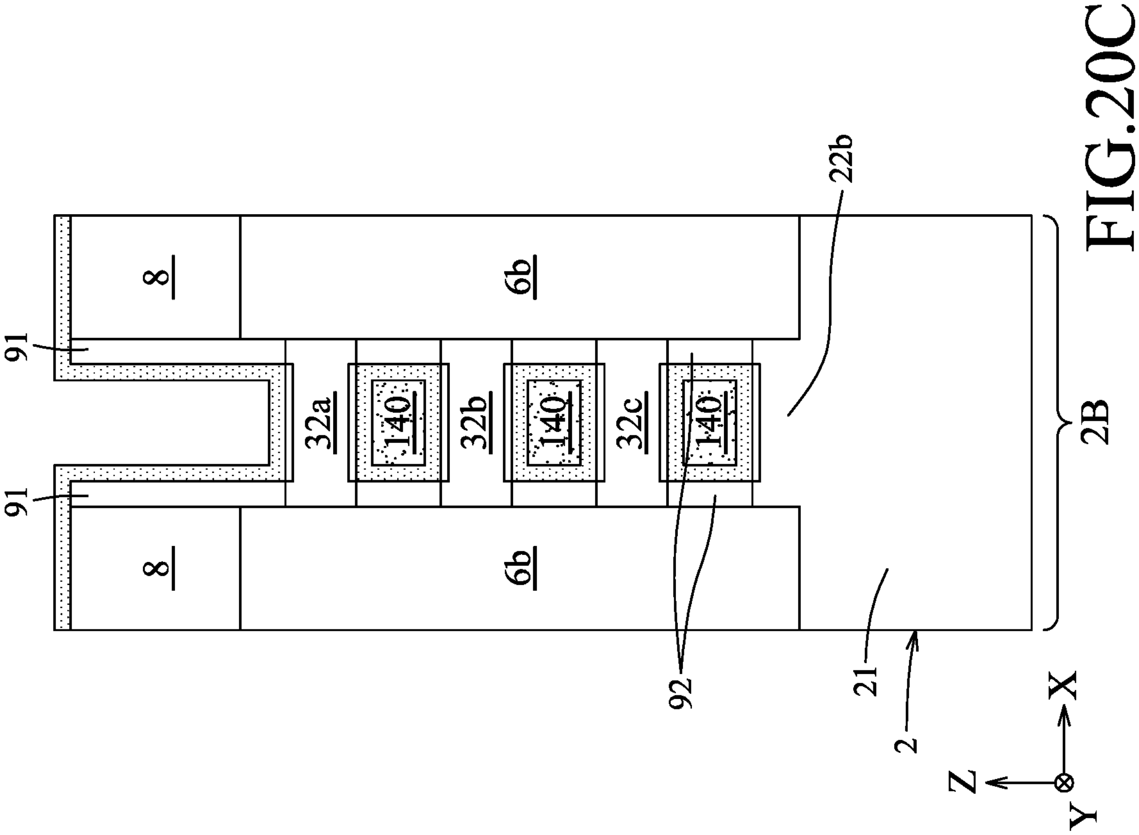
Figure 20B:
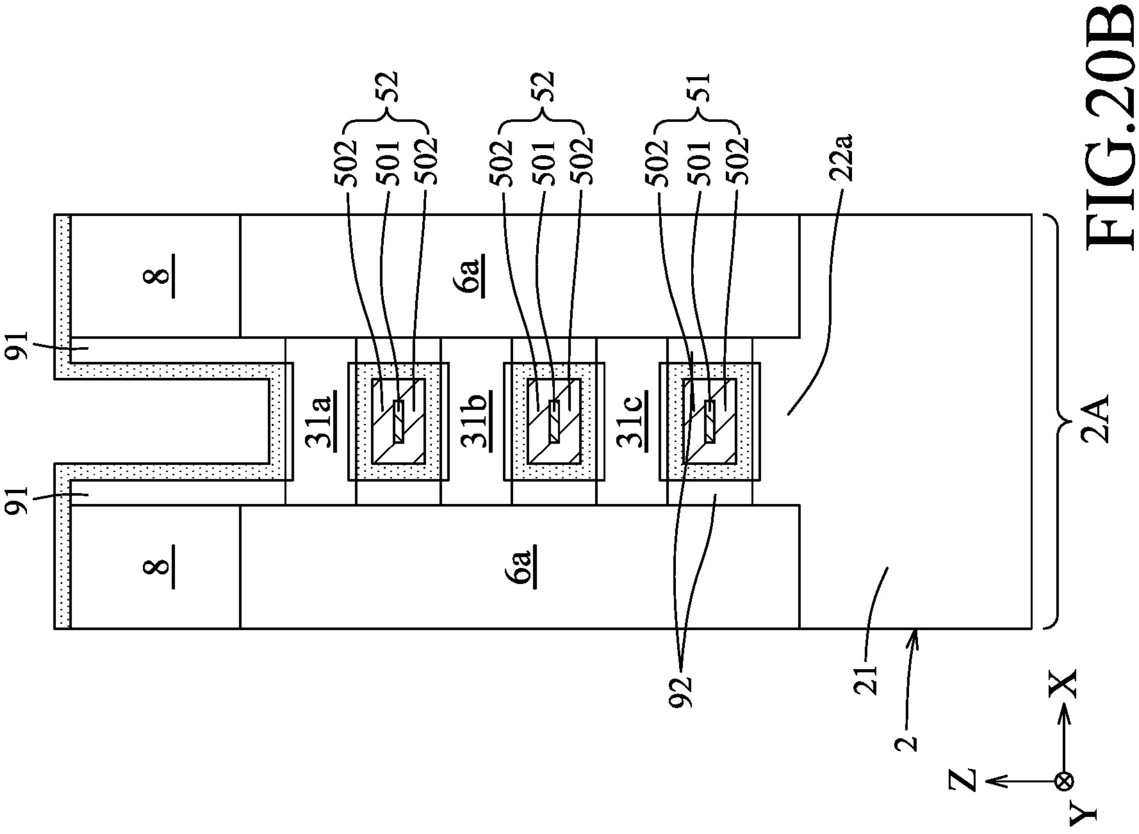

Referring to FIG. 3 and the examples illustrated in FIGS. 20A to 20C, which are views respectively subsequent to FIGS. 19A to 19C, the method 10 proceeds to step S14, where the conductive layer 160 and the work-function layer 150 (see FIG. 19A) are etched back such that the work-function layer 150 is formed into the inner WF portions 502 of each of the inner gate structures 51, 52 and such that the conductive layer 160 is formed into the conductive portion 501 of each of the inner gate structures 51, 52. To be detail, the first portions 151, 161 (see FIGS. 19A to 19C) of the work-function layer 150 and the conductive layer 160 at the n-region 2A are partially removed and the second portions 152, 162 (see FIGS. 19A to 19C) of the work-function layer 150 and the conductive layer 160 at the p-region 2B are completely removed. In some embodiments, the etching back of the conductive layer 160 and the work-function layer 150 may be performed using a selective etching process including a wet etching process, a reactive-ion etching process, or other suitable etching techniques. As such, when prolonging the process time of the selective etching process to ensure that the second portions 152, 162 of the work-function layer 150 and the conductive layer 160 at the p-region 2B are completely removed, the gate dielectrics 41, 42 and the blocking portions 140 will not be damaged or consumed.

Figure 21:
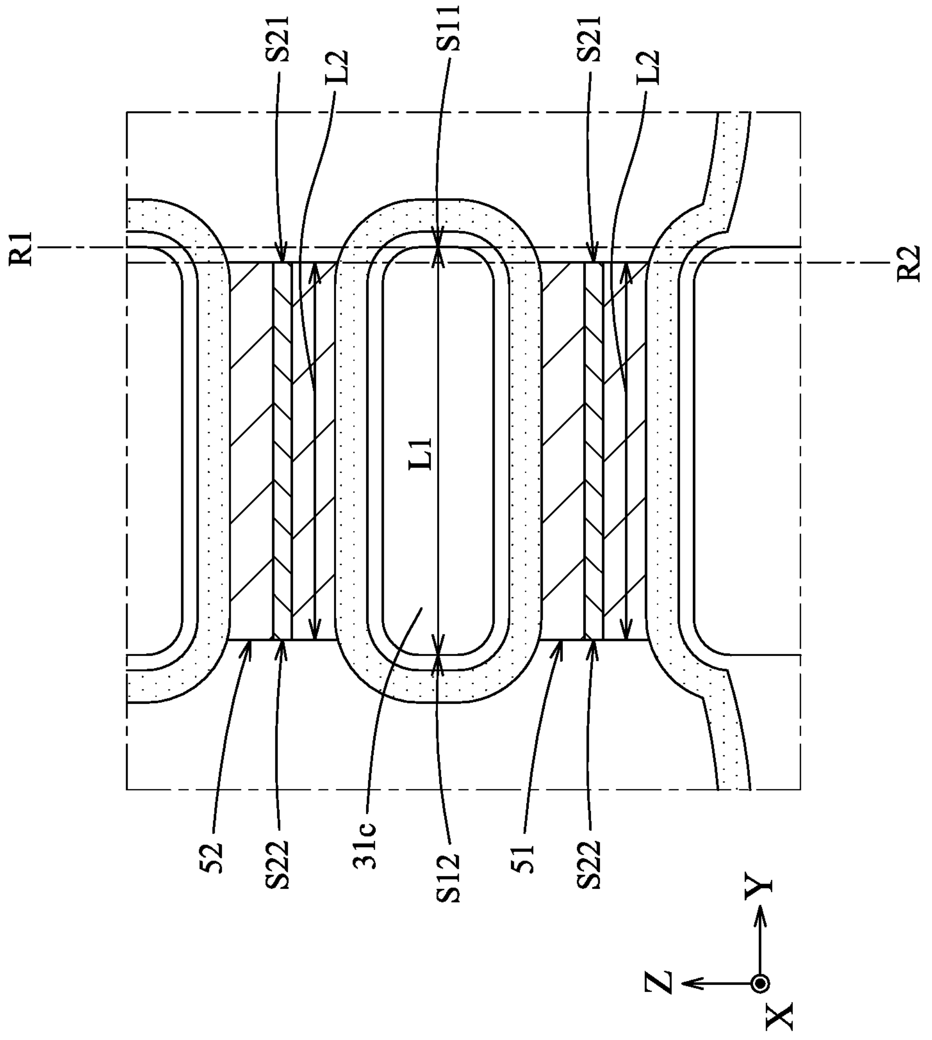

In some embodiments, the dimension of the inner gate structures 51, 52 may be controlled by process parameters (e.g., etching time, temperature and concentration of wet etchant solutions, and so on) of the etching process. FIG. 21 is a fragmentary view of area D in FIG. 20A. Each of the channel parts 31*a*. 31*b*, 31*c* (only the channel part 31*c* is fully shown in FIG. 21) has two first side surfaces S11, S12 opposite to each other in the Y direction. Each of the channel parts 31*a*, 31*b*, 31*c* has a first length (L1) between the two side surfaces S11. S12. Each of the inner gate structures 51, 52 has two second side surfaces S21, S22 opposite to each other in the Y direction, and has a second length (L2) between the two side surfaces S21, S22. In some embodiments, the second length (L2) may be controlled to be shorter, for example, but not limited to, by prolonging the etching time, and vice versa. The second length (L2) of each of the inner gate structures 51, 52 may be greater than, substantially equal to, or less than the first length (L1) of each of the channel parts 31*a*, 31*b*, 31*c*. In some embodiments, a difference between the first length (L1) and the second length (L2) ranges from 0 nm to about 5 nm.

As shown in FIG. 21, a first reference line (R1) and a second reference line (R2) are each normal to a back surface 2BS (see FIG. 20A) of the substrate 2, and are parallel to each other. The side surface S11 of each of the channel parts 31*a*, 31*b*, 31*c* confronts the second device portion 1B (see FIG. 1A) to be formed later. The first reference line (R1) passes through the side surface S11. The side surface S21 of each of the inner gate structures 51, 52 confronts the second device portion 1B. The second reference line (R2) passes through the side surface S21. In some embodiments, compared to the second reference line (R2), the first reference line (R1) may be closer or farther from the second device portion 1B. In other embodiments, the first reference line (R1) is in alignment with the second reference line (R2). In some embodiments, the second reference line (R2) may be controlled to be farther from or closer to the second device portion 1B by, for example, but not limited to, prolonging or shortening the etching time. In some embodiments, a distance between the first reference line (R1) and the second reference line (R2) ranges from 0 nm to 2.5 nm. In the case that the second reference line (R2) is closer to the second device portion 1B by a distance greater than about 2.5 nm relative to the first reference line (R1), the side surface S21 of each of the inner gate structures 51, 52 may have a greater exposed surface area, which may result in a risk of oxidation of each of the inner gate structures 51, 52 before being protected by a capping layer to be formed in the next step. In contrast, in the case that the second reference line (R2) is farther from the second device portion 1B by a distance greater than about 2.5 nm relative to the first reference line (R1), the proportion of the inner WF portions 502 of the inner gate structures 51, 52 in the gate electrode 5*a* will be smaller. In view of the threshold voltage of the first device portion 1A may be affected by the total volume of the inner WF portions 502 in the inner gate structures 51, 52 and the outer WF portion 531 in the outer WF structure 53, the proportion (i.e., thickness) of the outer WF portion 531 of the outer gate structure 53 need to be greater to compensate the smaller proportion of the inner WF portions 502 of the inner gate structures 51, 52, which is not conducive to a patterning process to be performed in the following step (e.g., step S16).

Figure 22A:
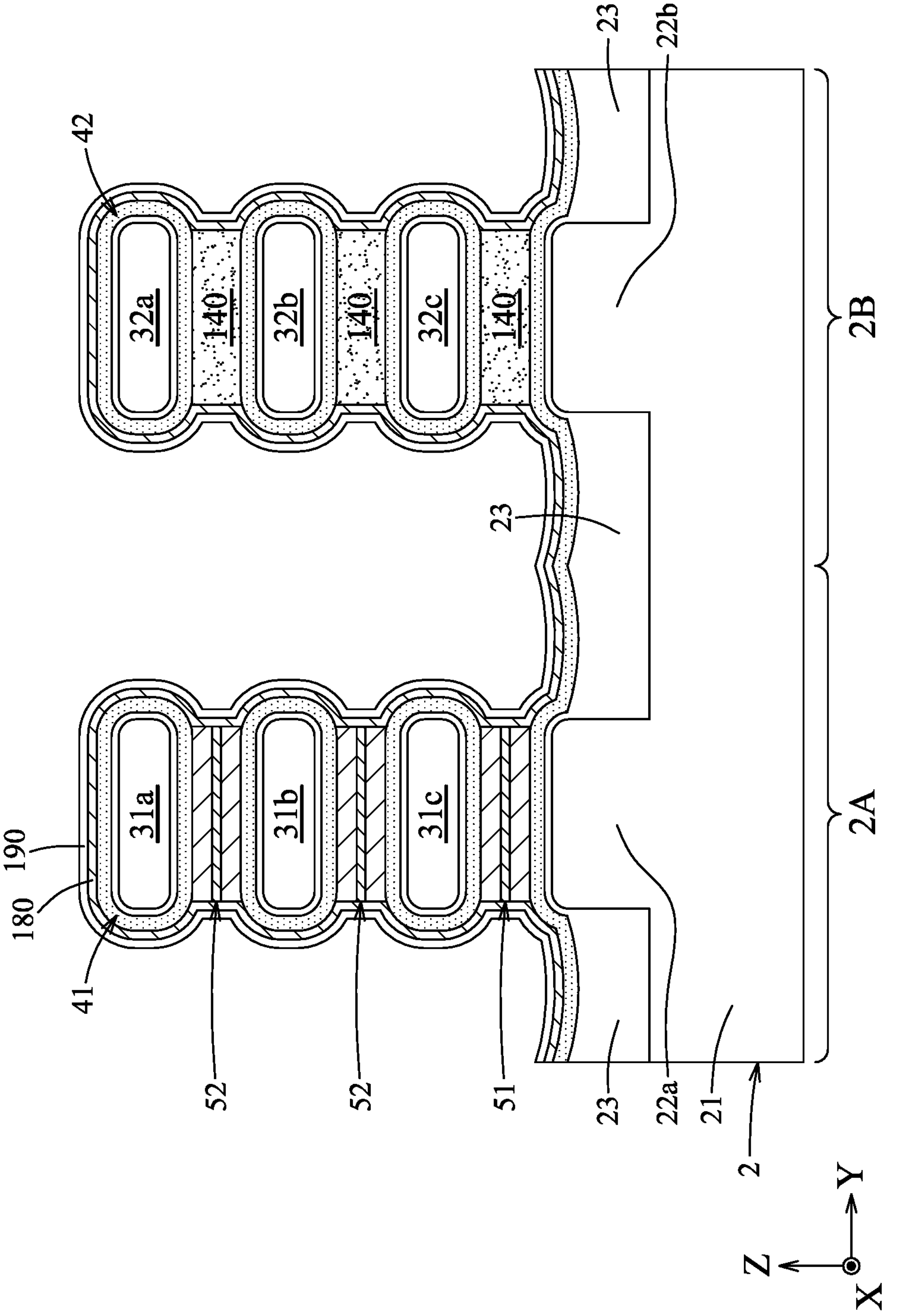
Figure 22C:
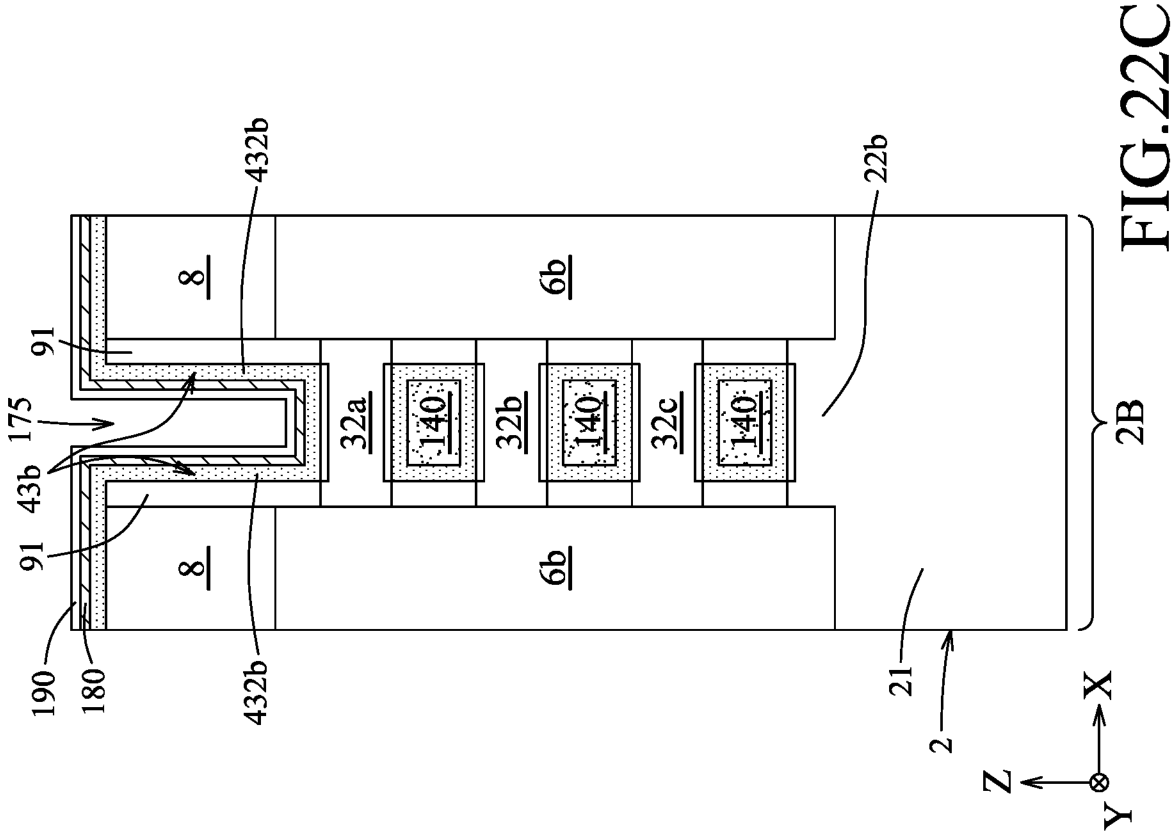
Figure 22B:
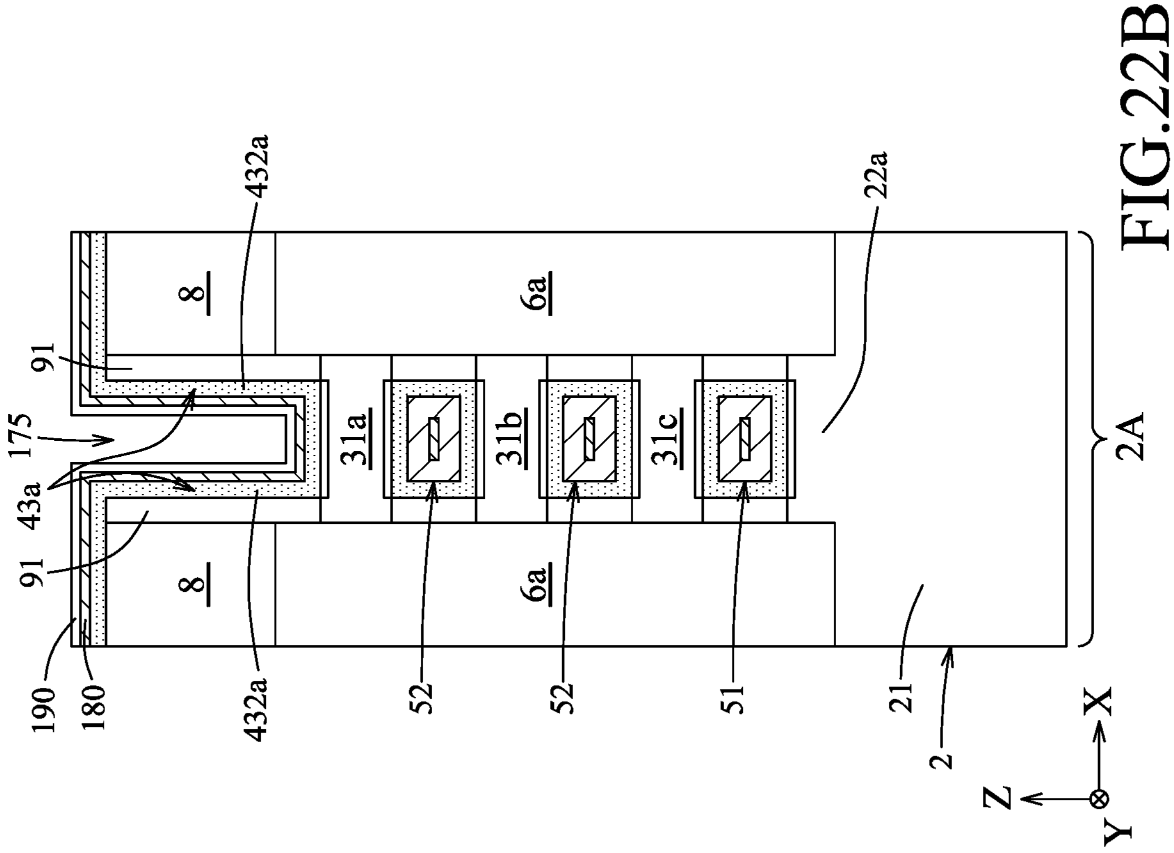

Referring to FIG. 3 and the examples illustrated in FIGS. 22A to 22C, which are views respectively subsequent to FIGS. 20A to 20C, the method 10 proceeds to step S15, where a second work-function layer 180 and a capping layer 190 are sequentially and conformally formed on the structure shown in FIGS. 20A to 20C using CVD, ALD, or other suitable deposition techniques. The work-function layer 180 and the capping layer 190 are respectively used for forming the outer WF portion 531 and the cap portion 532 of the outer gate structure 53. Referring to FIGS. 22B and 22C, the second parts 432*a*. 432*b* of the vertical dielectric regions 43*a*, 43*b* are also covered by the work-function layer 180 and the capping layer 190 in such order. It is noted that after formation of the work-function layer 180 and the capping layer 190, a space 175 is still present between the second parts 432*a* (or 432*b*) of the vertical dielectric regions 43*a* (or 43*b*), which may facilitate etching back of the capping layer 190 and the work-function layer 180 to be performed in the next step. In some embodiments, the space 175 has a width of at least about 4 nm in the X direction. In some embodiments, the width of the space 175 ranges from about 4 nm to about 11 nm.

Figure 23A:
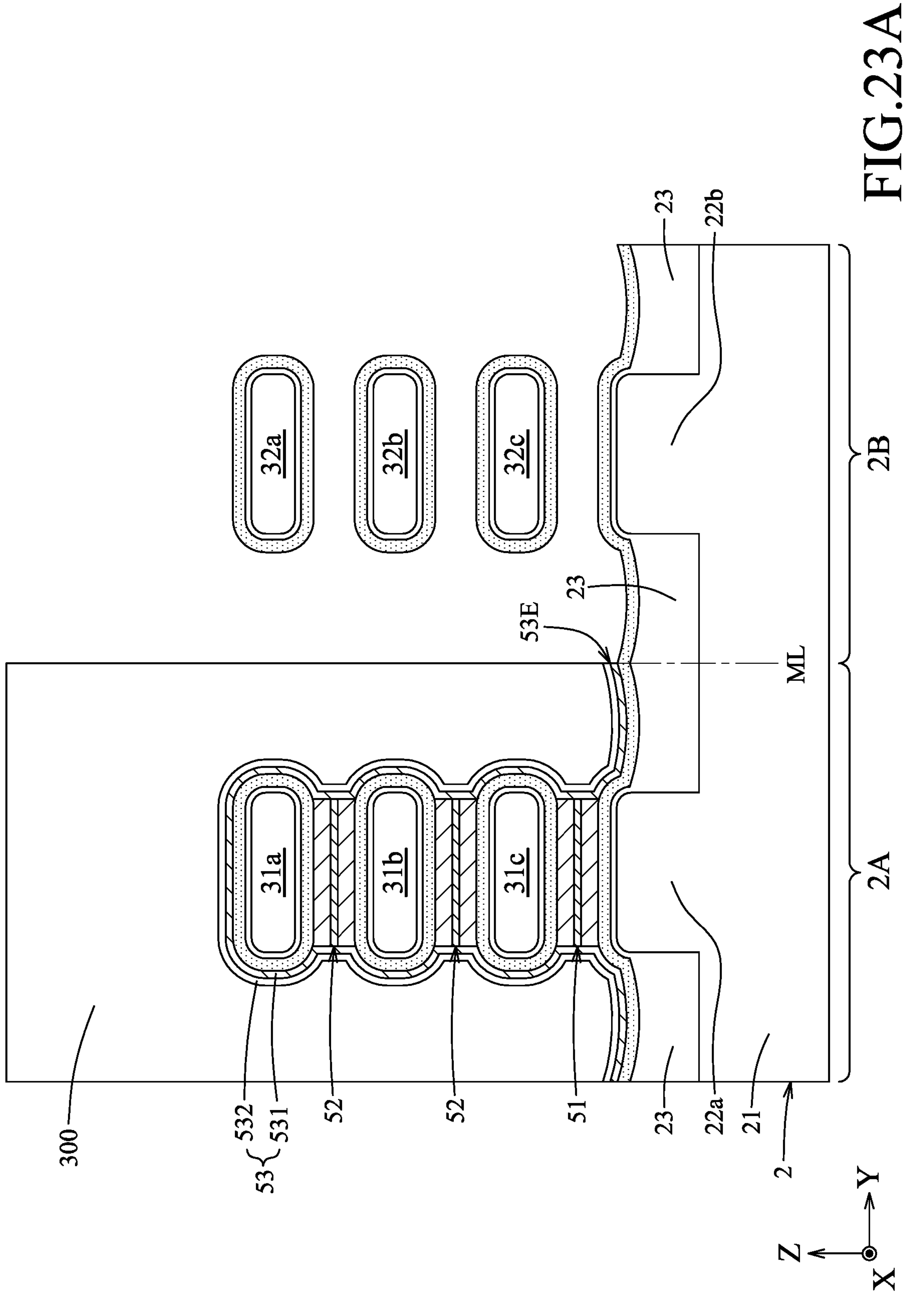
Figure 23C:
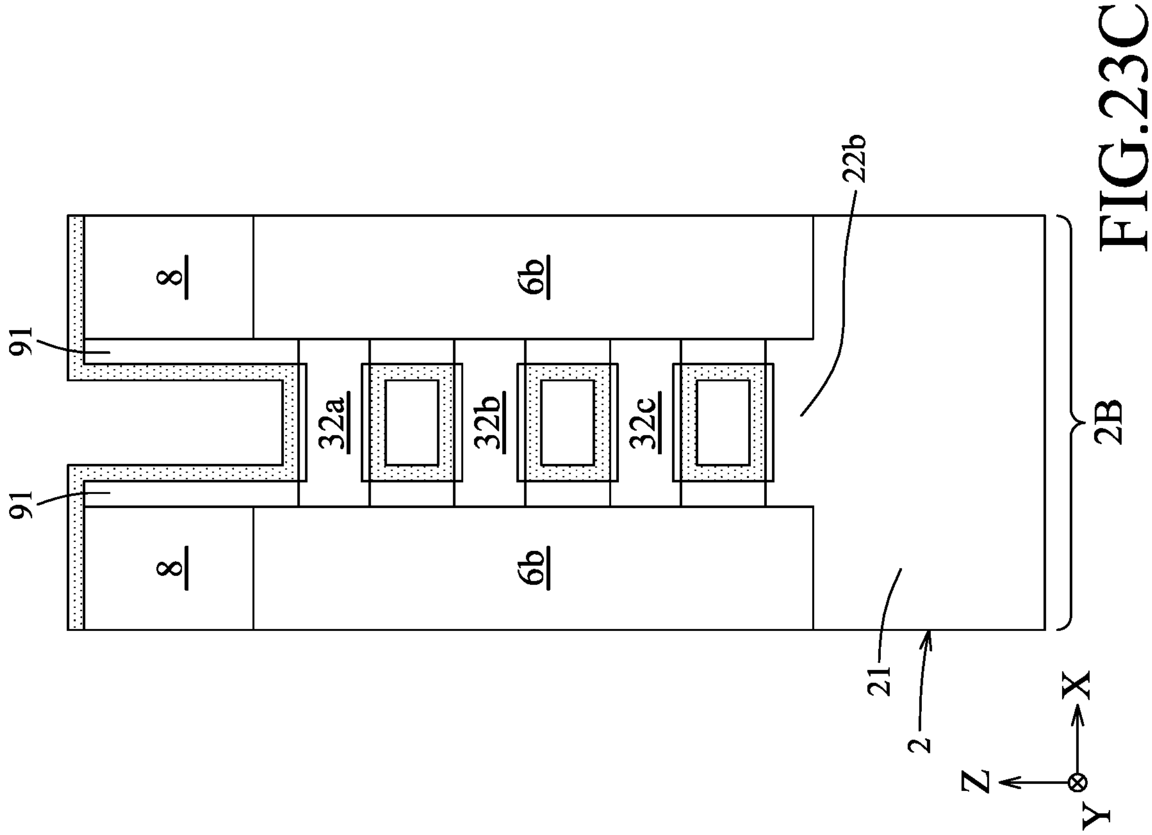
Figure 23B:
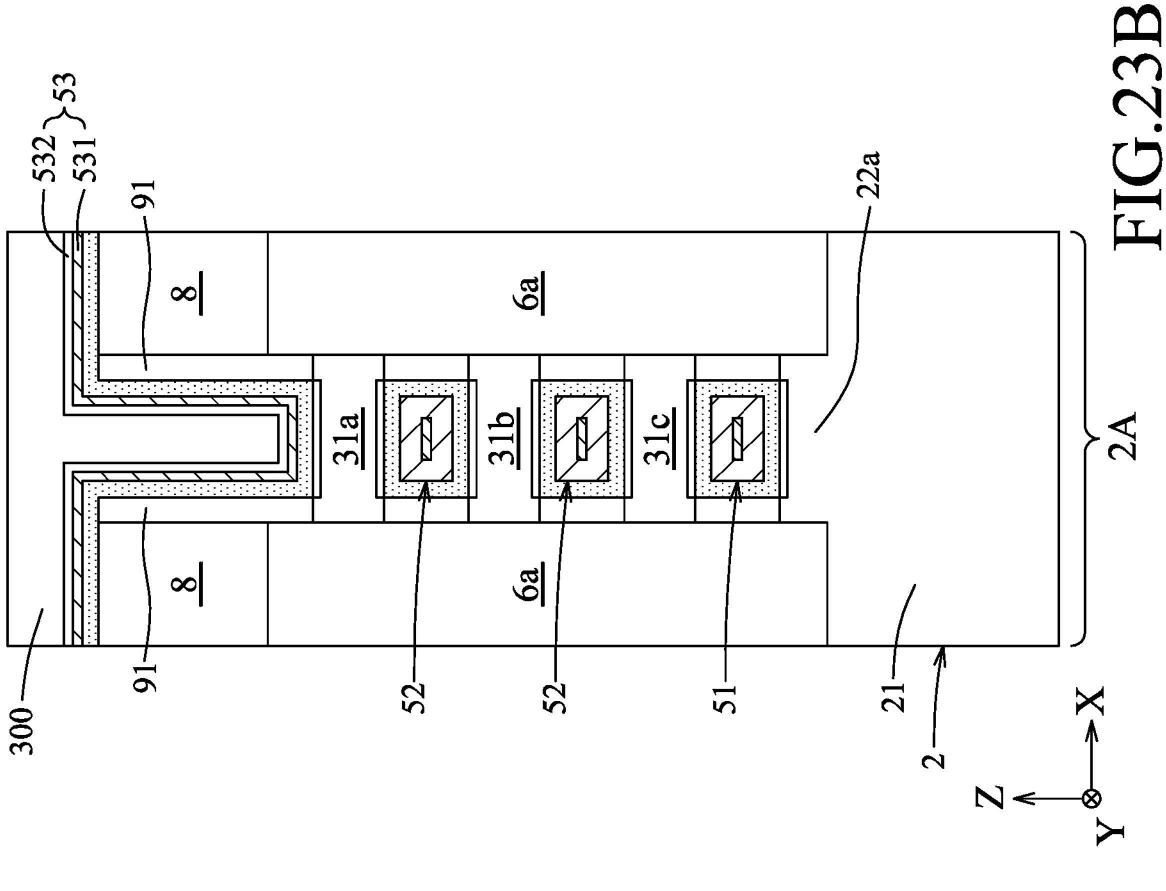

Referring to FIG. 3 and the examples illustrated in FIGS. 23A to 23C, which are views respectively subsequent to FIGS. 22A to 22C, the method 10 proceeds to step S16, where the capping layer 190 and the work-function layer 180 (see FIGS. 22A to 22C) are patterned to form the outer gate structure 53 at the n-region 2A, and the blocking portions 140 are removed. To be specific, a patterned mask layer 300 is first formed to protect the structure at the n-region 2A. The patterned mask layer 300 is made of a material different from that of the work-function layer 180, the capping layer 190 and the blocking portions 140. In some embodiments, the patterned mask layer 300 may include a patterned photoresist layer, a patterned bottom anti-reflective coating (BARC), a patterned hard mask layer, or combinations thereof. Possible materials suitable for the patterned hard mask layer may be similar to those for the blocking portions 140, and thus the details thereof are omitted for the sake of brevity. Other materials suitable for the patterned mask layer 300 are within the contemplated scope of the present disclosure. Afterwards, portions of the capping layer 190 and the work-function layer 180 at the p-region 2B are removed using an etching process including a wet etching process, a dry etching, a reactive-ion etching process, or other suitable etching techniques. Since the outer gate structure 53 is designed to be very thin (i.e., the work-function layer 180 and the capping layer 190 shown in FIGS. 22A to 22C are very thin), the etching time to completely remove the portions of the capping layer 190 and the work-function layer 180 at the p-region 2B may be significantly reduced. As such, a boundary portion 53E of the outer gate structure 53 exposed from an edge of the patterned mask layer 300 is less likely to be over-etched due to the smaller exposed area and shorter etching time. Finally, the blocking portions 140 are removed using a selective etching process including a wet etching process, a reactive-ion etching process, or other suitable etching techniques. Since the outer gate structure 53 and the blocking portions 140 are made of different materials, the outer gate structure 53 will remain intact during the removal of the blocking portions 140. Consequently, a distance between the midline (ML) and the boundary portion 53E of the outer gate structure 53 can be controlled in a range from substantially 0 nm to about 5 nm as described above with reference to FIG. 1A.

Figure 24A:
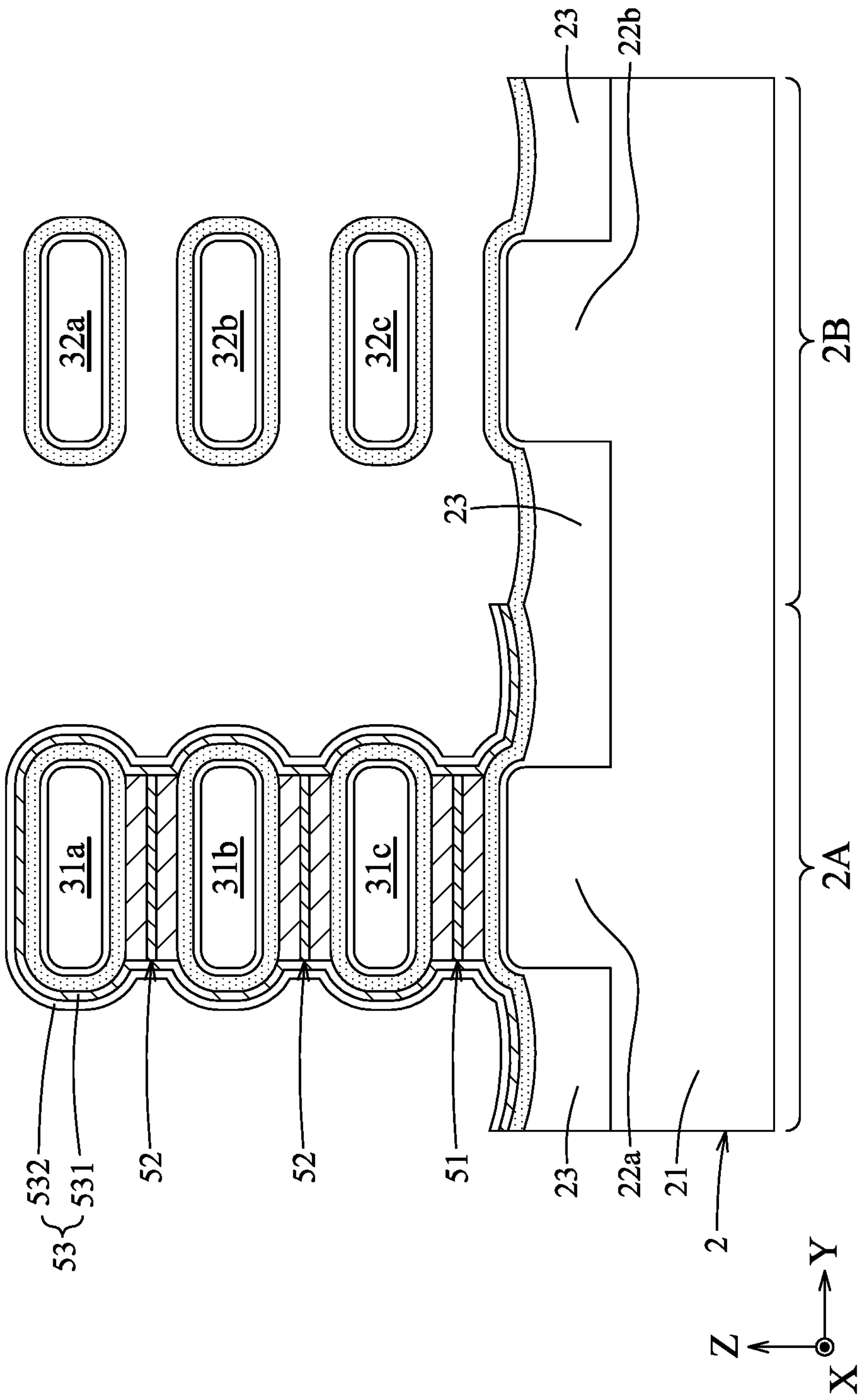
Figure 24C:
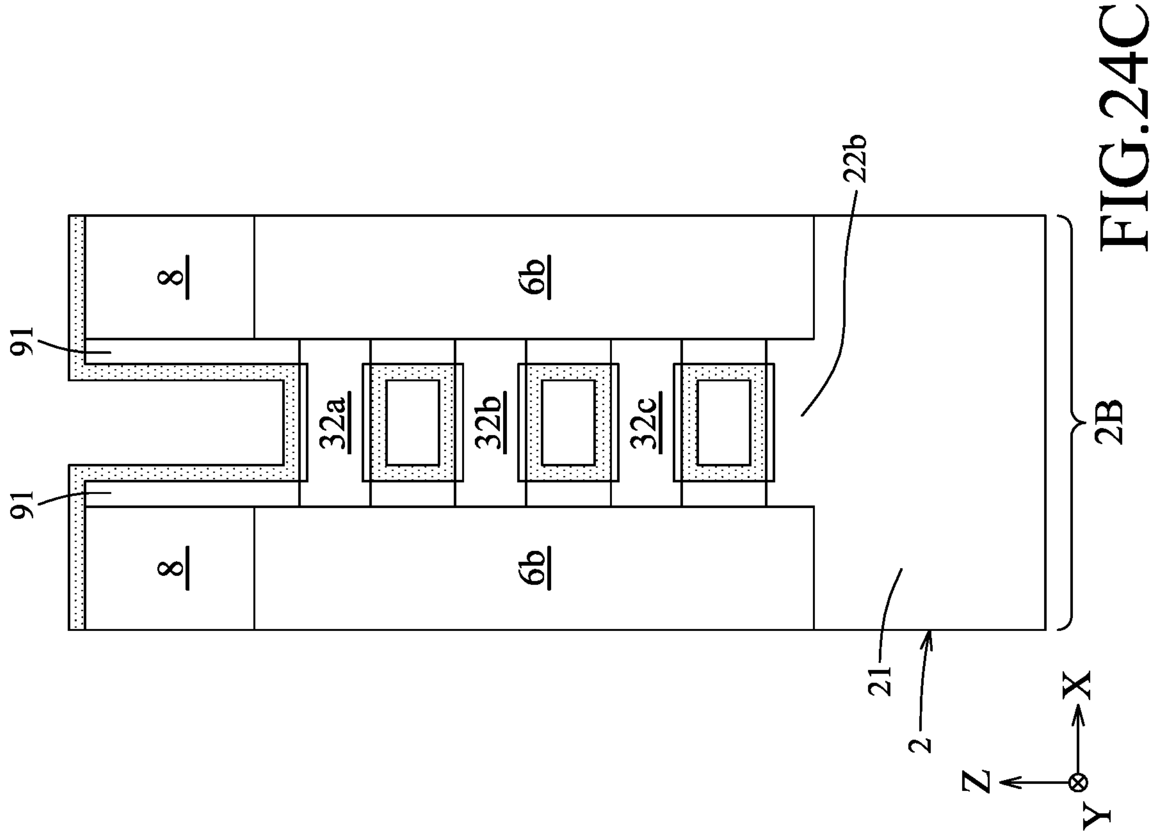
Figure 24B:
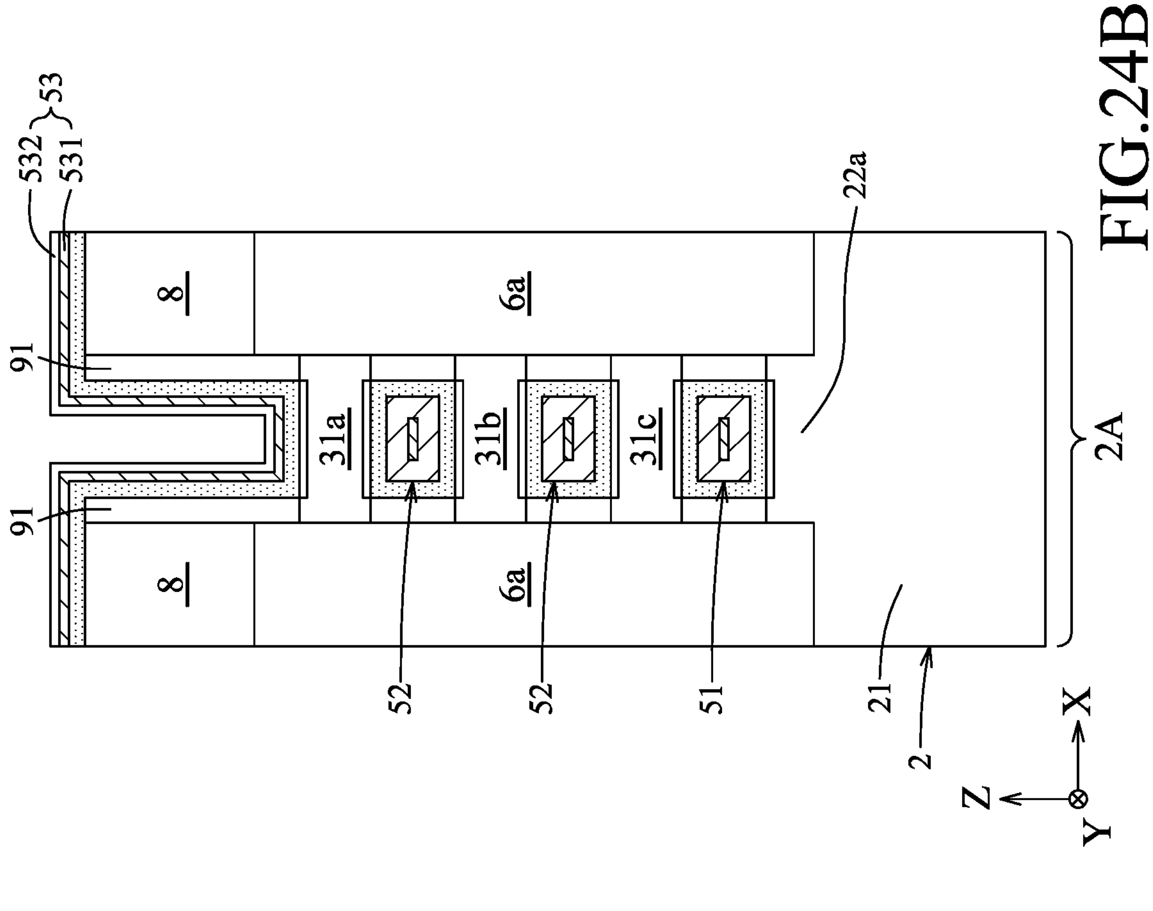

Referring to FIG. 3 and the examples illustrated in FIGS. 24A to 24C, which are views respectively subsequent to FIGS. 23A to 23C, the method 10 proceeds to step S17, where the patterned mask layer 300 (see FIGS. 23A and 23B) is removed using an etching process. In some embodiments, in the case that the patterned mask layer 300 is made of a patterned photoresist layer, a patterned bottom anti-reflective coating, the patterned mask layer 300 may be removed by an ashing process using a gas mixture of nitrogen and hydrogen.

Referring to FIG. 3 and the examples illustrated in FIGS. 1A to 1C, which are views respectively subsequent to FIGS. 24A to 24C, the method 10 proceeds to step S18, where a third work-function layer (not shown) is formed on the structure shown in FIGS. 23A to 23C using CVD, ALD or other suitable deposition techniques, followed by a planarization process (e.g., chemical mechanical polishing) to expose the inter-layer dielectric portion 8, thereby forming the covering portion 54*b* of the second gate electrode 5*b* on the second gate dielectric 42 and the covering portion 54*a* on the outer gate structure 53. The semiconductor device 1 including the first device portion 1A and the second device portion 2A is thus obtained. In some embodiments, each of the covering portion 54*b* of the second gate electrode 5*b* and the covering portion 54*a* of the first gate electrode 5*a* may be a single or multiple material layers.

In some embodiments, some steps in the method 10 may be modified, replaced, or eliminated without departure from the spirit and scope of the present disclosure.

In summary, the structural design of the gate electrode at the n-region is advantageous to the n-type transistor. To be specific, in addition to threshold voltage control attributed to the arrangement of the inner and outer work-function portions respectively in the inner and outer gate structures, the conductive portion in each of the inner gate structures may increase conductivity of the gate electrode, and the cap portion in the outer gate structure may prevent the inner and outer work-function portions from being oxidized. It is worth noting that the cap portion is located at the periphery of the outer gate structure without extending into spaces among the channel parts, and hence formation of parasitic capacitance in the gate electrode can be avoided. Furthermore, the outer gate structure is less likely to be over-etched due to the thinness thereof. Therefore, the gate control over the channel parts can be enhanced.

In accordance with some embodiments of the present disclosure, a semiconductor device includes: a channel portion disposed on and spaced apart from a substrate; a gate dielectric which includes an upper dielectric region disposed on the channel portion; a first inner gate structure disposed between the substrate and the upper dielectric region, the first inner gate structure including a first work-function material and a conductive material that is different from the first work-function material; and an outer gate structure including an outer work-function portion and a cap portion, the outer work-function portion covering the upper dielectric region and the first inner gate structure, the cap portion covering the outer work-function portion in a way that the cap portion is separated from the first inner gate structure, the outer work-function portion including a second work-function material that is different from the conductive material.

In accordance with some embodiments of the present disclosure, the first work-function material is the same as the second work-function material.

In accordance with some embodiments of the present disclosure, the conductive material has a sheet resistance less than that of the first work-function material.

In accordance with some embodiments of the present disclosure, the cap portion includes silicon, silicon oxide, silicon nitride, silicon carbide, silicon oxynitride, silicon oxycarbide, silicon carbon nitride, silicon oxycarbon nitride, titanium nitride, tantalum nitride, or combinations thereof.

In accordance with some embodiments of the present disclosure, the gate dielectric further includes a lower dielectric region disposed on the substrate. The channel portion includes two channel parts spaced apart from each other. The upper dielectric region includes two dielectric parts surrounding the two channel parts, respectively. The first inner gate structure is disposed between the lower dielectric region and a lower one of the dielectric parts. The semiconductor device further includes a second inner gate structure between the two dielectric parts. Each of the first inner gate structure and the second inner gate structure includes a conductive portion and two inner work-function portions which are respectively disposed at two opposite sides of the conductive portion. The conductive portion includes the conductive material, and each of the inner work-function portions includes the first work-function material. The outer work-function portion further covers the lower dielectric region and the second inner gate structure, and the cap portion is further separated from the second inner gate structure.

In accordance with some embodiments of the present disclosure, the outer gate structure has a thickness less than half of a thickness of each of the first inner gate structure and the second inner gate structure.

In accordance with some embodiments of the present disclosure, in each of the first inner gate structure and the second inner gate structure, a ratio of a volume of the conductive portion to a total volume of the two inner work-function portions ranges from 5:100 to 100:100.

In accordance with some embodiments of the present disclosure, in each of the first inner gate structure and the second inner gate structure, the two inner work-function portions are respectively disposed proximate to and distal from the substrate.

In accordance with some embodiments of the present disclosure, the semiconductor device further includes two source/drain portions respectively disposed at two opposite sides of the channel portion such that the channel portion extends between the two source/drain portions.

In accordance with some embodiments of the present disclosure, the two source/drain portions are spaced apart from each other in a first direction, and the channel portion is spaced part from the substrate in a second direction transverse to the first direction. The channel portion has two first side surfaces opposite to each other in a third direction transverse to both of the first direction and the second direction, and the channel portion has a first length between the two first side surfaces. The first inner gate structure has two second side surfaces opposite to each other in the third direction, and has a second length between the two second side surfaces thereof. A difference between the first length and the second length ranges from 0 nm to 5 nm.

In accordance with some embodiments of the present disclosure, a semiconductor device includes: a first channel portion disposed on and spaced apart from a first region of a substrate; a second channel portion disposed on and spaced apart from a second region of the substrate, the first region and the second region being spaced apart from each other; a first gate dielectric including a first upper dielectric region surrounding the first channel portion; a second gate dielectric including a second upper dielectric surrounding the second channel portion; a first gate electrode including an inner gate structure disposed between the first upper dielectric region and the substrate, the inner gate structure including a first work-function material and a conductive material that is different from the first work-function material, and an outer gate structure including an outer work-function portion that covers the first upper dielectric region and the inner gate structure, and a cap portion that covers the outer work-function portion in a way that the cap portion is separated from the inner gate structure, the outer work-function portion including a second work-function material that is different from the conductive material; and a second gate electrode surrounding the second upper dielectric region.

In accordance with some embodiments of the present disclosure, the outer gate structure has a thickness ranging from 1 nm to 5 nm.

In accordance with some embodiments of the present disclosure, the outer gate structure has a thickness less than that of the inner gate structure.

In accordance with some embodiments of the present disclosure, the second gate electrode includes a covering portion which is made of a third work-function material that is different from the first work-function material and the second work-function material, and the first gate electrode further includes a covering portion disposed on the cap portion. The covering portion includes the third work-function material.

In accordance with some embodiments of the present disclosure, a first reference line and a second reference line are each normal to a back surface of the substrate, and are parallel to each other. The first channel portion has a first side surface which confronts the second gate electrode, and the first reference line passes through the first side surface. The inner gate structure has a second side surface which confronts the second gate electrode, and the second reference line passes through the second side surface. A distance between the first reference line and the second reference line ranges from 0 nm to 2.5 nm.

In accordance with some embodiments of the present disclosure, a method for forming a semiconductor device includes: forming a channel portion on a substrate, the channel portion being spaced apart from the substrate; forming a gate dielectric which includes an upper dielectric region that covers the channel portion; forming a work function layer over the upper dielectric region of the gate dielectric and the substrate such that the work function layer is separated from the channel portion through the upper dielectric region, the work function layer including a first work-function material; forming a conductive layer on the work-function layer so that a space between the channel portion and the substrate is filled by the work-function layer and the conductive layer, the conductive layer including a conductive material that is different from the first work-function material; and patterning the work-function layer and the conductive layer so as to form a first inner gate structure between the substrate and the upper dielectric region, the first inner gate structure including the first work-function material included in the patterned the work-function layer and the conductive material included in the patterned conductive layer.

In accordance with some embodiments of the present disclosure, the gate dielectric further includes a lower dielectric region that covers the substrate. The work function layer is further formed over the lower dielectric region. The first inner gate structure is formed between the lower dielectric region and the upper dielectric region.

In accordance with some embodiments of the present disclosure, the method further includes forming an outer gate structure which includes an outer work-function portion that covers the lower dielectric region, the first inner gate structure and the upper dielectric region, and a cap portion that covers the outer work-function portion in a way that the cap portion is separated from the first inner gate structure, the outer work-function portion including a second work-function material different from the conductive material.

In accordance with some embodiments of the present disclosure, the cap portion includes silicon, silicon oxide, silicon nitride, silicon carbide, silicon oxynitride, silicon oxycarbide, silicon carbon nitride, silicon oxycarbon nitride, titanium nitride, tantalum nitride, or combinations thereof.

In accordance with some embodiments of the present disclosure, the channel portion includes two channel parts spaced apart from each other. The upper dielectric region includes two upper dielectric parts surrounding the two channel parts, respectively. The first inner gate structure is disposed between the lower dielectric region and a lower one of the two upper dielectric parts. The work-function layer and the conductive layer are patterned into the first inner gate structure which is located between the lower dielectric region and a lower one of the upper dielectric parts, and a second inner gate structure which is located between the two upper dielectric parts. Each of the first inner gate structure and the second inner gate structure includes a conductive portion and two inner work-function portions respectively disposed at two opposite sides of the conductive portion. The conductive portion includes the conductive material included in the patterned conductive layer, and each of the inner work-function portions includes the first work-function material included in the patterned work-function layer. The outer work-function portion further covers the second inner gate structure, and the cap portion is further separated from the second inner gate structure.

In accordance with some embodiments of the present disclosure, a semiconductor device includes: a first channel portion disposed on and spaced apart from a first region of a substrate; a second channel portion disposed on and spaced apart from a second region of the substrate, the first region and the second region being spaced apart from each other through an isolation portion; a first gate dielectric including a first upper dielectric region surrounding the first channel portion; a second gate dielectric including a second upper dielectric region surrounding the second channel portion; a first gate electrode including an inner gate structure disposed between the first upper dielectric region and the substrate, the inner gate structure including a conductive portion and two inner work-function portions, the two inner work-function portions being respectively disposed on the first upper dielectric region and the substrate, and spaced apart from each other by the conductive portion, and an outer gate structure including an outer work-function portion that covers the first upper dielectric region and the inner gate structure, and a cap portion that covers the outer work-function portion in a way that the cap portion is separated from the inner gate structure, the conductive portion being made of a material different from that of the two inner work-function portions, and different from that of the outer work-function portion; and a second gate electrode surrounding the second upper dielectric region.

In accordance with some embodiments of the present disclosure, the first gate dielectric further includes a first lower dielectric region covering the first region of the substrate and a first portion of the isolation region. The second gate dielectric further includes a second lower dielectric region covering the second region of the substrate and a second portion of the isolation region. The inner gate structure is disposed between the first upper dielectric region and the first lower dielectric region. The second gate electrode further covers the second lower dielectric region.

In accordance with some embodiments of the present disclosure, the isolation region has a midline that is equidistant from the first region and the second region. A minimum distance between the outer work-function portion and the midline ranging from 0 nm to 5 nm.

In accordance with some embodiments of the present disclosure, the first region and the second region are spaced apart from each other by a distance ranging from 20 nm to 60 nm.

In accordance with some embodiments of the present disclosure, the outer gate structure has a thickness less than half of a thickness of the inner gate structure.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a channel portion on a substrate, the channel portion being spaced apart from the substrate;

forming a gate dielectric which includes an upper dielectric region that covers the channel portion;

forming a work-function layer over the substrate and the upper dielectric region of the gate dielectric, the work-function layer being separated from the channel portion through the upper dielectric region, the work-function layer including a first work-function material;

after forming the work-function layer, forming a conductive layer on the work-function layer, the conductive layer including a conductive material that is different from the first work-function material; and etching the conductive layer to form a conductive portion, and etching the work-function layer to form two inner work-function portions which remain respectively on the substrate and the upper dielectric region, the conductive portion being disposed between the two inner work-function portions, the conductive portion and the two inner work-function portions, which remain between the substrate and the upper dielectric region, together constituting an inner gate structure.

2. The method as claimed in claim 1, wherein the gate dielectric further includes a lower dielectric region that covers the substrate, the work-function layer is further formed over the substrate with the lower dielectric region disposed between the substrate and the work-function layer, and the conductive portion is separated from the lower dielectric region and the upper dielectric region respectively by the two inner work-function portions.

3. The method as claimed in claim 2, wherein after formation of the conductive layer, a space between the upper dielectric region and the lower dielectric region is filled by the work-function layer and the conductive layer, and the method further comprises:

forming an outer gate structure which includes an outer work-function portion that covers the lower dielectric region, the inner gate structure and the upper dielectric region, and a cap portion that covers the outer work-function portion in a way that the cap portion is separated from the inner gate structure by the outer work-function portion, the outer work-function portion including a second work-function material different from the conductive material.

4. The method as claimed in claim 3, wherein the cap portion includes silicon, silicon oxide, silicon nitride, silicon carbide, silicon oxynitride, silicon oxycarbide, silicon carbon nitride, silicon oxycarbon nitride, titanium nitride, tantalum nitride, or combinations thereof.

5. The method as claimed in claim 1, wherein the channel portion is spaced apart from the substrate in a direction, and the two inner work-function portions are spaced apart from each other in the direction and are respectively disposed at two opposite sides of the conductive portion in the direction.

6. A method for manufacturing a semiconductor device, comprising:

forming two channel parts over a substrate, the two channel parts being spaced apart from each other;

depositing two gate dielectric parts respectively around the two channel parts;

depositing a first work-function layer on the two gate dielectric parts, the first work-function layer including a first work-function material;

depositing a conductive layer on the first work-function layer such that the first work-function layer separates the conductive layer from the two gate dielectric parts, the conductive layer including a conductive material that is different from the first work-function material; and etching back the conductive layer to form a conductive portion, and etching back the first work-function layer to form two inner work-function portions which remain respectively on the two gate dielectric parts, the conductive portion and the two inner work-function portions, which remain between the two gate dielectric parts, together constituting an inner gate structure.

7. The method as claimed in claim 6, wherein the conductive material has a sheet resistance less than a sheet resistance of the first work-function material.

8. The method as claimed in claim 6, wherein after etching back the conductive layer and after etching back the first work-function layer, a portion of the two gate dielectric parts is not covered by the two inner work-function portions and the conductive portion.

9. The method as claimed in claim 8, further comprising:

depositing a second work-function layer on the inner gate structure and the portion of the two gate dielectric parts which is not covered by the two inner work-function portions and the conductive portion, the second work-function layer including a second work-function material that is different from the conductive material; and depositing a cap layer on the second work-function layer, the second work-function layer and the cap layer together constituting an outer gate structure.

10. The method as claimed in claim 9, wherein the first work-function material is the same as the second work-function material.

11. The method as claimed in claim 9, wherein the cap layer includes silicon, silicon oxide, silicon nitride, silicon carbide, silicon oxynitride, silicon oxycarbide, silicon carbon nitride, silicon oxycarbon nitride, titanium nitride, tantalum nitride, or combinations thereof.

12. The method as claimed in claim 9, wherein the second work-function layer has a thickness that is less than half of a thickness of the inner gate structure.

13. The method as claimed in claim 6, wherein a ratio of a volume of the conductive portion to a total volume of the two inner work-function portions ranges from 5:100 to 100:100.

14. The method as claimed in claim 6, wherein the two inner work-function portions are respectively disposed proximate to and distal from the substrate.

15. The method as claimed in claim 6, further comprising depositing two source/drain portions on the substrate such that each of the two channel parts extends between the two source/drain portions.

16. The method as claimed in claim 15, wherein the two source/drain portions are spaced apart from each other in a first direction, the two channel parts are spaced apart from each other in a second direction which is different from the first direction and which is normal to an upper surface of the substrate, each of the two channel parts has two first side surfaces opposite to each other in a third direction different from the first direction and the second direction, and has a first length between the two first side surfaces, the inner gate structure has two second side surfaces opposite to each other in the third direction, and has a second length between the two second side surfaces thereof, and a difference between the first length and the second length ranges from 0 nm to 5 nm.

17. A method for manufacturing a semiconductor device, comprising:

forming a first channel portion over and spaced apart from a first region of a substrate;

forming a second channel portion over and spaced apart from a second region of the substrate, the first region and the second region being spaced apart from each other;

depositing a first gate dielectric on the first channel portion and the first region of the substrate;

depositing a second gate dielectric on the second channel portion and the second region of the substrate;

sequentially depositing a first work-function layer and a conductive layer on the first gate dielectric and the second gate dielectric, the first work-function layer including a first work-function material, the conductive layer including a conductive material that is different from the first work-function material;

removing a portion of the conductive layer and removing a portion of the first work-function layer so as to expose the second gate dielectric, while leaving a remaining portion of the first work-function layer and a remaining portion of the conductive layer on the first gate dielectric; and etching back the remaining portion of the conductive layer to form a conductive portion, and etching back the remaining portion of the first work-function layer to form two inner work-function portions which remain respectively on the first channel portion and the first region of the substrate, the conductive portion and the two inner work-function portions, which remain between the first channel portion and the first region of the substrate, together constituting an inner gate structure.

18. The method as claimed in claim 17, further comprising:

depositing a second work-function layer on the first gate dielectric, the second gate dielectric and the inner gate structure, the second work-function layer including a second work-function material that is different from the conductive material;

depositing a cap layer on the second work-function layer; and removing a portion of the second work-function layer and a portion of the cap layer so as to expose the second gate dielectric, while leaving a remaining portion of the second work-function layer and a remaining portion of the cap layer on the first gate dielectric and the inner gate structure, the remaining portion of the second work-function layer and the remaining portion of the cap layer together constituting an outer gate structure.

19. The method as claimed in claim 18, further comprising:

depositing a third work-function layer on the outer gate structure and the second gate dielectric, the third work-function layer including a third work-function material that is different from the first work-function material and the second work-function material.

20. The method as claimed in claim 18, wherein the outer gate structure has a thickness less than a thickness of the inner gate structure.

* * * * *